US009728257B2

(12) United States Patent
Miura

(10) Patent No.: US 9,728,257 B2
(45) Date of Patent: Aug. 8, 2017

(54) SEMICONDUCTOR DEVICE HAVING A WRITE PROHIBITED REGION

(71) Applicant: Hitachi, Ltd., Chiyoda-ku, Tokyo (JP)

(72) Inventor: Seiji Miura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 153 days.

(21) Appl. No.: 14/549,280

(22) Filed: Nov. 20, 2014

(65) Prior Publication Data
US 2015/0082125 A1     Mar. 19, 2015

Related U.S. Application Data

(62) Division of application No. 13/632,465, filed on Oct. 1, 2012, now Pat. No. 8,949,516.

(30) Foreign Application Priority Data

Oct. 3, 2011 (JP) ................................ 2011-219549

(51) Int. Cl.
G06F 12/00     (2006.01)
G11C 14/00     (2006.01)
(Continued)

(52) U.S. Cl.
CPC ........ G11C 14/009 (2013.01); G06F 11/1072 (2013.01); G06F 12/0246 (2013.01); G11C 29/52 (2013.01)

(58) Field of Classification Search
CPC ... G11C 14/009; G11C 29/52; G11C 16/3427; G06F 11/1072; G06F 12/0246
See application file for complete search history.

(56) References Cited

U.S. PATENT DOCUMENTS 5,630,093 A * 5/1997 Holzhammer ........ G06F 3/0601
                                                          711/115
5,956,350 A    9/1999 Irrinki et al.
(Continued)

FOREIGN PATENT DOCUMENTS

CN        1574096 A        2/2005
EP        1 667 014 A1     6/2006
(Continued)

OTHER PUBLICATIONS

Lee et al., "26.1" A 90nm 1.8V 512Mb Diode-Switch PRAM with 266MB/s Read Throughput, ISSCC 2007/Session 26/Non-Volatile Memories/26.1, 2007 IEEE International Solid-State Circuits Conference, pp. 472,473, 616 (three (3) sheets).
(Continued)

Primary Examiner — John A Lane
(74) Attorney, Agent, or Firm — Crowell & Moring LLP

(57) ABSTRACT

An object of the present invention is to realize a highly reliable long-life information processor capable of high-speed operation and easy to handle. The processor includes a semiconductor device comprising a nonvolatile memory device including a plurality of overwritable memory cells, and a control circuit device for controlling access to the nonvolatile memory device. The control circuit device sets assignments of second addresses to the nonvolatile memory device independently of first addresses externally supplied, such that the physical disposition of part of the memory cells used for writing of first data to be written externally supplied is one of the first to (N+1)th of every (N+1) memory cells (N: a natural number) at least in one direction.

14 Claims, 35 Drawing Sheets

(51) Int. Cl.
*G06F 12/02* (2006.01)
*G06F 11/10* (2006.01)
*G11C 29/52* (2006.01)

(56) References Cited

U.S. PATENT DOCUMENTS

| | | |
|---|---|---|
| 6,539,453 B1 | 3/2003 | Guterman |
| 8,514,646 B1 | 8/2013 | Nan |
| 2004/0151031 A1 | 8/2004 | Tanaka |
| 2004/0255092 A1 | 12/2004 | Nishikawa et al. |
| 2006/0221719 A1 | 10/2006 | Maeda et al. |
| 2009/0067243 A1 | 3/2009 | Takase et al. |
| 2009/0237979 A1 | 9/2009 | Mukai et al. |
| 2011/0242875 A1 | 10/2011 | Nagashima et al. |
| 2012/0134203 A1 | 5/2012 | Miura et al. |
| 2012/0265925 A1 | 10/2012 | Miura |
| 2012/0331207 A1 | 12/2012 | Lassa et al. |
| 2013/0103885 A1 | 4/2013 | Bates et al. |
| 2013/0110308 A1 | 5/2013 | Pereira |
| 2013/0275665 A1 | 10/2013 | Saraswat et al. |

FOREIGN PATENT DOCUMENTS

| | | |
|---|---|---|
| JP | 7-153285 A | 6/1995 |
| JP | 7-210468 A | 8/1995 |
| JP | 2004-240572 A | 8/2004 |
| JP | 3926985 B2 | 3/2007 |
| JP | 2008-146255 A | 6/2008 |
| JP | 2009-59451 A | 3/2009 |
| JP | 2009-230796 A | 10/2009 |
| JP | 2010-44827 A | 2/2010 |
| JP | 2012-119018 A | 6/2012 |
| JP | 2012-221338 A | 11/2012 |
| WO | WO 2005/029311 A1 | 3/2005 |
| WO | WO 2010/038736 A1 | 4/2010 |
| WO | WO 2014/013595 A1 | 1/2014 |

OTHER PUBLICATIONS

Lai et al., "OUM A 180 nm Nonvolatile Memory Cell Element Technology for Stand Alone and Embedded Applications", IEEE, 2001, pp. 36.5.1-36.5.4 (four (4) sheets).

Cho et al., "0.18 μm 3.0 V 64 Mb non-volatile phase-transition random-access memory (PRAM)", IEEE Journal of Solid-State Circuits, Jan. 1, 2005, vol. 40, No. 1, pp. 293-300 (eight (8) sheets).

Toshiba MOS Digital Integrated Circuit Silicon Gate CMOS, 4 gbit (512m×8 bit) cmos nand e2prom, TC58NVG2S3ETA00, pp. 1-70 (seventy (70) sheets) Jul. 13, 2010.

\* cited by examiner

Fig. 1
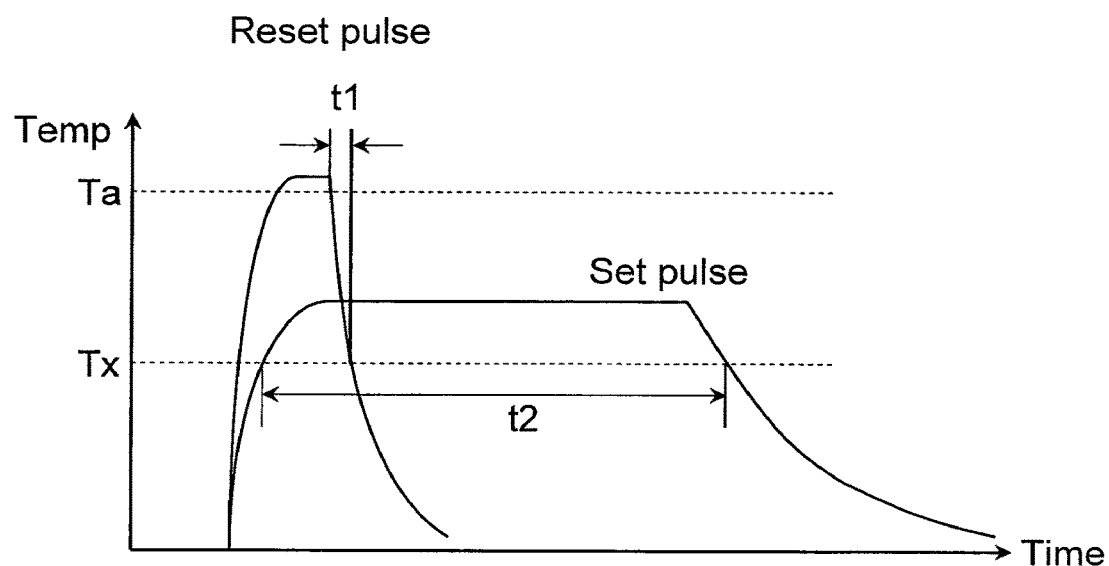
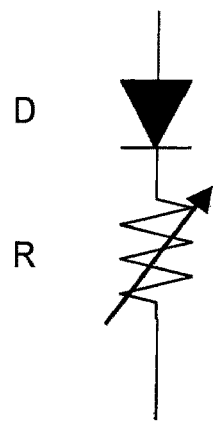

Fig. 5
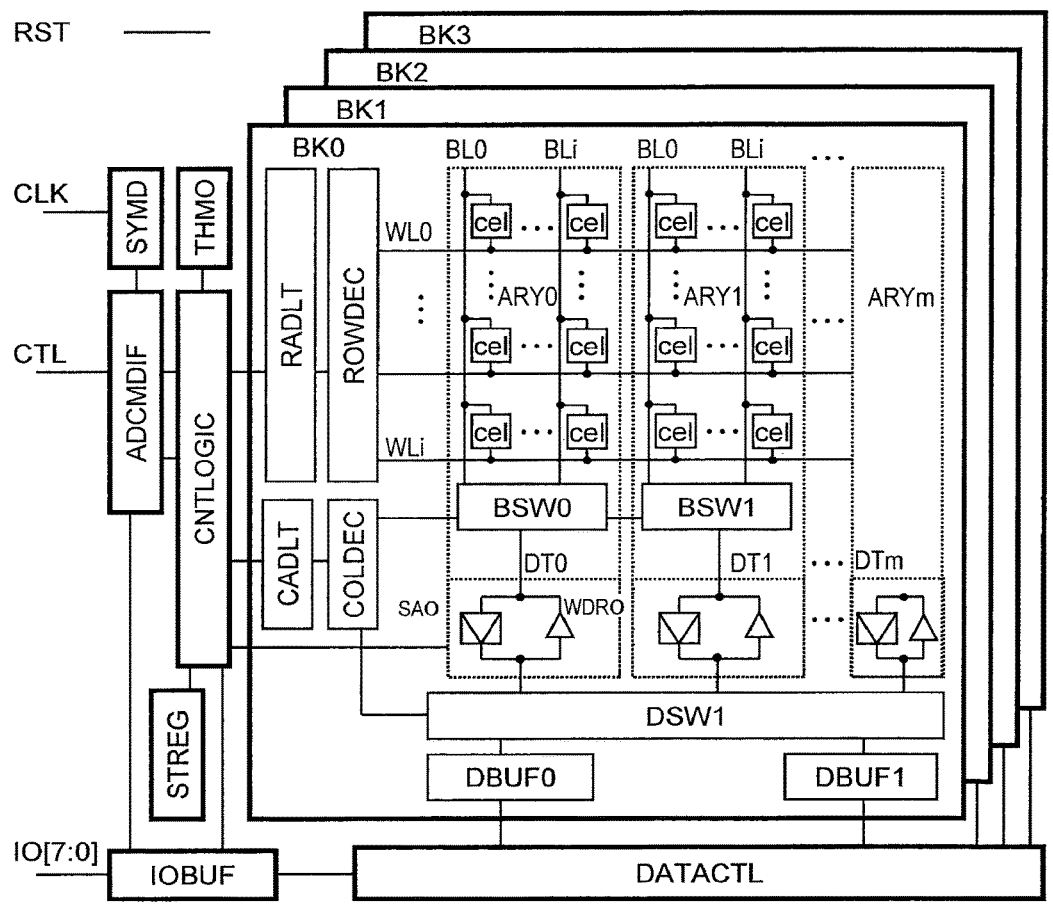
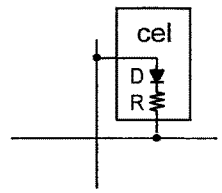

Fig. 6
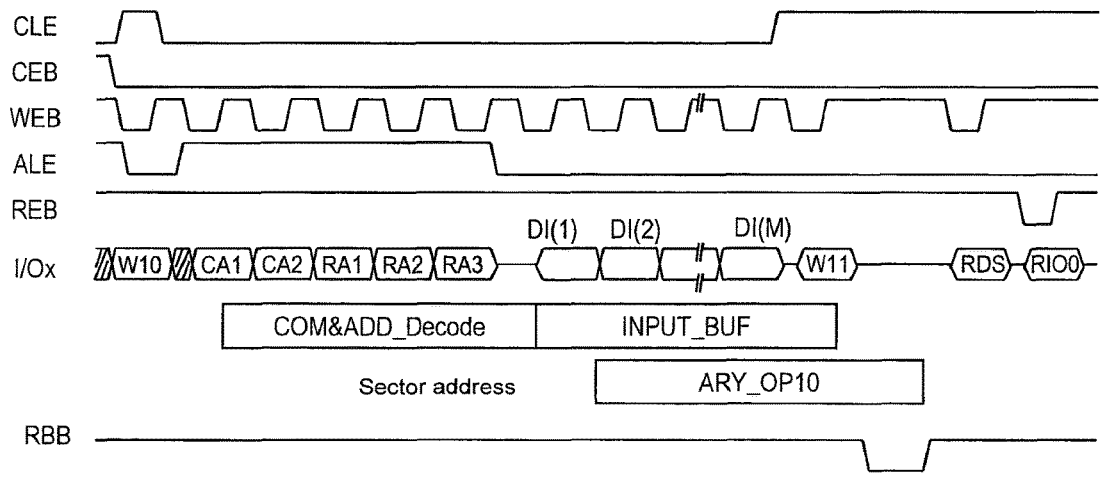
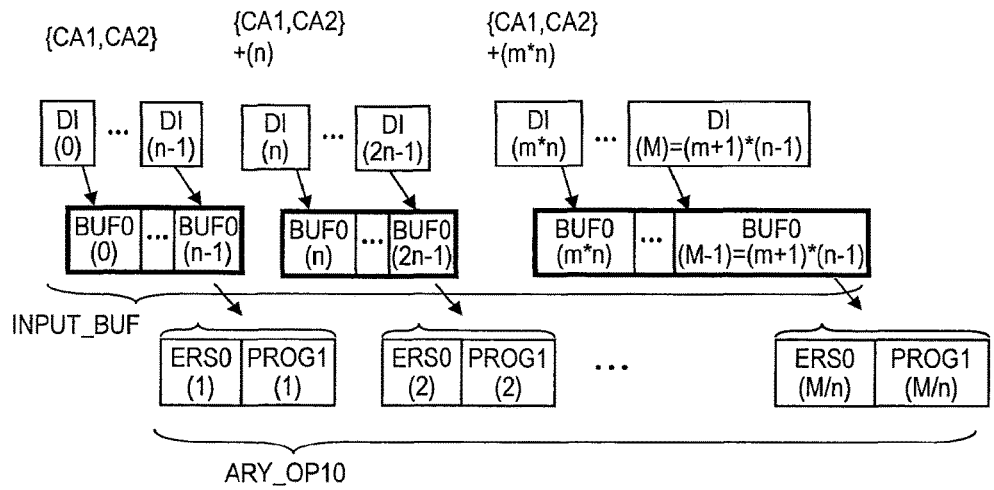

Fig. 7
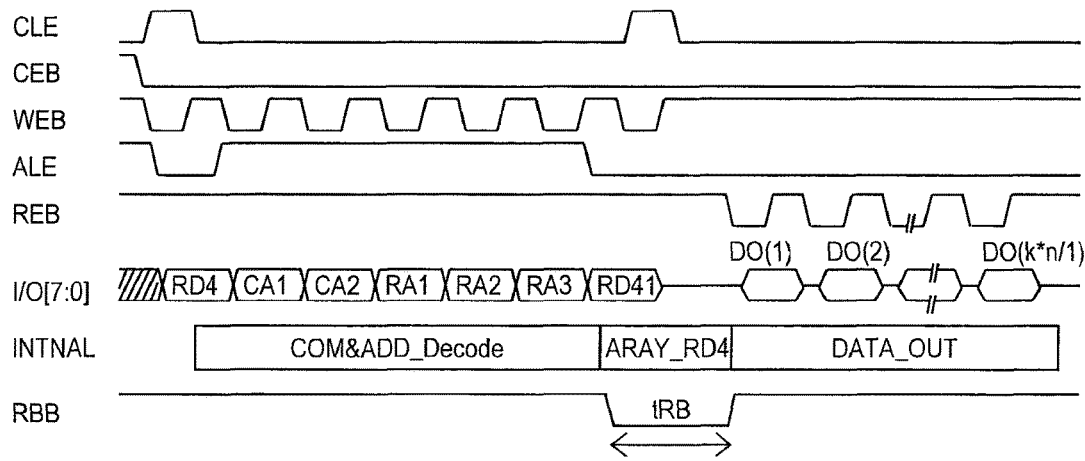
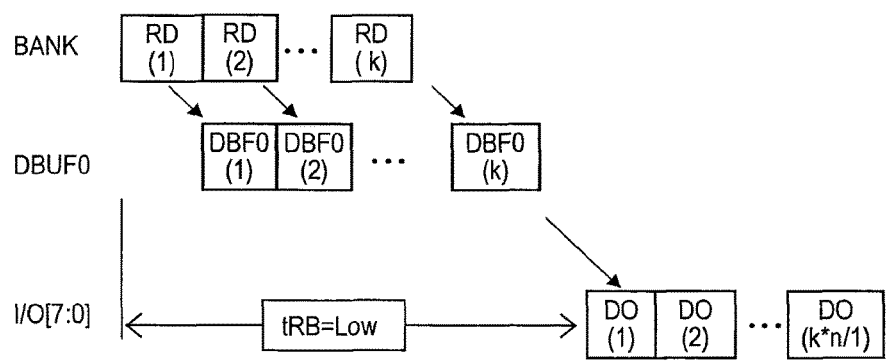

Fig. 9

| PADTBL | | | |
|---|---|---|---|
| PAD[31:0] | | PVLD | PERC |
| PAD [31:16] (SGAD) | PAD [15:0] (PPAD) | 0: invalid 1: valid | (Erase count) |
| 0000 | 0000 | 0 | 400 |
| ⋮ | 0001 | 1 | 100 |
| | 0002 | 0 | 300 |
| | ⋮ | ⋮ | ⋮ |
| 00000 | FFFF | 0 | 200 |
| 0001 | 0000 | 0 | 10 |
| ⋮ | 0001 | 0 | 20 |
| | ⋮ | ⋮ | ⋮ |
| 0001 | FFFF | 0 | 100 |
| ⋮ | ⋮ | ⋮ | ⋮ |
| 027F | 0000 | 0 | 200 |
| ⋮ | 0001 | 1 | 150 |
| | ⋮ | ⋮ | ⋮ |
| 027F | FFFF | 0 | 200 |
| 0280 | 0000 | 0 | 210 |
| ⋮ | 0001 | 1 | 100 |
| | ⋮ | ⋮ | ⋮ |
| 0280 | FFFF | 0 | 210 |
| ⋮ | ⋮ | ⋮ | ⋮ |
| 07FF | 0000 | 0 | 30 |
| | 0001 | 0 | 20 |
| | ⋮ | ⋮ | ⋮ |
| 07FF | FFFF | 0 | 10 |

PRNG1: rows from SGAD 0000 through 027F
PRNG2: rows from SGAD 0280 through 07FF

| PSEGTBL1 (related with IPA) | | | | | |
|---|---|---|---|---|---|
| SGAD | TNIPA | MXIPAD | MXERC | MNIPAD | MNERC |
| 0 | 1000 | 255 | 150 | 81 | 120 |
| 1 | 3333 | 511 | 110 | 256 | 180 |
| 2 | 4444 | 63 | 160 | 32 | 130 |
| ⋮ | ⋮ | ⋮ | ⋮ | ⋮ | ⋮ |
| 2047 | 500 | 1023 | 120 | 512 | 90 |

(b)

| PSEGTBL2 (related with VPA) | | | | | |
|---|---|---|---|---|---|
| SGAD | TNVPA | MXVPAD | MXERC | MNVPAD | MNERC |
| 0 | N-1000 | 1000 | 50 | 1011 | 40 |
| 1 | N-3333 | 2000 | 10 | 2033 | 1 |
| 2 | N-4444 | 600 | 80 | 622 | 70 |
| ⋮ | ⋮ | ⋮ | ⋮ | ⋮ | ⋮ |
| 2047 | N-500 | 6000 | 30 | 6055 | 20 |

| ENUM | NXPAD [31:0] | NXPVLD (0: invalid 1: valid) | NXPERC |
|---|---|---|---|
| 0 | 00000000 | 0 | 0 |
| 1 | 00000002 | 0 | 0 |
| ⋮ | ⋮ | ⋮ | ⋮ |
| (N/2)-1 | 0000001E | 0 | 0 |
| N/2 | 02800000 | 0 | 0 |
| ⋮ | ⋮ | ⋮ | ⋮ |
| N-2 | 0280000E | 0 | 0 |
| N-1 | 0280000F | 0 | 2 |

NXPADTBL1: rows 0 to (N/2)-1
NXPADTBL2: rows N/2 to N-1

(b)

| ENUM | NXPAD [31:0] | NXPVLD (0: invalid 1: valid) | NXPERC |
|---|---|---|---|
| 0 | 01000002 | 0 | 100 |
| 1 | 01000000 | 0 | 101 |
| ⋮ | ⋮ | ⋮ | ⋮ |
| (N/2)-1 | 010003FC | 0 | 110 |
| N/2 | 02900000 | 0 | 100 |
| ⋮ | ⋮ | ⋮ | ⋮ |
| N-2 | 02900004 | 0 | 110 |
| N-1 | 0290000a | 0 | 112 |

NXPADTBL1: rows 0 to (N/2)-1
NXPADTBL2: rows N/2 to N-1

| LPTBL | | |
|---|---|---|
| LAD | CPAD | CVF |
| 0 | 0 | 0 |
| 1 | 0 | 0 |
| 2 | 0 | 0 |
| ⋮ | ⋮ | ⋮ |
| 5 | 0 | 0 |
| ⋮ | ⋮ | ⋮ |
| 037F_FFFF | 0 | 0 |

0 : invalid
1 : valid (b)

| NVM {NVM10~NVM17} | | | |
|---|---|---|---|
| PAD | DATA | LAD | DVF |
| 0 | 0 | 0 | 0 |
| 1 | 0 | 0 | 0 |
| 2 | 0 | 0 | 0 |
| 3 | 0 | 0 | 0 |
| ⋮ | | | |
| 9 | 0 | 0 | 0 |
| ⋮ | | | |
| 0000_FFFF | 0 | 0 | 0 |
| 1_0000 | 0 | 0 | 0 |
| ⋮ | | | |
| 07FF_FFFF | 0 | 0 | 0 |

Fig. 13

CASE1 (a)

| LRNG | CAP | REL LVL | INTVL DCELL | INTVL RCELL | BODR CELL | TEST CEL | MONI CELL | ECC FLG | WRT FLG | TD CL | TR CL |
|---|---|---|---|---|---|---|---|---|---|---|---|
| LRNG1: 0000_0000 ~ 007F_FFFF | 4GB | HIGH | 1 | 1 | 3 | 5 | 1 | 0 | 0 | 0 | 0 |
| LRNG2: 0080_0000 ~ 03FF_FFFF | 32GB | STANDARD | 0 | 0 | 3 | 5 | 1 | 0 | 0 | 0 | 0 |

CASE2 (b)

| LBA RNG | CAP | REL LVL | INTVL DCELL | INTVL RCELL | BODR CELL | TEST CELL | MONI CELL | ECC FLG | WRT FLG | TD CL | TR CL |
|---|---|---|---|---|---|---|---|---|---|---|---|
| LRNG1: 0000_0000 ~ 007F_FFFF | 4GB | HIGH | 1 | 1 | 3 | 5 | 1 | 0 | 0 | 0 | 0 |
| IRNG2: 0080_0000 ~ 03FF_FFFF | 32GB | HIGH | 0 | 0 | 3 | 5 | 1 | 0 | 1 | 0 | 0 |

CASE2 (c)

| LBA RNG | CAP | REL LVL | INTVL DCELL | INTVL RCELL | BODR CELL | TEST CELL | MONI CELL | ECC FLG | WRT FLG | TD CL | TR CL |
|---|---|---|---|---|---|---|---|---|---|---|---|
| LRNG1: 0000_0000 ~ 007F_FFFF | 4GB | HIGH | 1 | 1 | 0 | 0 | 0 | 0 | 0 | 4 | 4 |
| IRNG2: 0080_0000 ~ 03FF_FFFF | 32GB | HIGH | 0 | 0 | 0 | 0 | 0 | 0 | 1 | 4 | 4 |

Fig. 14
PAGEDATA
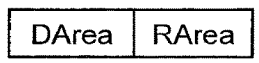
DArea
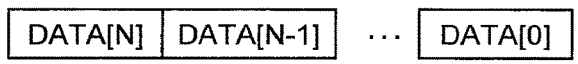
RArea
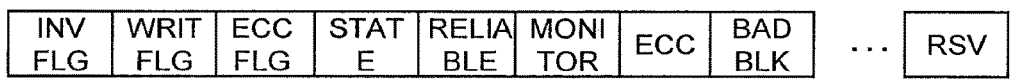

Fig. 21
(a)
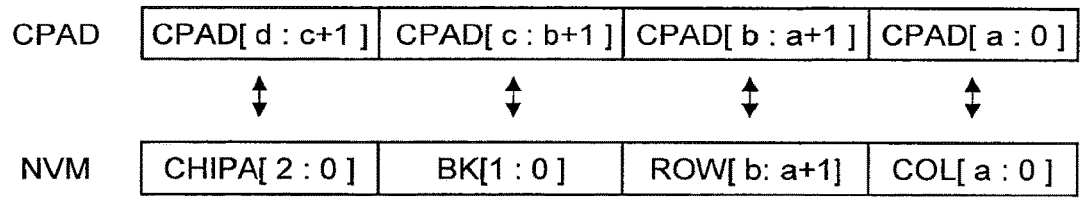
(b)
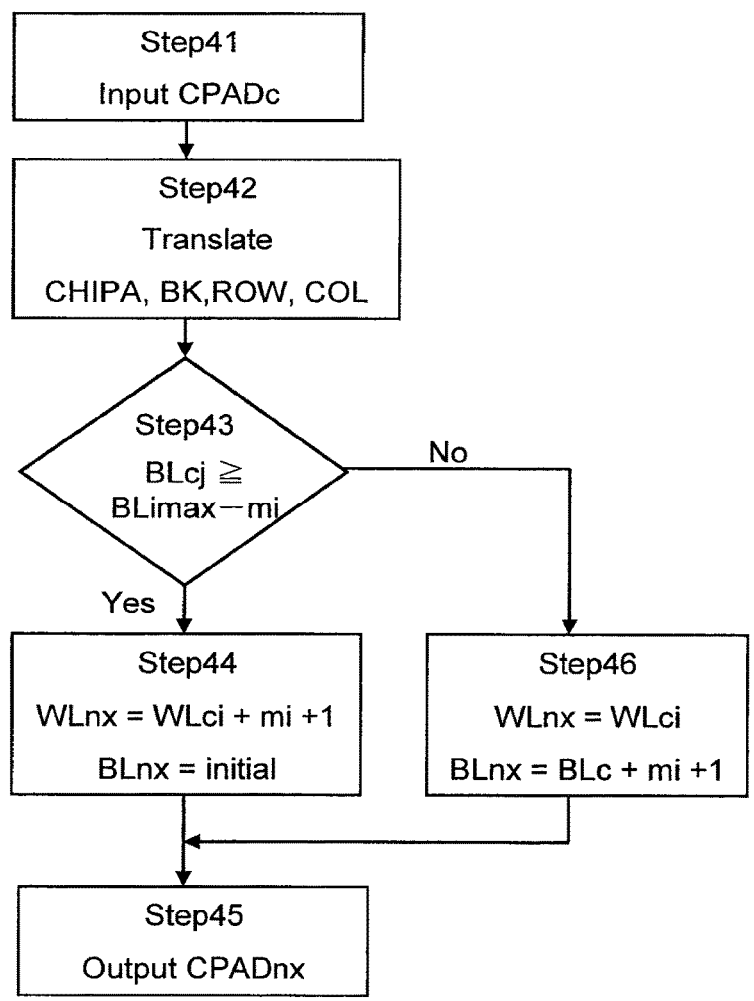

Fig. 22
(a)
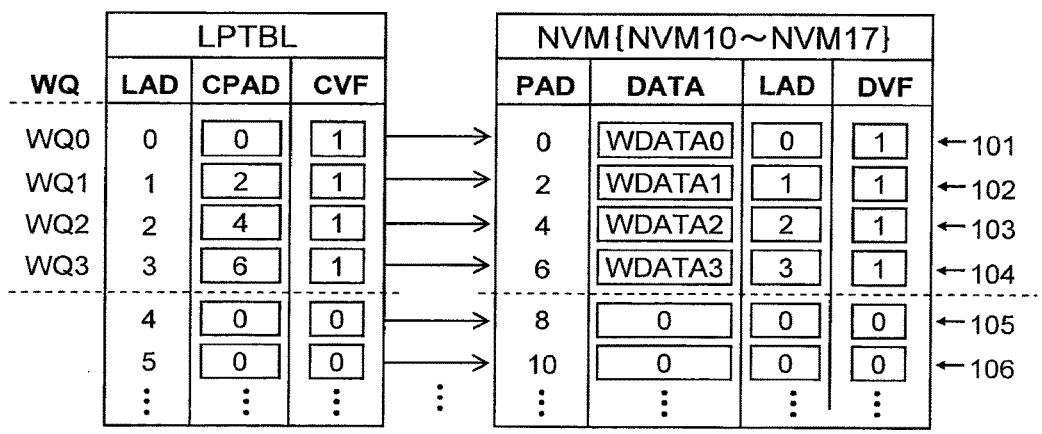
(b)
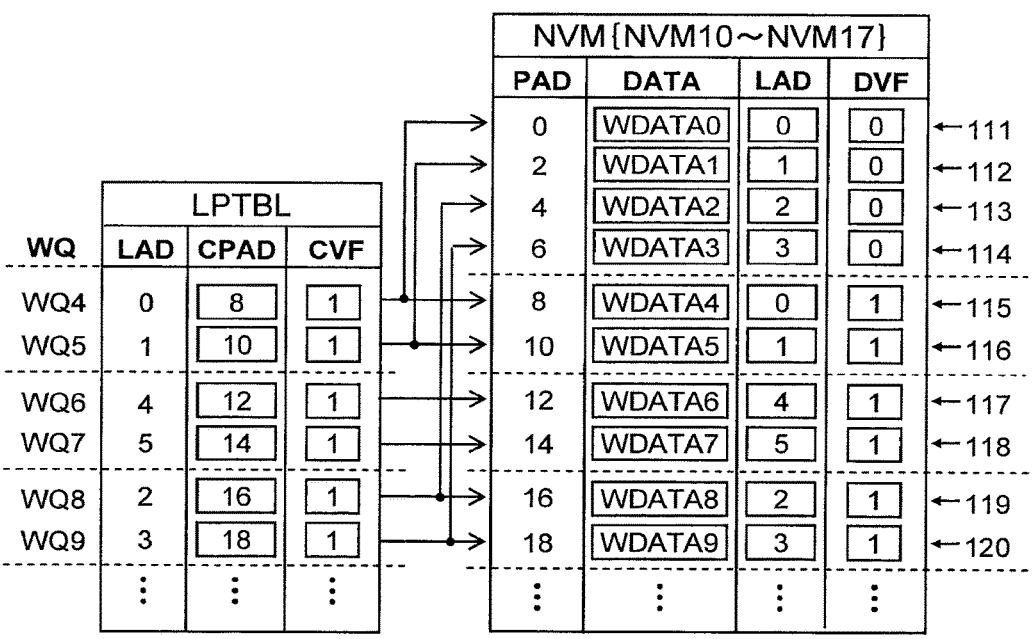

| | LPTBL | | | | NVM{NVM10~NVM17} | | | |
|---|---|---|---|---|---|---|---|---|
| WQ | LAD | CPAD | CVF | | PAD | DATA | LAD | DVF |
| WQ0 | 800000 | 2800000 | 1 | → | 2800000 | WDATA0 | 800000 | 1 | ←201
| WQ1 | 800001 | 2800001 | 1 | → | 2800001 | WDATA1 | 800001 | 1 | ←202
| WQ2 | 800002 | 2800002 | 1 | → | 2800002 | WDATA2 | 800002 | 1 | ←203
| WQ3 | 800003 | 2800003 | 1 | → | 2800003 | WDATA3 | 800003 | 1 | ←204
| | 800004 | 0000000 | 0 | → | 0000000 | 0 | 000000 | 0 | ←205
| | 800005 | 0000000 | 0 | → | 0000000 | 0 | 000000 | 0 | ←206

(b)

| | LPTBL | | | | NVM{NVM10~NVM17} | | | |
|---|---|---|---|---|---|---|---|---|
| WQ | LAD | CPAD | CVF | | PAD | DATA | LAD | DVF |
| | | | | → | 2800000 | WDATA0 | 800000 | 0 | ←211
| | | | | → | 2800001 | WDATA1 | 800001 | 0 | ←212
| | | | | → | 2800002 | WDATA2 | 800002 | 0 | ←213
| | | | | → | 2800003 | WDATA3 | 800003 | 0 | ←214
| WQ4 | 800000 | 2800004 | 1 | → | 2800004 | WDATA4 | 800000 | 1 | ←215
| WQ5 | 800001 | 2800005 | 1 | → | 2800005 | WDATA5 | 800001 | 1 | ←216
| WQ6 | 800004 | 2800006 | 1 | → | 2800006 | WDATA6 | 800004 | 1 | ←217
| WQ7 | 800005 | 2800007 | 1 | → | 2800007 | WDATA7 | 800005 | 1 | ←218
| WQ8 | 800002 | 2800008 | 1 | → | 2800008 | WDATA8 | 800002 | 1 | ←219
| WQ9 | 800003 | 2800009 | 1 | → | 2800009 | WDATA9 | 800003 | 1 | ←220

Fig. 33
BK0(Layer0)
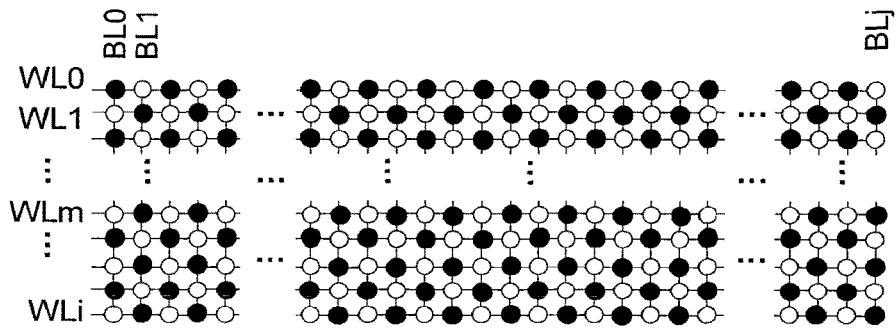
BK1(Layer1)
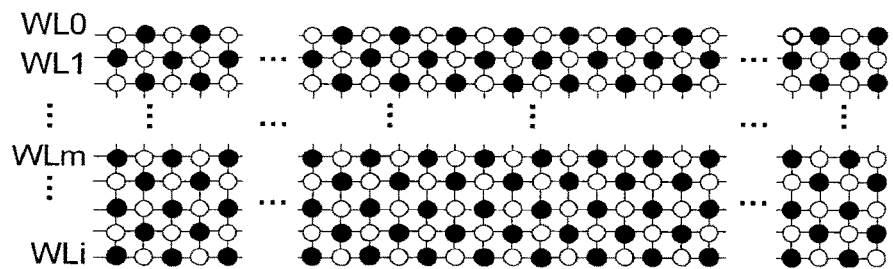
BK2(Layer2)
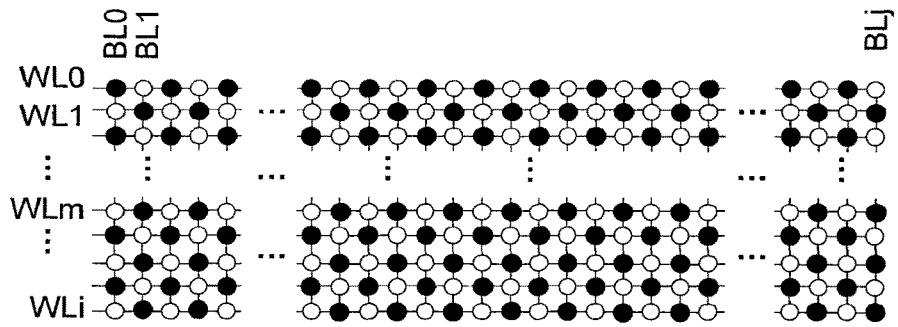
BK3(Layer3)
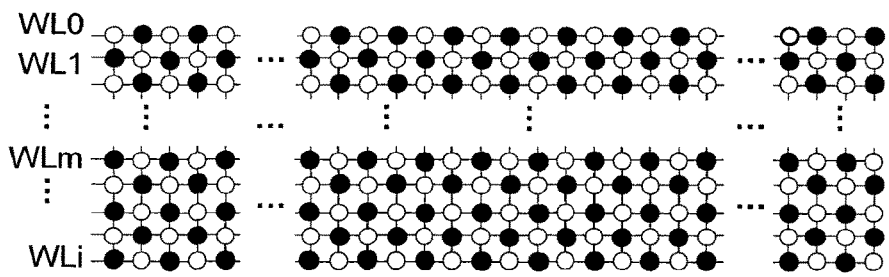

SEMICONDUCTOR DEVICE HAVING A WRITE PROHIBITED REGION

CLAIM OF PRIORITY

This application is a divisional of U.S. application Ser. No. 13/632,465, filed, Oct. 1, 2012, which claims priority from Japanese patent application JP 2011-219549 filed on Oct. 3, 2011, the entire contents of which are hereby incorporated by reference into this application.

BACKGROUND OF THE INVENTION

Field of the Invention

The present invention relates to a technique for a semiconductor device including a nonvolatile memory device.

Background Art

In recent years, solid state drives (SSDs) constituted by a plurality of NAND flash memories and a controller have been used in server apparatuses, laptop PCs, notebook PCs, etc. For example, NAND flash data sheet (TC58NVG2S3ETA00) discloses a fact that there is an upper limit on the number of times a NAND flash memory is erased and the data write size and the data erase size differ largely from each other. Also, JP Patent Publication (Kokai) Nos. 2008-146255A, 07-153285A (1995), and 2004-240572A and JP Patent No. 3926985 (2007), for example, disclose methods of controlling a NAND flash memory.

Further, technical matters studied by the inventors of the present invention include, for example, a semiconductor device that includes a phase-change memory. This kind of memory uses a chalcogenide material (or a phase-change material), i.e., a Ge—Sb—Te based material, an Ag—In—Sb—Te based material or the like containing at least antimony (Sb) and tellurium (Te), as a material for a recording layer. A diode is used as a selecting element in this kind of memory. "IEEE International Solid-State Circuits Conference, Digest of Technical Papers", (US), 2007, p. 472-473, for example, discloses the characteristics of a phase-change memory using a chalcogenide material and diodes.

FIG. 1 is a diagram showing the relationship between pulse widths and temperatures necessary for a phase change in a resistive memory element using a phase-change material. The ordinate represents temperature and the abscissa represents time. When information "0" to be stored is written to this memory element, a reset pulse is applied such that the element is heated to a temperature equal to or higher than the melting point Ta of the chalcogenide material and is then rapidly cooled, as shown in FIG. 1. The cooling time t1 is reduced (set to about 1 ns for example) to set the chalcogenide material in a high-resistance amorphous state.

Conversely, when information "1" to be stored is written, a set pulse is applied such that the memory element is maintained in a temperature region lower than the melting point Ta but higher than a crystallization temperature Tx (equal to or higher than the glass transition point). The chalcogenide material is thereby set in a low-resistance polycrystalline state. The time t2 required for crystallization varies depending on the composition of the chalcogenide material. The temperature of the element shown in FIG. 1 depends on Joule heat produced by the memory element itself and diffusion of heat to a surrounding.

Also, electric power required for a change in state in a phase-change film in a phase-change memory is reduced if the resistive element structure is made smaller, as described in "IEEE International Electron Devices meeting, TECHNICAL DIGEST" (US), 2001, p. 803-806. Therefore, phase-change memories are theoretically suitable to be made smaller and studies on phase-change memories are being energetically made. "IEEE JOURNAL OF SOLID-STATE CIRCUIT, VOL. 40, No. 1, JANUARY 2005", (US), 2005, p. 293-300 discloses a phase-change memory in which a time of about 120 ns is required for setting a chalcogenide material in a low-resistance state and a time of about 50 ns is required for setting the chalcogenide material in a high-resistance state.

SUMMARY OF THE INVENTION

The inventors of the present invention made a study of a method of controlling a NAND flash memory used in a storage such as a solid state drive (SSD) or a memory card before the application of the present invention. The inventors of the present invention further made a study of the resistance value characteristics of a phase-change memory using a recording layer formed of a chalcogenide material and diodes. Details of the studies will be described below.
<Study of a Method of Controlling a NAND Flash Memory>

A 4-Gbit NAND flash memory (according to a NAND flash data sheet TC58NVG2S3ETA00) is constituted by pages of (2048+64) bytes, blocks of 64 pages (135168=131072+4096 bytes) and a chip formed of 4096 blocks.

An SSD is constituted by a plurality of NAND flash memories and a controller that controls the flash memories. A host controller and the SSD are connected to each other by a SATA interface.

A write operation when an instruction to write one-page data is issued from the host controller to the SSD will be described below.

Data is written to the NAND flash memory on a page basis. Writing of data is executed by a procedure described below. First, the controller reads out one block of data (135168 bytes) from the NAND flash memory. Next, the controller erases data in the memory area in which this one block of data (135168 bytes) has been stored. Thereafter the controller newly writes one page of data (2112 bytes) to the memory area.

The NAND flash memory has an allowable maximum erase count ERASEmax. When the allowable maximum erase count ERASEmax is exceeded, data stored in the NAND flash memory is not secured; the life of the SSD ends. Therefore, extending the life of the SSD requires a method of efficiently erasing data.

The NAND flash memory, however, has a data write unit and a data erase unit different largely from each other. In the NAND flash memory, when one page of data (2112 bytes) is written, there is a need to erase a size of data 64 times larger (135168 bytes). Therefore the data erase method is considerably inefficient. As described above, it has been found that it is difficult to improve the life of the SSD using NAND flash memories.

Further, it has been found that the write performance is reduced because before one block of data (135168 bytes) is erased in the process of writing one page of data (2112 bytes), there is a need to read out the one block of data.
<Study of a Method of Controlling a Resistance-Change-Type Nonvolatile Memory>

A phase-change memory, a resistive RAM (ReRAM) and the like have been developed as a resistance-change-type memory. In these memories, there is an upper limit on the number of times the memory is written to. This upper limit determines the life of the resistance-change-type memory. It has been found that because of such an upper limit the life of a particular memory is reduced if writes are concentrically made to the particular memory cell.

It has also be found that the resistance-change-type memory can be overwritten with data and has a minimum overwritable unit as small as one byte, that is, only a necessary size of data can be rewritten.

The inventors of the present invention therefore provides a semiconductor device having a nonvolatile memory device including a plurality of overwritable memory cells, and a control circuit device for controlling access to the nonvolatile memory device. The control circuit device has a function to set assignments of second addresses to the nonvolatile memory device independently of first addresses externally supplied, such that the physical disposition of part of the memory cells used for writing of first data to be written externally supplied is one of the first to (N+1)th of every (N+1) memory cells (N: a natural number) at least in one direction.

According to the present invention, the memory cells used for writing of the first data to be written can be disposed so as not to be physically adjacent one to another at least in one direction. That is, second addresses that enable reducing the influence on the memory cells of a thermal history of Joule heat generated at the time of data writing can be provided independently of the first addresses, thereby enabling the provision of a highly reliable long-life semiconductor device. These and other objects, arrangements and effects of the present invention will become apparent from the following description of the embodiment of the invention.

BRIEF DESCRIPTION OF THE DRAWINGS

FIG. 1 is a diagram showing the relationship between pulse widths and temperatures necessary for phase changes in a resistive element using a phase-change material.

FIG. 5 is a diagram showing an example of a circuit configuration of a nonvolatile memory device according to the present invention.

FIG. 6 is a diagram showing an example of an operation for write to the nonvolatile memory device.

FIG. 7 is a diagram showing an example of an operation for read from the nonvolatile memory device.

FIG. 9 is a diagram showing an example of a physical table according to the present invention.

FIG. 10 is a diagram showing an example of a physical segment table according to the present invention.

FIG. 11 is a diagram showing an example of a write physical address table according to the present invention.

FIG. 12 is a diagram showing an example of an address conversion table and initial setting values in the nonvolatile memory device according to the present invention.

FIG. 13 is a diagram showing an example of SSD configuration information according to the present invention.

FIG. 14 is a diagram showing an example of a structure of data to be written to the nonvolatile memory device according to the present invention.

FIG. 21 is a diagram showing an example of a method of computation for determining physical addresses.

FIG. 22 is a diagram showing the address conversion table and an example of a method of updating data in the nonvolatile memory device.

FIG. 23 is a diagram showing the address conversion table and an example of a method of updating data in the nonvolatile memory device.

FIG. 33 is a diagram showing an example of writing of data to the memory cell array in the nonvolatile memory device.

DETAILED DESCRIPTION OF THE PREFERRED EMBODIMENTS

Figure 2:
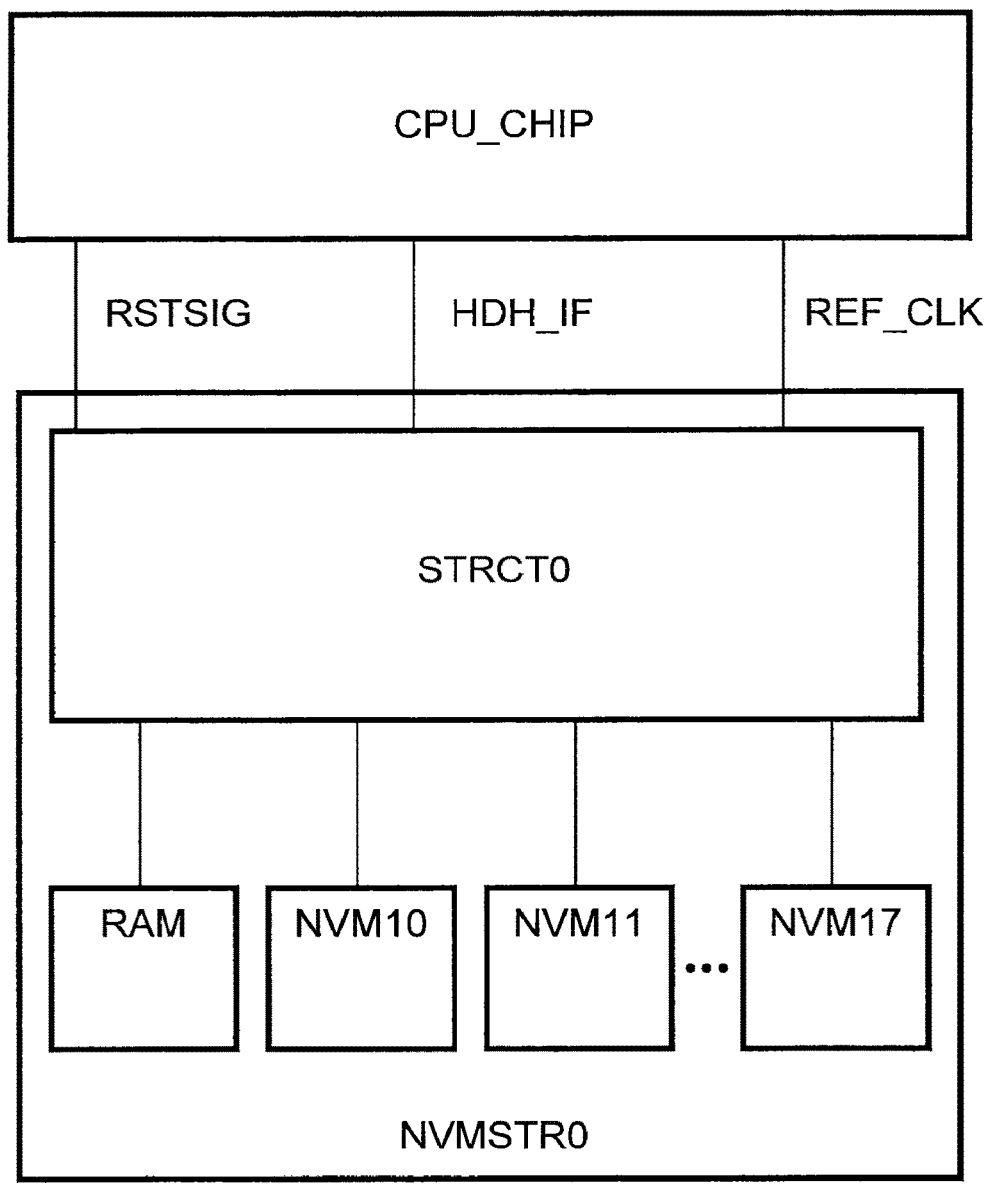
FIG. 2 is a diagram showing an example of an embodiment of an information processing system.

An embodiment of the present invention will be described below by being divided into a plurality of sections or embodiments if required for ease of description. The divided sections are not independent of each other except in a case where their independence is particularly specified as independent sections. One section is in such a relationship with part or all of the other sections as to be a modification, an example of application or the like of them or for a detailed description, an additional description or the like for them. With respect to each of particular numbers or groups of numbers relating to elements (including certain numbers of items, numeric values, quantities and ranges) referred to in the following description of the embodiment, the invention is not limited to the particular number or numbers or the particular number or numbers may be replaced with smaller or larger ones except in a particular case such as a case where the limitation is particularly specified or a case where the invention is apparently limited theoretically to the particular number or numbers.

In the embodiment described below, each of components of the embodiment (including constituent steps or the like) is not necessarily indispensable except in a particular case such as a case where indispensability is particularly specified or a case where the component is theoretically thought to be apparently indispensable. Similarly, each of the shapes of components or the like, positional relationships between the components or the like and other attributes or relationships referred to in the description of the embodiment made below includes an attribute or a relationship substantially approximate or similar to the attribute or relationship referred to except in a particular case such as a case where the attribute or the relationship is particularly specified or a case where the component or the like is theoretically thought apparently to have the exactly the same attribute or relationship. The same can also be said with respect to the above-mentioned numbers or groups of numbers (including certain numbers of items, numeric values, quantities and ranges).

The embodiment of the present invention will be described below in detail with reference to the accompanying drawings. In all the drawings referred to in the description of the embodiment, members having the same functions are indicated by the same or relating reference characters. Redundant descriptions of such members are not made. For the embodiment described below, redundant descriptions for identical or corresponding members are avoided in principle except when required.

In the embodiment, circuit elements constituting each block are formed on one semiconductor substrate such as a silicon monocrystal by well-known techniques for complementary metal-oxide semiconductor (CMOS) transistor integrated circuits. However, forming the circuit elements in this way is not necessarily required. As these memory cells, resistive storage elements such as phase-change memories or resistive random access memories (ReRAMs) are used.

<Outline of Examples of the Embodiment>

Techniques used with examples of the embodiment described below will first be outlined. Each example of the embodiment will be described by assuming that each memory cell is a phase-change memory. That is, a technique for physical address assignment control executed by a controller at the time of writing to realize an extension of the life of an SSD constituted by a plurality of resistance-change-type memories and a controller that controls the memories will be described. Control of the controller relating to the examples of the embodiment is based on considerations of the phase-change memory made by the inventors of the present invention as described below.

To perform write to the phase-change memory, the resistance of one of the memory cells is controlled by controlling the influence of Joule heat produced by a current. There has been found a problem that, in this writing to the phase-change memory, the memory cells closer to the positions adjacent to the memory cell that is being written to can be affected more easily by a thermal history due to the Joule heat, and the electrical characteristics of the adjacent memory cells that are not being written to are largely influenced by the rewrite operation so that large variation in resistance value occurs.

It has also been found that when one of the phase-change memory cells is overwritten with data, the resistance value varies due to a difference in state after rewriting and, therefore, variation in resistance between the memory cells becomes large and the characteristics are largely influenced.

In the examples of the embodiment described below, the present invention relates to an SSD constituted by a plurality of phase-change memories and a controller that controls the memories, and an object of the present invention is to provide a highly reliable long-life SSD for which a write method shown by (1) to (6) below is realized by means of a controller.

(1) The controller determines, according to the level of reliability, a physical disposition of the memory cells permitted to be written with data, and performs writing.
(2) The controller determines, according to the level of reliability, a continuous physical disposition of the memory cells prohibited from being written with data, and performs writing.
(3) The controller provides memory cells for monitoring according to the level of reliability.
(4) The controller compresses data according to the level of reliability and writes the data to the memory cells.
(5) The method of writing from the controller to the phase-change memory is not overwriting with data but temporarily setting the phase-change memory cells in an amorphous or crystallized state (erasing operation) and thereafter writing the desired data (write operation).
(6) SSD configuration information SDCFG is made programmable and a memory module NVMSTR0 is configured so as to be adapted to an information processing system with flexibility.

To achieve these objectives, in the controller according to the embodiment, physical addresses WPPAD with permissions to write data are determined based on information stored in an internal register so that the influence of a thermal history of Joule heat at the time of data writing is limited, and logical addresses input from a host to the controller and an address map ADMAP for association with the physical addresses are produced. The internal register can be rewritten by the host.

The controller writes consecutive addresses in the addresses permitted to be written with data at the time of writing data to the phase-change memory. The controller compresses data to be written received from the host controller and thereafter writes the data to the phase-change memory. The controller stores write requests from the host controller in a buffer. After the completion of write preparations, the controller writes the data to the phase-change memory. In the controller, physical addresses are written in advance in a write physical address table NXPADTBL in advance to prepare for future requests.

Immediately after power-on, the controller initializes the address map ADMAP, an address conversion table LPTBL, a physical segment table PSEGTBL and a physical table PADTB and further initializes nonvolatile memory devices and a write physical address table NXPADTBL.

The controller performs in a pipeline manner processing for storing write requests in the buffer, making write preparations and performing operations for writes to the phase-change memory. When registering physical addresses in the write physical address table NXPADTBL, the controller compares rewrite counts on a segment-by-segment basis with respect to physical addresses in an invalid state, selects a segment having the smallest rewrite count and successively registers the physical addresses in the segment. When registering physical addresses in the write physical address table NXPADTBL, the controller selects erase counts with respect to the physical addresses and the physical address having an erase count smaller than an erase count threshold.

The controller obtains the difference DIFEC between the largest erase count with respect to the invalid physical addresses and the smallest erase count with respect to the valid physical addresses. If this difference DIFEC is larger than a threshold DERCth, the controller moves data at the physical address DPAD having the smallest value MXNERC in the largest erase count MXERC with respect to the invalid physical addresses to the physical address DPAD1 having the smallest value MXNERC in the largest erase count MXERC with respect to the invalid physical addresses to make the difference DIFEC smaller.

Use of this controller enables determining the physical addresses so that the influence on the memory cells of a thermal history of Joule heat produced at the time of data writing is reduced, thus enabling the provision of a highly reliable long-life SSD.

Further, sequential assignment of the physical addresses corresponding to logical addresses from the host enables reducing the unevenness of the data erase counts on the physical address basis in the phase-change memory, thus enabling the provision of highly reliable long-life SSD. Further, since the controller performs in a pipeline manner processing for storing write requests in the buffer, making write preparations and performing operations for writes to the phase-change memory, thus enabling the provision of a high-performance SSD.

Embodiment

An information processing system according to the embodiment, to which the present invention has been applied, will be described with reference to FIGS. 2 to 35.

FIG. 2 is a block diagram showing an example of a configuration of an information processing system device constituted by an information processing device CPU_CHIP and a memory module NVMSTR0 according to the embodiment, to which the present invention has been applied. As shown in FIG. 2, the information processing device CPU_CHIP is a host controller that manages data stored in the memory module NVMSTR0 through logical addresses LAD on a smallest 512 byte basis. However, the information processing device CPU_CHIP is not particularly limited to this. The information processing device CPU_CHIP writes data to or reads data from the memory module NVMSTR0 through an interface signal HDH_IF.

As a signal system for connection between the information processing device CPU_CHIP and the memory module NVMSTR0, a serial interface signal system, a parallel interface signal system, an optical interface signal system and the like are conceivable. Needless to say, any of all the conceivable systems can be used.

As a clock system for operating the information processing device CPU_CHIP and the memory module NVMSTR0, a common clock system, a source synchronous clock system, an embedded clock system and the like are conceivable. Needless to say, any of all the conceivable clock systems can be used. In the present embodiment, an embedded clock system is provided. An example of the operation with the serial interface signal system will be described.

A read request RDREQ, a write request WTREQ or the like, in which clock information is embedded, and which is converted into serial data, is input from the information processing device CPU_CHIP to the memory module NVMSTR0 through the interface signal HDH_IF.

The read request RDREQ includes a logical address value LAD, a data read instruction RD and a sector count SEC. The write request WTREQ includes a logical address value LAD, a data write instruction WRT, a sector count SEC and data WDATA to be written.

The memory module NVMSTR0 is constituted by nonvolatile memory devices NVM10 to NVM17, a random access memory RAM and a control circuit STRCT0 that controls the nonvolatile memory devices and the random access memory. The nonvolatile memory devices NVM10 to NVM17 are nonvolatile memory devices having configurations and performance capabilities equal to each other.

Figure 3:
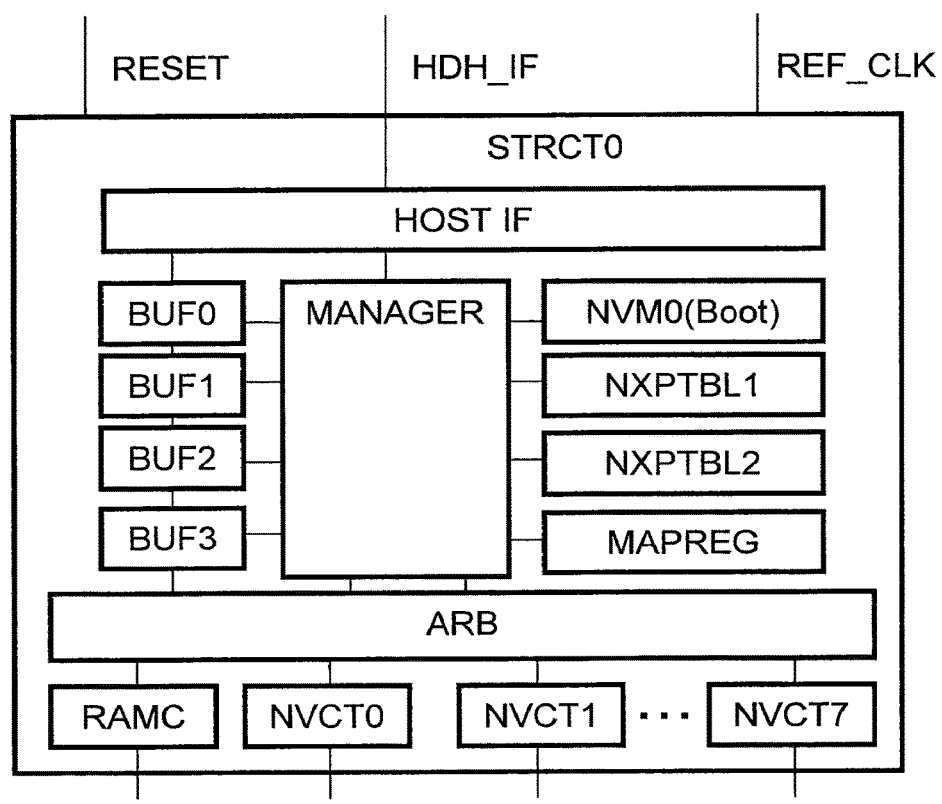
FIG. 3 is a diagram showing an example of a circuit configuration of a control circuit according to the present invention.
Figure 4:
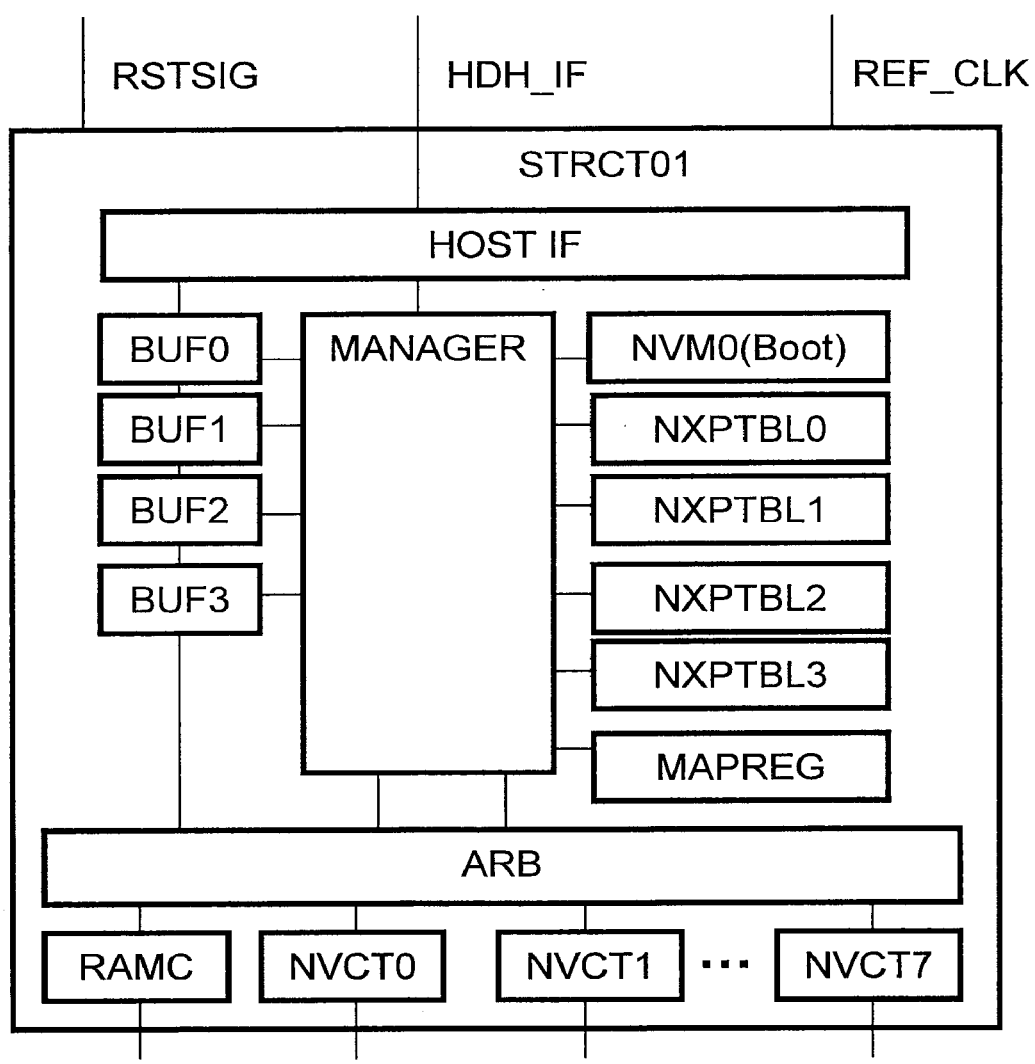
FIG. 4 is a diagram showing another example of the circuit configuration of the control circuit according to the present invention.

As shown in FIG. 3, the control circuit STRCT0 is constituted by an interface circuit HOST_IF, buffers BUF0 to BUF3, a nonvolatile memory NVM0, a write physical address tables NXPTBL1 and NXPTBL2, a settlement circuit ARB, an information processing circuit MANAGER, memory controllers NVCT0 to NVCT7 that directly control the nonvolatile memory devices NVM10 to NVM17, a memory controller RAMC that directly controls the random access memory RAM, and a register MAPREG. A control circuit STRCT01 shown in FIG. 4 differs from the control circuit STRCT0 shown in FIG. 3 in that a plurality of write physical address tables NXPTBL0 to NXPTBL3 are provided in the control circuit STRCT01. In other respects, the configuration and functions of the control circuit STRCT01 shown in FIG. 4 are the same as those of the control circuit STRCT0 shown in FIG. 3.

FIG. 5 is a block diagram showing an example of a nonvolatile memory NVMEM used as each of the nonvolatile memory devices NVM10 to NVM17. In this example, the nonvolatile memory NVMEM is a phase-change-type nonvolatile memory.

The nonvolatile memory NVMEM is constituted by a clock generation circuit SYMD, a status register STREG, an address and command interface circuit ADCOMDIF, an I/O buffer IOBUF, a control circuit CONTLOGIC, a temperature sensor THMO, a data control circuit DATACTL, and memory banks BK0 to BK3. Each memory bank includes memory arrays ARYx (x=0 to m), a row address latch RADLT, a column address latch CADLT, a row decoder ROWDEC, a column decoder COLDEC, a data selecting circuit DSW1, a data buffer DBUF0, and a data buffer DBUF1.

Each memory array ARYx (x=0 to m) includes a plurality of memory cells cel, a bit line selecting circuit BSWx (x=0 to m), a sense amplifier SAx (x=0 to m), and a write driver WDRx (x=0 to m).

A control signal CTL is constituted by a command latch enable signal CLE, a chip enable signal CEB, an address latch signal ALE, a write enable signal WEB, a read enable signal REB, and a ready/busy signal RBB. An I/O signal is an input/output signal. As the I/O signal, commands, addresses and data to be written are input and data read out is output.

<Write Operation on Nonvolatile Memory Device>

FIG. 6 shows an example of a write operation when the nonvolatile memory device NVM1$x$ ($x$=0 to 7) writes M bytes of data to the memory cell cel through the data buffer DBUF0. Symbols "*" in "m*n" and other expressions in FIGS. 6 and 7 denotes "×" (multiplication).

The command chip enable signal CLE at low level is driven to high level, and the chip enable signal CEB and the address latch enable signal ALE at high level are driven to low level. Thereafter, when a write command W10 is input through input/output lines I/O$x$ ($x$=0 to 7), the write command W10 is taken in the address command interface circuit ADCMIF by the rising edge of the write enable signal WEB to be deciphered. Information designating the data buffer DBUF0 or DBUF1 is also included in the command W10, and the data buffer DBUF0 is designated in the example shown in FIG. 6.

Next, the command latch enable signal CLE at high level is driven to low level; the address latch enable signal ALE at low level is driven to high level; column addresses are successively input separately at two times (as CA1 and CA2) and row addresses are successively input separately at three times (as RA1, RA2 and RA3). These addresses are taken in the address command interface circuit ADCMDIF by the rising edges of the write enable signal WEB to be deciphered.

When the control circuit CONTLOGIC is informed that the command W10 is identified as a command for write to the memory bank BK0 as a result of deciphering of the addresses and the command W10 in the address command interface circuit ADCMDIF, the control circuit CONTLOGIC activates the memory bank BK0 to write data to the memory bank BK0.

The row addresses (RA1, RA2 and RA3) and the column addresses (CA1 and CA2) input to the address command interface circuit ADCMDIF are transferred to the row address latch circuit RADLT and the column address latch circuit CADLT, respectively, in the activated memory bank BK0 through the control circuit CONTLOGIC. This write operation is started from the column address first input.

The row addresses (RA1, RA2 and RA3) are transferred from the row address latch circuit RADLT to the row decoder ROWDEC. The row decoder ROWDEC selects word lines WLn corresponding to the row addresses (RA1, RA2 and RA3).

The column addresses (CA1 and CA2) are next transferred from the column address latch circuit CADLT to the column decoder COLDEC to be deciphered.

Deciphering results from the column decoder COLDEC are input to the bit line selecting circuits BSW0-$m$ in the memory arrays (ARY0-$m$). One bit line BL is thereby selected with respect to each memory array and connected to the write driver WDR0-$m$ through a data line DT0-$m$.

The write driver WDR0-$m$ is a current supply circuit for setting the selected memory cell cel in a low-resistance state or a high-resistance state by a current pulse such as shown in FIG. 1 through the data line DT0-$m$.

In the case of setting the memory cell cel in the high-resistance state, i.e., writing information "0", a memory cell current Icell to be applied through the data line DT0-$n$ is controlled to a value Ireset necessary for a resetting operation.

In the case of setting the memory cell cel in the low-resistance state, i.e., writing information "1", the memory cell current Icell to be applied through the data line DT0-$n$ is controlled to a value Iset necessary for a setting operation.

A total of m×8 write drivers WDR exist in one memory bank. Therefore the memory cells cel for m bytes in one memory bank can be simultaneously written to.

Next, the address latch enable signal ALE at high level is driven to low level and 1-byte data in information items DI(1) to DI(M) to be stored is successively input to the data buffer DBUF0 through the input/output lines I/O$x$ ($x$=0 to 7) in synchronization with the rising edges of the write enable signal WEB.

Each time n bytes of data are input to the data buffer DBUF0, the n bytes of data are written through n×8 write drivers WDR. This operation will be described below.

The operation to write the first n bytes of data will first be described.

First, when the first one byte of data in the first n bytes of data is input to the data buffer DBUF0, the memory cells for the first n bytes selected by the column addresses {CA1 and CA2} are set in the low-resistance state (erased: ERS0) through the write driver WDR. Next, when input of the first n bytes of data to the data buffer DBUF0 is completed, the memory cells are set in the high-resistance state (programmed: PROG1) by the write drivers WDR only for data "0" in the data held in the data buffer DBUF0. Writing of the first n bytes of data is thereby performed.

The operation to write the second n bytes of data will next be described.

When the first one byte of data in the second n bytes of data is input to the data buffer DBUF0, the memory cells for the second n bytes selected by the column addresses {{CA1, CA2}+(n)} are set in the low-resistance state (erased: ERS0) through the write driver WDR. Next, when input of the second n bytes of data to the data buffer DBUF0 is completed, the memory cells are set in the high-resistance state (programmed: PROG1) by the write drivers WDR only for data "1" in the data held in the data buffer DBUF0. Writing of the second n bytes of data is thereby performed.

The operation to write the third n bytes of data is performed in the same way as the above-described operation. The column addresses in this operation are {{CA1, CA2}+(2n)}.

Thus, erasing (ERS0) and programming (PROG1) are executed on the memory cells cel for groups of n bytes selected by the column addresses determined by successively adding multiples of n to the starting column addresses {CA1, CA2}.

In the case of writing M bytes of data, erasing (ERS0) and programming (PROG1) occur M/n times.

In a case where the data buffer DBUF1 is designated by the write command W10, data input to the data buffer DBUF1 through the input/output lines I/O$x$ ($x$=0 to 7) and held in the data buffer DBUF1 is written to the memory cells cel.

As described above, the nonvolatile memory device NVM1$x$ ($x$=0 to 7) performs erasing (ERS0) and programming (PROG1) operations only for the required M-byte data size.

That is, since the erasing (ERS0) data size and the programming (PROG1) data size are equal to each other, there is no need to erase (ERS0) data at additional addresses. Therefore high-speed write can be realized.

Further, in this write operation, overwrite is not performed; the memory cells to be written to are temporarily set in the erased state, thereby enabling uniformization of the resistance values of the memory cells and realization of stable readout and write operations.

<Operation to Read Out from Nonvolatile Memory Device>

FIG. 7 shows an example of a readout operation when data of a designated data size is readout from the nonvolatile memory device NVM1x (x=0 to 7) through the data buffer DBUF0.

The command latch enable signal CLE at low level is driven to high level and the chip enable signal CEB and the address latch enable signal ALE at high level are driven to low level.

Next, when a readout command RD4 is input through input/output lines I/Ox (x=0 to 7), the first sector readout command RD4 is taken in the address command interface circuit ADCMDIF by the rising edge of the write enable signal WEB to be deciphered.

Next, the command latch enable signal CLE at high level is driven to low level; the address latch enable signal ALE at low level is driven to high level; column addresses are successively input separately at two times (as CA1 and CA2) and row addresses are successively input separately at three times (as RA1, RA2 and RA3). These addresses are taken in the address command interface circuit ADCMDIF by the rising edges of the write enable signal WEB to be deciphered.

Next, the command latch enable signal CLE at low level is driven to high level and the chip enable signal CEB and the address latch enable signal ALE at high level are driven to low level.

When a second sector data readout command RD41 is input through the input/output lines I/Ox (x=0 to 7), the second readout command RD41 is taken in the address command interface circuit ADCMDIF by the rising edge of the write enable signal WEB to be deciphered.

Information that designates the data buffer DBUF0 or DBUF1 is also included in the commands RD4 and RD41. In the example shown in FIG. 7, the data buffer DBUF0 is designated.

When the control circuit CONTLOGIC is informed that the commands RD4 and RD41 are identified as readout commands to the memory bank BK0 as a result of deciphering of the addresses and the commands RD4 and RD41 in the address command interface circuit ADCMDIF, the control circuit CONTLOGIC activates the memory bank BK0 to read out data from the memory bank BK0.

The row addresses (RA1, RA2 and RA3) and the column addresses (CA1 and CA2) input to the address command interface circuit ADCMDIF are transferred to the row address latch circuit RADLT and the column address latch circuit CADLT, respectively, in the activated memory bank BK0 through the control circuit CONTLOGIC.

The row addresses (RA1, RA2 and RA3) are transferred from the row address latch circuit RADLT to the decoder ROWDEC. The decoder ROWDEC selects word lines WLi corresponding to the row addresses (RA1, RA2 and RA3).

The column addresses (CA1 and CA2) are next transferred from the column address latch circuit CADLT to the column decoder COLDEC to be deciphered.

Deciphering results from the column decoder COLDEC are input to the bit line selecting circuits BSW0-$m$ in the memory arrays (ARY0-$m$). One bit line BLi is thereby selected with respect to each memory array and connected to the sense amplifier SA0-$m$ through the data line DT0-$m$. The memory cel for one bit is thereby selected with respect to each memory array (ARY0-$m$). Accordingly, the memory cells cel (for the 0th to mth bits) for a total of (m+1) bits in one memory bank are selected.

Currents flow from the memory cells cel (for the 0th to mth bits) selected for each memory array into the sense amplifiers SA0-$m$ respectively having the data lines provided in the memory arrays, and voltages when the current flow are measured and compared with a reference voltage to detect data Dnbyte corresponding to m+1 bits of data recorded on the memory cells cel. That is, the first n bytes (=(m+1)/8) of data Dnbyte selected by the column addresses {CA1 and CA2} are thereby simultaneously detected from the memory cells cel.

For example, in a case where the memory cel on the word line WLn and the bit line BL0 in the memory array ARY0 is storing information "1" and is in the low-resistance state, the bit line BL0 and the data line DT0 are charged and the voltage therefrom is transmitted to the sense amplifier SA, and data "1" is detected. In a case where the memory cells cel on the word line WLn and the bit line BL0 in the memory array ARYL is storing information "0" and is in the high-resistance state, the bit line BL0 and the data line DT1 are maintained generally at ground voltage VSS and the voltage therefrom is transmitted to the sense amplifier SA, and data "0" is detected.

The first n bytes (=(m+1)/8) of data Dnbyte detected are transferred through the data selecting circuit DSW1 to the data buffer DBUF0 designated by the commands RD4 and RD41.

The next n bytes of data are selected by the column addresses {{CA1, CA2}+($n$)} and transferred to the data buffer DBUF0. Thus, groups of n bytes of data selected by the column addresses selected by successively adding multiples of n to the starting column addresses {CA1, CA2} are successively transferred from the memory cells cel to the data buffer DBUF0. In a case where the designated data size is k*n bytes, data transfer from the memory cell arrays ARY to the data buffer DBUF0 occurs k times.

During the time period during which data transfer from the memory cells cel to the data buffer DBUF0 is performed, the ready/busy signal RBB maintained at high level is changed to low level. When this data transfer is completed, the ready/busy signal RBB at low level is changed to high level.

In a case where the number of signals in the input/output signal IO is 8 bits (one byte), k*n bytes of data stored in the data buffer DBUF0 are output in order of DO(1) to DO(k*n) from the input/output signal IO in synchronization with the falling edges of the readout enable signal REB. For example, in a case where the designated data size is 512 bytes; the data size of the memory cells cel simultaneously selected is 16 bytes; and the number of signals in the input/output signal IO is 8 bits (one byte), data transfer from the memory cells cel to the data buffer DBUF0 is performed a total of 32 times (=512/16) and the number of times data is output from the data buffer DBUF0 through the input/output signal IO is 512.

In a case where the data buffer DBUF1 is designated by the commands RD4 and RD41, data of the designated data size (k*n bytes) is read out from the memory arrays in the nonvolatile memory device NVM1x (x=0 to 7) through the data buffer DBUF1 in the same way.

As described above, by the operation to read out data of a size arbitrarily designated, only data of the necessary size can be efficiently read out and, therefore, high-speed readout can be realized.

<Initial Sequence at Power-On>

Figure 8:
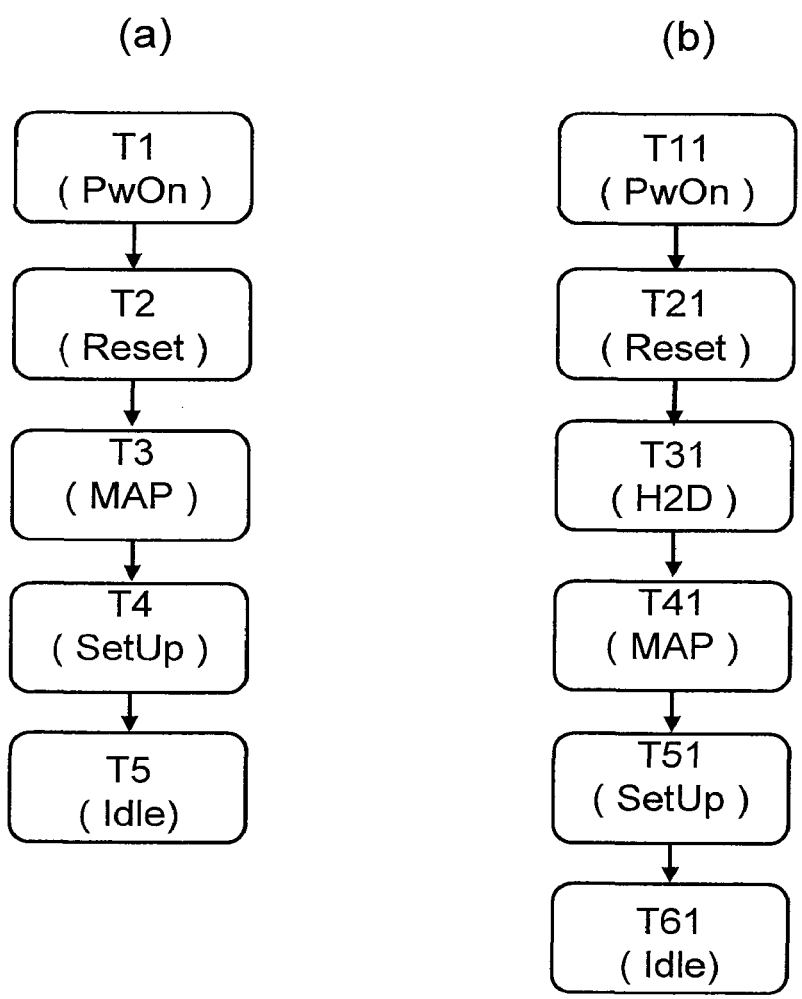
FIG. 8 is a diagram of an initial sequence executed at the time of power-on for the information processing system device.

FIG. 8 shows an example of an initial sequence at power-on in the information processing system device according to the embodiment. FIG. 8 shows in (a) an example of an initial sequence at power-on in a case where SSD configuration information SDCFG stored in the nonvolatile memory NVM0 in the control circuit STRCT0 is used. FIG. 8 shows in (b) an example of an initial sequence at power-on in a case where SSD configuration information SDCFG transmitted from the information processing device CPU_CHIP is used.

The initial sequence shown in (a) of FIG. 8 will first be described. In a period T1 (PwOn), the power to the information processing device CPU_CHIP, the nonvolatile memory devices (NVM10 to NVM17) in the memory module NVMSTR0, the random access memory RAM and the control circuit STRCT0 is turned on. In a period T2 (RST), reset is performed. A method for reset is not restrictively specified. A method of automatically resetting each incorporated circuit, a method of performing a reset operation with a reset signal from an external reset terminal (RSTSIG) or a method of resetting by inputting a reset instruction from the information processing CPU_CHIP to the control circuit STRCT0 through the interface signal HDH_IF may be used.

In the reset period T2 (Reset), the internal statuses of the information processing device CPU_CHIP, the control circuit STRCT0, the nonvolatile memory devices (NVM10 to NVM17) and the random access memory RAM are initialized.

The control circuit STRCT0 initializes an address range map ADMAP, an address conversion table LPTBL, a physical segment table PSEGTBL1, a physical segment table PSEGTBL2 and a physical address table PADTBL which are stored in the random access memory RAM and further initializes the nonvolatile memory devices and a write physical address table NXPADTBL.

In a period T3 (MAP) after the end of the period T2, the control circuit STRCT0 reads out SSD configuration information SDCFG stored in the nonvolatile memory NVM0 and transfers the SSD configuration information SDCFG to the register MAPREG. Next, the control circuit STRCT0 reads out the SSD configuration information SDCFG in the register MAPREG, forms the address range map ADMAP by using this SSD configuration information SDCFG and stores the address range map ADMAP in the random access memory RAM.

Further, if logical address region LRNG information in the SSD configuration information SDCFG in the register MAPREG designates separate logical address regions LRNG1 and LRNG2, the control circuit STRCT0 recognizes this and divides contents of the write physical address table NXPADTBL into a write physical address table NXPADTBL1 for the logical address regions LRNG1 and a write physical address table NXPADTBL2 for the logical address regions LRNG2.

Assuming that the write physical address table NXPADTBL is constituted by N entries: 0th to (N−1)th entries, the write physical address table NXPADTBL, not restrictively specified, may have the N/2 entries from the 0th entry to the (N/2−1)th entry formed as the write physical address table NXPADTBL1 and the remaining N/2 entries from the (N/2)th entry to the Nth entry formed as the write physical address table NXPADTBL2.

In a period T4 (Setup) after the end of the period T3, the information processing device CPU_CHIP reads out a boot program stored in the nonvolatile memory NVM0 in the control circuit STRCT0 and starts up the information processing device CPU_CHIP. In and after a period T5 (Idle) after the end of the period T4, the memory module NVMSTR0 is in an idling state waiting for a request from the information processing device CPU_CHIP.

The initial sequence shown in (b) of FIG. 8 will next be described. In a period T11 (PwOn) and a period T21 (Reset), the same operations as those in the time periods T1 and T2 in (a) of FIG. 8 are performed.

In a period T31 (H2D) after the end of the period T21, the information processing device CPU_CHIP transmits SSD configuration information SDCFG to the memory module NVMSTR0, and the control circuit STRCT0 stores the SSD configuration information SDCFG in the nonvolatile memory NVM0.

In a period T41 (MAP), a period T51 (SetUp) and a period T61 (Idle) after the end of the period T3, the same operations as those in the periods T1 and T2 in (a) of FIG. 8 are performed.

Thus, as shown in (a) of FIG. 8, if SSD configuration information SDCFG is programmed in the memory module NVMSTR0 in advance, the initial sequence at the time of power-on can be speedily executed. Also, as shown in (b) of FIG. 8, SSD configuration information SDCFG is programmed from the information processing device CPU_CHIP to the memory module NVMSTR0 to enable the information processing system device according to the embodiment to configure the suitable memory module NVMSTR0.

<Physical Address Table>

FIG. 9 shows the physical address table PADTBL stored in the random access memory RAM. The physical address table PADTBL is constituted by physical addresses PAD (PAD[31:0]), physical address validity flags PVLD associated with physical addresses, and erase count PERC, and is stored in the random access memory RAM. When the value of one of the validity flags PVLD is 1, the validity flag PVLD indicates that the corresponding physical address is valid. When the value of one of the validity flags PVLD value is 0, the validity flag PVLD indicates that the corresponding physical address is invalid.

The information processing circuit MANAGER manages the physical address table PADTBL by recognizing physical addresses PAD "00000000" to "027FFFFF" as a physical address region PRNG1 and physical addresses PAD "02800000" to "07FFFFFF" as a physical address region PRNG2.

The physical addresses PAD (PAD[31:0]), not restrictively specified, may be constituted by physical segment addresses SGAD (PAD[31:16]) and physical addresses PPAD (PAD[15:0]).

<Physical Segment Table>

FIG. 10 shows the physical segment table PSEGTBL1 and the physical segment table PSEGTBL2 stored in the random access memory RAM. FIG. 10 shows in (a) the physical segment table PSEGTBL1 with respect to invalid physical addresses. FIG. 10 shows in (b) the physical segment table PSEGTBL2 with respect to valid physical addresses.

The upper physical addresses (PAD[31:16]) in the physical addresses PAD (PAD[31:0]), not restrictively specified, may represent physical segment addresses SGAD. The main data size of one physical address, not restrictively specified, may be 512 bytes. The main data size of one segment is 32 megabytes as a set of 65536 physical addresses.

Description of (a) of FIG. 10 will first be made. The physical segment table PSEGTBL1 is constituted by physical segment addresses SGAD (PAD[31:16]), total numbers TNIPA of invalid physical addresses in the physical segment addresses SGAD, invalid physical addresses MXIPAD having largest erase count MXERC in the invalid physical addresses in the segment addresses SGAD, the largest erase count MXERC, invalid physical addresses MNIPAD having smallest erase count MNERC in the invalid physical addresses in the segment addresses SGAD, and the smallest erase count MNERC, and is stored in the random access memory RAM.

Description of (b) of FIG. 10 will next be made. The physical segment table PSEGTBL2 is constituted by physical segment addresses SGAD (PAD[31:16]), total numbers TNVPAGE of valid physical addresses in the physical segment addresses SGAD, valid physical addresses MXVPAD having largest erase count MXERC in the valid physical addresses in the segment addresses SGAD, the largest erase count MXERC, valid physical addresses MNVPAD having smallest erase count MNERC in the valid physical addresses in the segment addresses SGAD, and the smallest erase count MNERC, and is stored in the random access memory RAM.

<Write Physical Address Table>

FIG. 11 shows the write physical address table NXPADTBL stored in the control circuit STRCT0. FIG. 11 shows in (a) an example of the write physical address table NXPADTBL in an initial state at the time of staring use of the device. FIG. 11 shows in (b) an example of the write physical address table NXPADTBL in a content updating state. The write physical address table NXPADTBL is a table for determining physical addresses PAD in the nonvolatile memory devices (NVM10 to NVM17) when data is written to the nonvolatile memory devices. The write physical address table NXPADTBL is provided for a plurality (N number) of physical addresses.

The physical address table NXPADTBL is constituted by entry numbers ENUM, physical addresses NXPAD, physical address validity flags NXPVLD associated with the physical addresses NXPAD, and erase count NXPERC.

The control circuit STRCT0 recognizes that the logical address region LRNG information in the SSD configuration information SDCFG designates divided logical address regions LRNG1 and LRNG2, and manages the N/2 addresses from the entry number 0 to the entry number (N/2−1) as the write physical address table NXPADTBL1 and the remaining N/2 addresses from the entry number (N/2) to the entry number N as the write physical address table NXPADTBL2 in the write physical address table NXPADTBL. The control circuit STRCT0 writes data to the nonvolatile memory devices (NVM10 to NVM17) by using the write physical address table NXPADTBL1 at a request for write to the logical address region LRNG1, and by using the write physical address table NXPADTBL2 at a request for write to the logical address region LRNG2.

The entry numbers ENUM designate a value N (number 0 to number (N−1)) for a plurality (N number) of sets of physical addresses NXPAD. The value N designates write priorities (the number of registrations). At a request for write to the logical address region LRNG1, the addresses in the write physical address table NXPADTBL1 are used with priorities in increasing order of the value N. At a request for write to the logical address region LRNG2, the addresses in the write physical address table NXPADTBL2 are used with priorities in increasing order of the value N. The value 0 of one of the validity flags NXPVLD signifies that the corresponding physical address is invalid, while the value 1 of one of the validity flags NXPVLD signifies that the corresponding physical address is valid.

Initial setting (for example, from T1 to T3 in FIG. 8) of the write physical address table NXPADTBL in a case where N=32 in (a) of FIG. 11 will be described.

With the entry numbers ENUM=number 0 to number (32/2)−1, alternate physical addresses NXPAD are successively set from the address number "00000000" to the address number "0000001E" for the physical addresses NXPAD in the physical address region PRNG1 corresponding to the logical address region LRNG1.

With the entry numbers ENUM=number (32/2) to number (32-1), addresses NXPAD are successively set from the address number "02800000" to an address number "0280000F" for the physical addresses in the physical address region PRNG2 corresponding to the logical address region LRNG2.

All the validity flags NXPVLD and erase count NXPERC associated with these physical addresses are set to 0.

When the write physical address table NXPADTBL is in the state shown in (a) of FIG. 11, and when a write request WTREQ having a sector count SEC value 1 (512 bytes) is input N/2 times from the information processing device CPU_CHIP to the logical address region LRNG1 of the memory module NVMSTR0 through the interface signal HDH_IF, items of data included in the write request WTREQ are written to the non-volatile memory devices at the alternate physical addresses PAD from the address number "00000000" to the address number "0000001E".

Further, when a write request WTREQ having a sector count SEC value 1 (512 bytes) is input N/2 times from the information processing device CPU_CHIP to the logical address region LRNG2 of the memory module NVMSTR0 through the interface signal HDH_IF, groups of data included in the write request WTREQ are written to the non-volatile memory devices at the successive physical addresses PAD from the address number "02800000" to the address number "0280000F".

Another example of the operation is as described below. When a write request WTREQ having a sector count SEC value 16 (8 kilobytes) is input one time from the information processing device CPU_CHIP to the logical address region LRNG1 of the memory module NVMSTR0 through the interface signal HDH_IF, data included in this write request WTREQ is divided in correspondence with the physical addresses PAD in the 512 byte basis to be written to the nonvolatile memory devices at the alternate physical addresses PAD from the address number "00000000" to the address number "0000001E".

When a write request WTREQ having a sector count SEC value 16 (8 kilobytes) is input one time from the information processing device CPU_CHIP to the logical address region LRNG2 of the memory module NVMSTR0 through the interface signal HDH_IF, data included in this write request WTREQ is divided in correspondence with the physical addresses PAD in the 512 byte basis to be written to the nonvolatile memory devices at the successive physical addresses PAD from the address number "02800000" to the address number "0280000F".

<Example of Initial Setting Values in Address Conversion Table and Example of Initial Setting Values in Nonvolatile Memory Device>

FIG. 12 shows in (a) an example of an initial setting of the address conversion table LPTBL made by the control circuit STRCT0 (at time T0) immediately after turning on the power. FIG. 12 shows in (b) an example of an initial setting of the nonvolatile memory devices made by the control circuit STRCT0 immediately after turning on the power.

All the physical addresses CPAD and physical address validity flags CVF with respect to all the logical addresses LAD in the address conversion table LPTBL are initialized to 0. Also, all the data, all the logical addresses and all the data validity flags in the nonvolatile memory devices are initialized to 0.

<SSD Configuration Information>

FIG. 13 shows an example of the SSD configuration information SDCFG stored in the nonvolatile memory NVM0 in the control circuit STRCT0. In FIG. 13, LRNG indicates sector-based (512B) ranges of logical addresses LAD in logical address regions; CAP indicates the capacity of logical data in the range determined by the logical address region LRNG; and RELLVL indicates the level of reliability.

The logical address region LRNG1 occupies a logical address LAD space from "0000_0000" to "007F_FFFF" in hexadecimal notation and has a capacity of 4G bytes. The logical address region LRNG2 occupies a logical address space from "0080_0000" to "037F_FFFF" in hexadecimal notation and has a capacity of 32G bytes.

INTVLDCELL indicates at what intervals write to the memory cells in a main data region is permitted. When INTVLDCELL is "1", it designates permitting write to alternate ones of the physical memory positions. When INTVLDCELL is "0", it designates permitting write to the memory cells at successive physical positions, i.e., at the physical positions adjacent one to another.

INTVLRCELL indicates at what interval write to the memory cells in a redundant data region is permitted. When INTVLRCELL is "1", it designates permitting write to alternate ones of the memory cells. When INTVLRCELL is "0", it designates permitting write to the memory cells at successive positions, i.e., write to all the memory cells.

BODRCELL is information necessary for determining a memory cell region BDR where successive writes are prohibited. When BODRCELL is 3, write to a memory cell region corresponding to three word lines is prohibited.

TESTCELL information is information necessary for determining a continuous memory cell region TAREA for testing. When TESTCELL is 5, the size of the memory cell region TAREA is a memory cell capacity corresponding to five bit lines.

MONICELL indicates the number of memory cells for monitoring of the resistance value of the memory cell and the data value ("1" or "0") written to the memory cell, for example. When MONICELL is 1, one of the memory cells corresponding to one bit is designated as a memory cell for monitoring one bit in the memory cell region TAREA for testing.

Assuming that the value of each memory cell is "0" when the memory cell is in the reset state and memory cell value is "1" when the memory cell is in the set state, the control circuit STRCT0 first sets the memory cells in the memory cell region TAREA immediately after the completion of the initial sequence at power-on. That is, the memory cells hold "1". Next, the control circuit STRCT0 writes data "0" to the memory cell designated for monitoring by MONICELL (e.g., MONI1 and MONI2 indicated in FIG. 16). That is, the control circuit STRCT0 resets the memory cell. Subsequently, the control circuit STRCT0 periodically reads out data from the memory cell for monitoring. The control circuit STRCT0 checks whether the read data is "0". If the read data is not "0", the control circuit STRCT0 determines that there is a possibility of the reliability of the memory cell in the logical address region LRNG corresponding to MONICELL in the SSD configuration information SDCFG being reduced.

Next, the control circuit STRCT0 again sets the memory cells in the memory cell region TEREA and resets the memory cell designated for monitoring by MONICELL. Further, the control circuit STRCT0 again reads out periodically data from the memory cell for monitoring, and checks whether the read data is "0".

The control circuit STRCT0 also counts the number of times the data read out from the memory cell for monitoring is found to be not "0". By using this number of times, the reliability of the memory cell can be grasped and the degree of reliability of the memory module NVMSTR0 can be maintained at a certain level.

When the data read out from the memory cell for monitoring is not "0", the control circuit STRCT0 may transmit to the information processing device CPU_CHIP warning information indicating the possibility of a reduction in reliability and the value of the logical address region LRNG corresponding to MONICELL in the SSD configuration information SDCFG.

The information processing device CPU_CHIP grasps the reliability of the memory module NVMSTR0 by using the value of the logical address region LRNG and the warning information received from the control circuit STRCT0 and the number of times the information has been received, and can maintain the degree of reliability of the memory module NVMSTR0 at a certain level.

As described above, a memory cell for performing monitoring, designated by MONICELL, is provided and data from the memory cell is periodically read out to enable grasping the reliability of the memory module NVMSTR0, thus enabling the memory module NVMSTR0 to operate with improved reliability.

ECCFLG indicates a unit of data on which ECC is performed. ECCFLG indicates execution of ECC on data in 512B units when ECCFLG is 0, indicates execution of ECC on data in 2048B units when ECCFLG is 1, indicates execution of ECC on data in 4096B units when ECCFLG is 2, indicates execution of ECC on data in 8192B units when ECCFLG is 3, indicates execution of ECC on data in 16384B units when ECCFLG is 4, indicates execution of ECC on data in 32B units when ECCFLG is 5, indicates execution of ECC on data in 64B units when ECCFLG is 6, indicates execution of ECC on data in 128B units when ECCFLG is 7, and indicates execution of ECC on data in 256B units when ECCFLG is 8. However, ECC is not particularly limited to this.

There are various storage devices such as a hard disk, a solid state drive (SSD), a cache memory and a main memory. Such various storage devices have different units of data to be read or written. For example, a storage such as a hard disk or an SSD performs reading and writing of data in units of 512B or more. Also, between a cache memory and a main memory, reading of data and writing of data on a line size (e.g., 32B or 64B) basis. Even if different data units exist as described above, ECCFLG enables ECC on data in different units and meeting requirements on the memory module NVMSTR0 with flexibility.

Write method selection information WRTFLG indicates a write method at the time of writing. The write method selection information WRTFLG designates writing of data by an ordinary method when the information WRTFLG is 0, designates writing of inverted data when the information WRTFLG is 1, and designates a method in which data is temporality read out before writing data and the data is thereafter written, when the information WRTFLG is 2. However, write method selection is not particularly limited to this.

TDCL information is information necessary for determining a memory cell region DTMPATREA additionally provided in the memory cells in the main data region. When TDCL is 4, DTMPATREA is a memory cell region belonging to one of a memory cell region corresponding to four bit lines and a memory cell region corresponding to four word lines.

The TRCL information is information necessary for determining a memory cell region RTMPATREA additionally provided in the memory cells in the redundant data region. When TRCL is 4, RTMPATREA is a memory cell region belonging to one of a memory cell region corresponding to four bit lines and a memory cell region corresponding to four word lines.

The existence of DTMPATREA and RTMPATREA enables extending the rewrite life of the memory module NVMSTR0.

<Example of Configuration of Written Data>

A rewrite method using DTMPATREA will be described. Needless to say, this method can be applied to a rewrite method using RTMPATREA. The SSD configuration information SDCFG is programmable and can be modified with flexibility according to the functions, the performance and the level of reliability required of the memory module NVMSTR0.

FIG. 14 shows the configuration of data PAGEDATA written to the nonvolatile memory devices (in NVM10 to NVM17) by the control circuit STRCT0. Data PAGEDATA, not restrictively specified, may be constituted by main data DArea (512 bytes) and redundant data RArea (16 bytes). The redundant data RArea includes a data inversion flag INVFLG, a write flag WRITFLG, an ECC flag ECCFLG, an ECC code ECC, state information STATE, reliability level information RELIABLE, bad block information BADBLK, monitor cell information NONITOR, and a reserve region RSV.

The data inversion flag INVFLG indicates whether or not the main data DArea written to the nonvolatile memory devices (in NVM10 to NVM17) by the control circuit STRCT0 is data obtained by inverting the bits of the original data to be written. When "0" is written to the data inversion flag INVFLG, the data inversion flag INVFLG indicates that the data has been written without inverting the bits of the original main data. When "1" is written to the data inversion flag INVFLG, the data inversion flag INVFLG indicates that the data obtained by inverting the bits of the original main data has been written.

The flag WRITFLG indicates a write method executed at the time of writing of the main data DArea to the nonvolatile memory devices (in NVM10 to NVM17) performed by the control circuit STRCT0. WRITFLG indicates that the main data DArea has been written by an ordinary method, when "0" is written to WRITFLG, indicates that data obtained by inverting the bits of the original main data has been written, when "1" is written to WRITFLG, and indicates that after temporarily reading out data prior to writing data, only data required for rewriting has been written, when "2" is written to WRITFLG. However, these write methods are not exclusively carried out.

The flag ECCFLG indicates for what size of main data DArea an ECC code is produced when the control circuit STRCT0 writes the main data DArea to the nonvolatile memory device (in NVM10 to NVM17). ECCFLG indicates that the code has been produced for the 512 byte data size when "0" is written to ECCFLG, indicates that the code has been produced for the 1024 byte data size when "1" is written to ECCFLG, indicates that the code has been produced for the 2048 byte data size when "2" is written to ECCFLG, and indicates that the code has been produced for the 32 byte data size when "3" is written to ECCFLG. However, the relationship between the data size and the ECC code is not limited to this.

The ECC code ECC is data necessary for detecting and correcting an error in the main data DArea. ECC is generated in correspondence with the main data DArea and written to the redundant data RArea by the control circuit STRCT0 when the control circuit STRCT0 writes the main data DArea to the nonvolatile memory devices (in NVM10 to NVM17).

The state information STATE indicates whether the main data DArea written to the nonvolatile memory devices (in NVM10 to NVM17) is in the valid state, the invalid state or the erased state. The state information STATE, not restrictively specified, may indicate that the main data DArea is in the invalid state, when "0" is written to the state information STATE, indicate that the main data DArea is in the valid state, when "1" is written to the state information STATE, and indicate that the main data DArea is in the erased state, when "3" is written to the state information STATE.

The reliability level information RELIABLE indicates the level of reliability of the main data DArea written to the nonvolatile memory devices (in NVM10 to NVM17). The reliability level information RELIABLE, not restrictively specified, may indicate that the main data DArea has a higher level of reliability if the value of the reliability level information RELIABLE is higher, indicate that the level of reliability of the main data DArea is "standard", when "0" is written to the reliability level information RELIABLE, indicate that the level of reliability of the main data DArea is "high reliability", when "1" is written to the reliability level information RELIABLE, and indicate that the level of reliability of the main data DArea is "still higher reliability", when "2" is written to the reliability level information RELIABLE.

The monitor cell information MONITOR indicates whether or not any monitor cell is included in the main data DArea written to the nonvolatile memory devices (in NVM10 to NVM17). When "0" is written to the monitor cell information MONITOR, the monitor cell information MONITOR indicates that no monitor cell is included in the main data DArea. When "1" is written to the monitor cell information MONITOR, the monitor cell information MONITOR indicates that a monitor cell is included in the main data DArea.

The bad block information BADBLK indicates whether or not the main data DArea written to the nonvolatile memory devices (in NVM10 to NVM17) is usable. The bad block information BADBLK, not restrictively specified, may indicate that the main data DArea is usable, when "0" is written to the bad block information NADBLK, and indicate that the main data DArea is not usable, when "1" is written to the bad block information BADBLK. When error correction by ECC can be made, the bad block information BADBLK is 0. When error correction by ECC cannot be made, the bad block information BADBLK is 1.

The reserve region RSV exists as a region freely definable by the control circuit STRCT0.

<Example of Arrangement of Writable Memory Cells>

Figure 15:
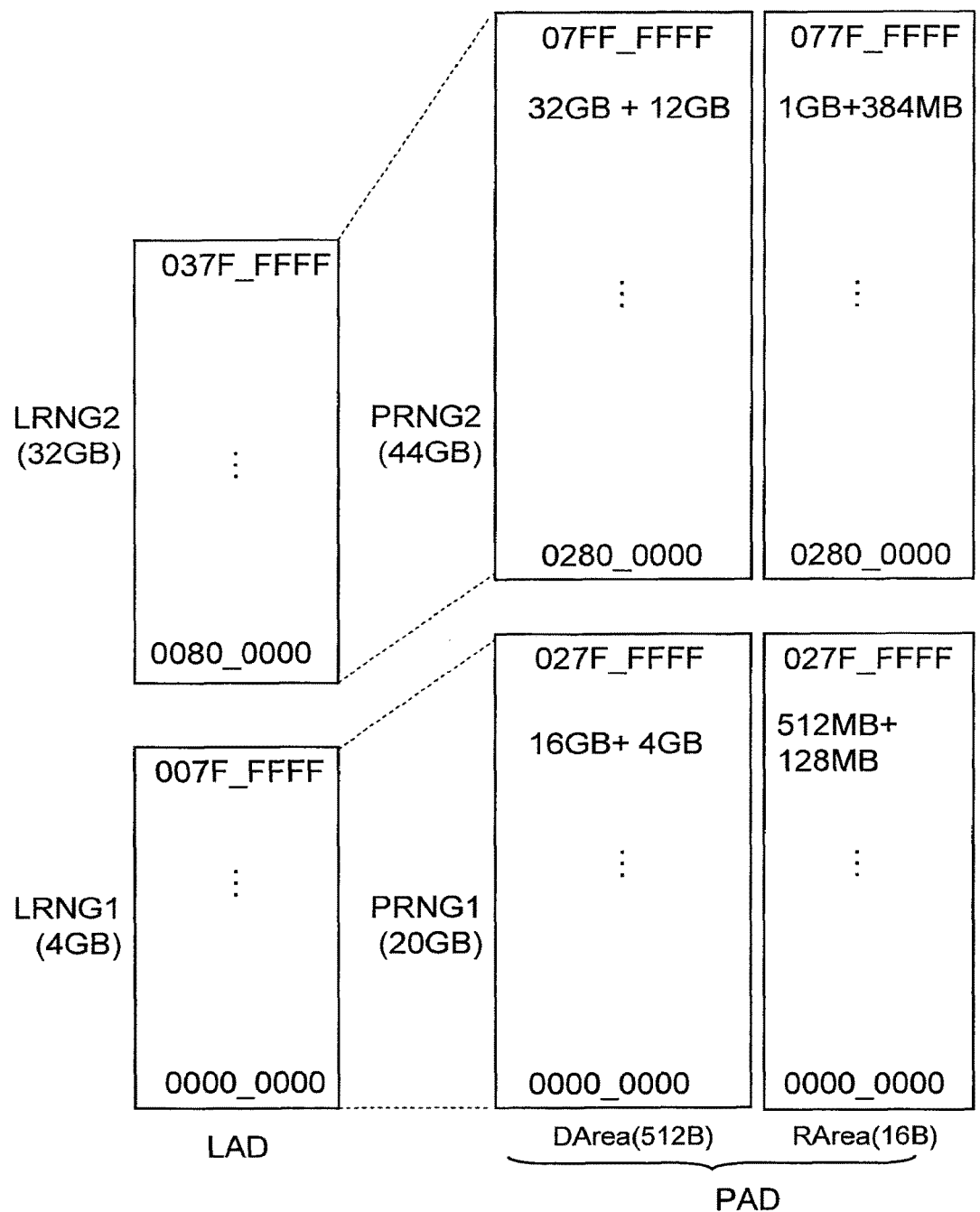
FIG. 15 is a diagram showing an example of an address map range according to the present invention.
Figure 16:
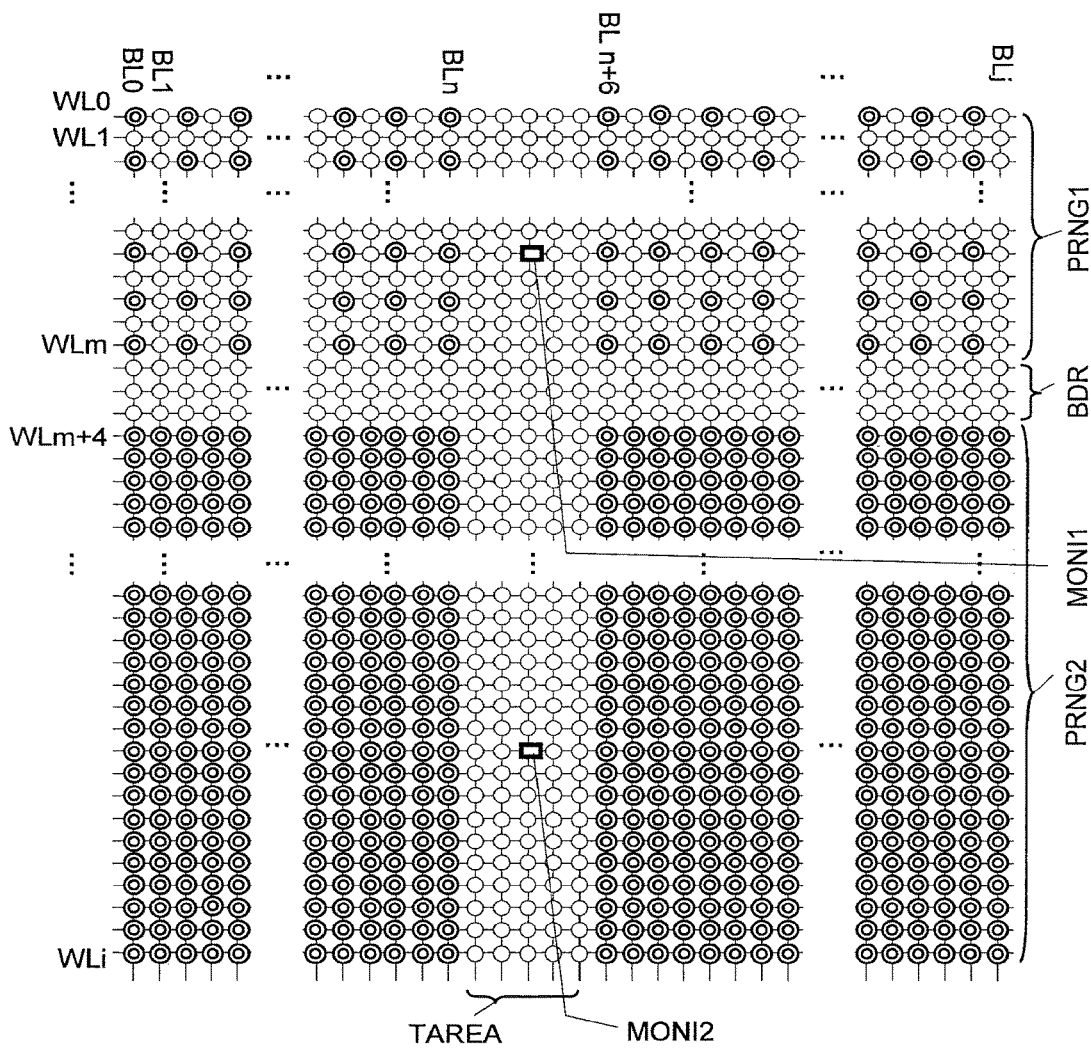
FIG. 16 is a diagram showing an example of an arrangement of writable memory cells in the memory cell array in the nonvolatile memory device.

FIG. 15 shows an example of the address range map ADMAP formed by the control circuit STRCT0 using the SSD configuration information shown in (a) of FIG. 13, and stored in the random access memory RAM by the control circuit STRCT0. FIG. 16 shows an example of an arrangement of writable memory cells in one of the memory cell arrays ARY in the nonvolatile memory devices determined as data write targets by the control circuit STRCT0 using the SSD configuration information shown in (a) of FIG. 13 and the address range map shown in FIG. 15. In FIG. 16, the points of intersection of the word lines WL0 to WLi and the bit lines BL0 to BLj represent the memory cells. Also, in FIG. 16, ◉ denoting the points of intersection of the even word lines WLn (n: even numbers) in the word lines WL0 to WLm and the even bit lines BLm (m: even numbers) in the bit lines BL0 to BLj in the physical address region PRNG1 denotes first write-permitted ones of the memory cells to which data is written. ○ denoting the points of intersection of the even word lines WLn (n: even numbers) in the word lines WL0 to WLm and the odd bit lines BLm (m: odd numbers) in the bit lines BL0 to BLj denotes second write-permitted ones of the memory cells to which data is written. ○ denoting the points of intersection of the odd word lines WLn (n: odd numbers) in the word lines WL0 to WLm and the even bit lines BLm (m: even numbers) in the bit lines BL0 to BLj denotes third write-permitted ones of the memory cells to which data is written. ○ denoting the points of intersection of the odd word lines WLn (n: odd numbers) in the word lines WL0 to WLm and the odd bit lines BLm (m: odd numbers) in the bit lines BL0 to BLj denotes fourth write-permitted ones of the memory cells to which data is written. □ formed by a thick line denotes the memory cells for monitoring. ◉ denoting the points of intersection of the word lines WLm+4 to WLi and the bit lines BL0 to BLj in the physical address region PRNG2 denotes first write-permitted ones of the memory cells to which data is written.

A write-prohibited region BDR in FIG. 16 includes a number of memory cells corresponding to 3× the number of bit lines in the memory cell region connected to the word lines WLm+1 to WLm+3. This write-prohibited region is determined from address map range AMDMAP information produced by the control circuit STRCT0 using a BODRCELL information value "3" in the SSD configuration information.

The write-prohibited region BDR is a region for separating the physical address regions PRNG1 and PRNG2 and reducing the influence of a thermal history of Joule heat on the memory cells at the time of data writing. The write-prohibited region BDR is determined by the value of BODRCELL in the SSD configuration information SDCFG shown in FIG. 13.

A testing region TAREA in FIG. 16 is illustrated as a memory cell region connected to the bit lines BLn+1 to BLn+5 and includes a number of memory cells corresponding to 5× the number of word lines (WLi+1).

The testing region TAREA is determined from address map range AMDMAP information produced by the control circuit STRCT0 using a TESTCELL information value "5" in the SSD configuration information. Two memory cells MONI1 and MONI2 for monitoring exist in the testing region TAREA.

LAD in FIG. 15 denotes logical addresses provided in units for 512 bytes of data input from the information processing device CPU_CHIP to the memory module NVM-STR0. PAD denotes physical addresses input from the control circuit STRCT0 to the nonvolatile memory devices (NVM10 to NVM17). In the present embodiment, physical addresses PAD are given in units of the sum of 512 bytes of main data DArea and 16 bytes of redundant data RArea. The control circuit STRCT0 converts the logical addresses LAD into the physical addresses PAD and writes data to the nonvolatile memory devices (NVM10 to NVM17).

The logical address region LRNG1 occupies a logical address LAD space from "0000_0000" to "007F_FFFF" in hexadecimal notation and has a capacity of 4G bytes. The logical address region LRNG2 occupies a logical address space from "0080_0000" to "037F_FFFF" and has a capacity of 32G bytes.

The physical address region PRNG1 corresponding to the logical address region LRNG1 has a physical address PAD space from "0000_0000" to "027F_FFFF" in hexadecimal notation. The capacity of all the memory cells existing in the physical address PAD space corresponding to the physical address region PRNG1 is 20 gigabytes of main data DArea and 640 megabytes of redundant data RArea.

Each physical address PAD, not restrictively specified, may be constituted by, from the most significant bit, a bank address BKAD, a row address ROWAD (word line WL address), a column address COLAD, and a chip address CHIPAD.

Each of the addresses in the nonvolatile memory devices corresponding to the physical addresses PAD in the physical address region PRNG1 is constituted by, from the most significant bit, bank addresses BKAD3 to BKAD0, row addresses ROWADm to ROWAD0 (word lines WLm to WL0), column addresses COLADi to COLADn+6 (bit lines BLi to BLn+6), column addresses COLADi to COLADn (bit lines BLn to BL0), and chip addresses from CHIPAD7 to CHIPAD0.

The physical address region PRNG2 corresponding to the logical address region LRNG2 has a physical address PAD space from "0280_0000" to "07FF_FFFF" in hexadecimal notation. The capacity of all the memory cells existing in the physical address PAD space corresponding to the physical address region PRNG2 is 44 gigabytes of main data DArea and 1384 megabytes of redundant data RArea.

Each physical address PAD, not restrictively specified, may be constituted by, from the most significant bit, a bank address BKAD, a row address ROWAD (word line WL address), a column address COLAD, and a chip address CHIPAD.

Each of the addresses in the nonvolatile memory devices corresponding to the physical addresses PAD in the physical address region PRNG2 is constituted by, from the most significant bit, bank addresses BKAD3 to BKAD0, row addresses ROWADi to ROWADm+4 (word lines WLi to WLm+4), column addresses COLADi to COLADn+6 (bit lines BLi to BLn+6), column addresses COLADi to COLADn (bit lines BLn to BL0), and chip addresses from CHIPAD7 to CHIPAD0.

The arrangements of the memory cells in FIG. 16 corresponding to the SSD configuration information SDCFG shown in (a) of FIG. 13 and the physical address regions PRNG1 and PRNG2 according to the address range map ADMAP shown in FIG. 15 are as described below. Referring to FIG. 16, the memory cells region defined by removing the memory cells determined in the testing region TAREA (from the bit line BLn+1 to bit line BLn+5) from the memory cells connected to the word lines WL0 to WLm corresponds to the physical address region PRNG1.

Since the INTVLDCELL information on the logical address region LRNG1 in the SSD configuration information is 1 (FIG. 13), write to alternate ones of the memory cells in the physical address region PRNG1 corresponding to the logical address region LRNG1 is permitted.

More specifically, writes are made to the memory cells ◉ positioned at the points of intersection of the word lines alternately selected in the word lines WL0 to WLm and the bit lines alternately selected in the bit lines BL0 to BLn and BLn+6 to BLj.

An example of a method of writing to the physical address region PRNG1 will be described. First, write to the first write-permitted memory cells in the physical address region PRNG1 indicated by ◉ is performed.

Next, when the count of writes to the first write-permitted memory cells becomes close to the upper limit, write to the second write-permitted memory cell is performed instead of write to the first write-permitted memory cells. When the count of writes to the second write-permitted memory cells becomes close to the upper limit, write to the third write-permitted is performed instead of write to the second write-permitted memory cells. When the count of writes to the third write-permitted memory cells becomes close to the upper limit, write to the fourth write-permitted is performed instead of write to the third write-permitted memory cells.

Write is controlled in this way to enable writing data to the alternative ones of all the memory cells in the physical address region PRNG1. Therefore the influence of a thermal history of Joule heat on the memory cells at the time of data writing can be reduced and an improvement in reliability can be achieved. Also, write to the memory cells can be performed until the total count of writes to all the memory cells in the physical address region PRNG1 is reached, thus realizing an extension of the life.

Figure 17:
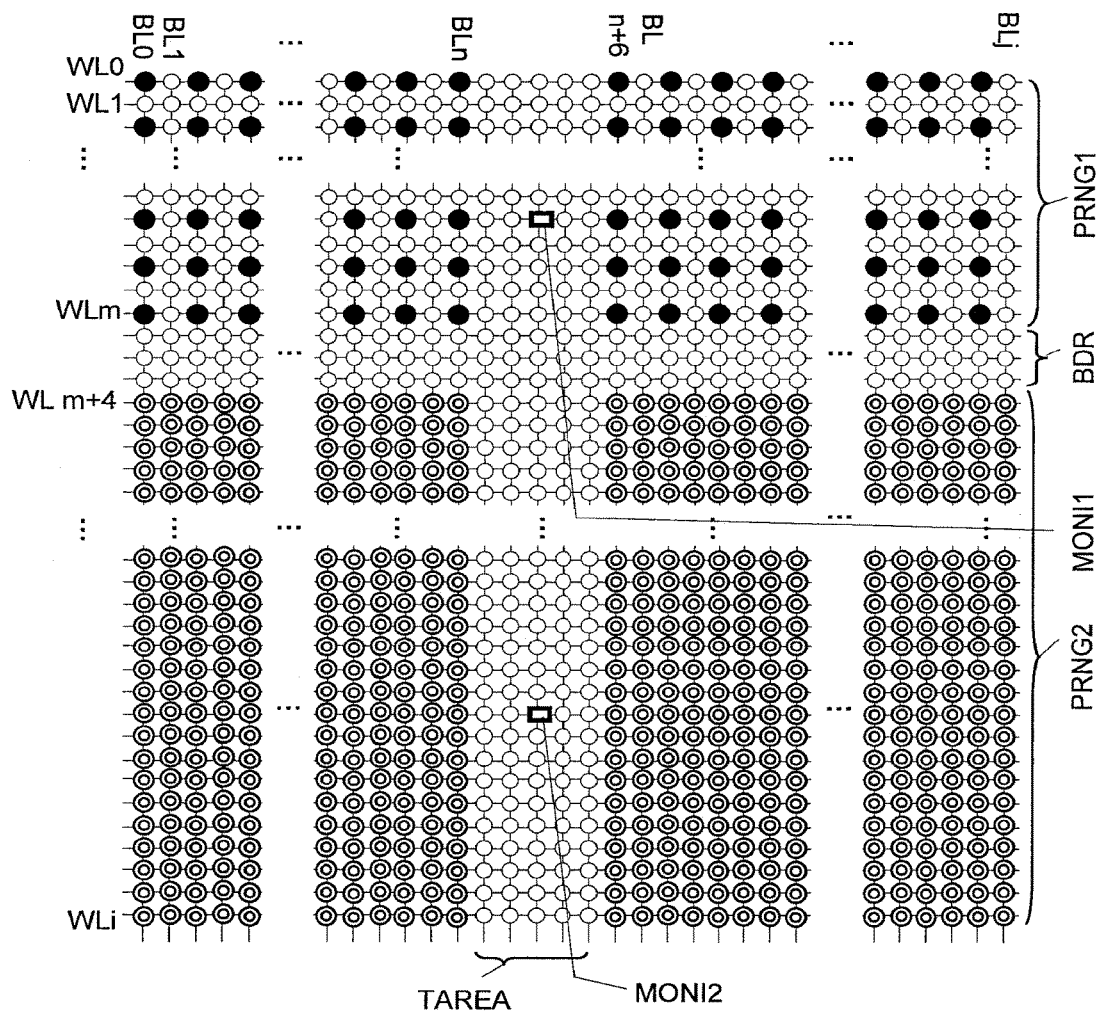
FIG. 17 is a diagram showing an example of writing of data to the writable memory cells in the memory cell array in the nonvolatile memory device.

FIG. 17 shows an example of one of the memory cell arrays ARY in the nonvolatile memory devices when writing of data to the first write-permitted memory cells in the physical address region PRNG1 by the method of writing to the physical address region PRNG1 described with reference to FIG. 16 is completed. ● denotes the memory cells written with data. It can be understood that, as shown in FIG. 17, writes have been made to the memory cells positioned at the points of intersection of the word lines alternately selected in the word lines WL0 to WLm and the bit lines alternately selected in the bit lines BL0 to BLn and BLn+6 to BLj in the physical address region PRNG1.

In the case shown in FIG. 16, the memory cells region defined by removing the memory cells determined in the testing region TAREA (from the bit line BLn+1 to bit line BLn+5) from the memory cells connected to the word lines WLm+4 to WLi corresponds to the physical address region PRNG2.

Since the INTVLDCELL information on the logical address region LRNG2 in the SSD configuration information is 0, write to all the memory cells in the physical address region PRNG2 corresponding to the logical address region LRNG2 is permitted.

Accordingly, writes are made to the first write-permitted memory cells in the physical address region PRNG2 indicated by ◉. More specifically, writes are made to the memory cells positioned at the points of intersection of the selected word lines WLm+4 to WLi and the selected bit lines BL0 to BLn and BLn+6 to BLj.

The capacity of all the memory cells existing in the physical address PAD space corresponding to the physical address region PRNG2 is 44 gigabytes+1384 megabytes.

Figure 18:
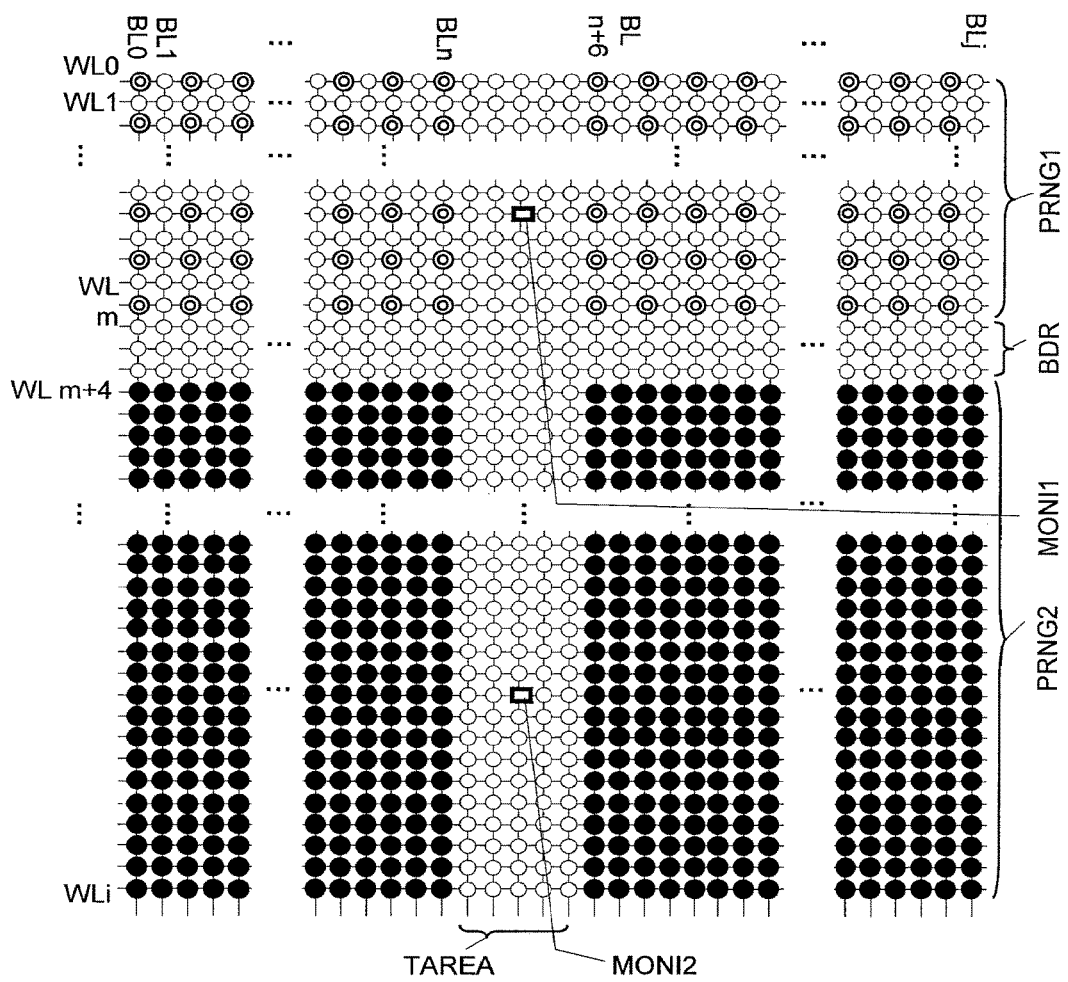
FIG. 18 is a diagram showing another example of writing of data to the writable memory cells in the memory cell array in the nonvolatile memory device.

FIG. 18 shows an example of one of the memory cell arrays ARY in the nonvolatile memory devices when writing of data to the first write-permitted memory cells in the physical address region PRNG2 by the method of writing to the physical address region PRNG2 described with reference to FIG. 16 is completed. ● denotes the memory cells to which data has been written.

It can be understood that, as shown in FIG. 18, writes have been made to all the memory cells positioned in the physical address region PRNG2.

As described above, a permission to write to alternate ones of the memory cells in the physical address region PRNG1 is given and data is written to the memory cells. As a result, the influence of a thermal history of Joule heat on the memory cells at the time of data writing to the physical address region PRNG1 can be reduced and the memory module NVSTR0 can be provided as highly reliable long-life memory module.

If the value of INTVLDCELL in the SSD configuration information SDCFG shown in FIG. 13 is set to 2, a permission to write to the first, second or third of every three memory cells is given to enable writing of data. In such a case, the influence of a thermal history of Joule heat on the memory cells at the time of data writing can be reduced in comparison with the case of write to the alternate memory cells and the memory module NVSTR0 can be provided as highly reliable long-life memory module.

As described above, the SSD configuration information SDCFG is programmable and can be modified with flexibility according to the level of reliability required of the memory module NVMSTR0.

<Write Operation>

Figure 19:
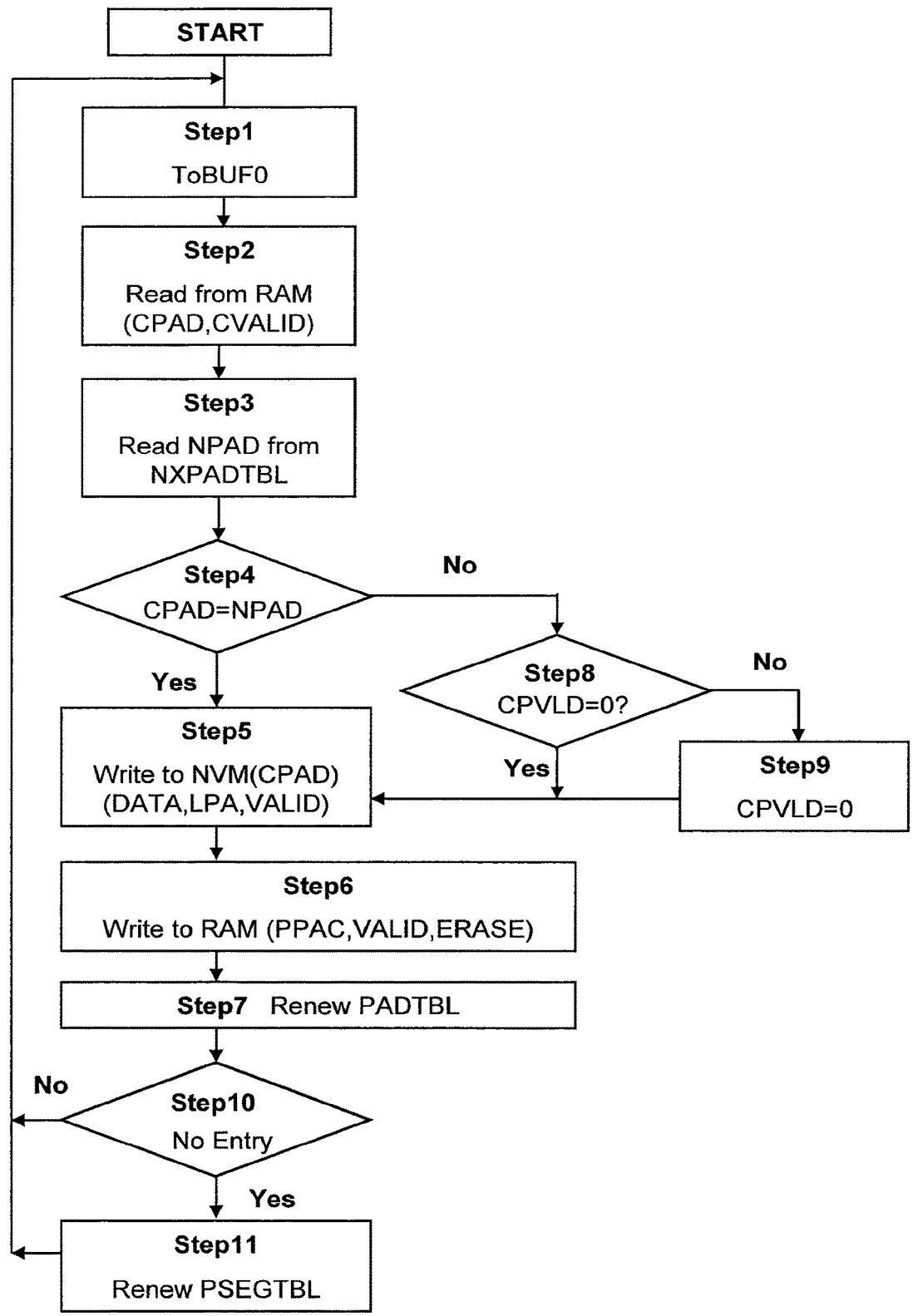
FIG. 19 is a diagram showing an example of a data write operation performed by the memory module.

FIG. 19 shows an example of a write operation performed by the memory module NVMSTR0 when a write request WTREQ01 is input from the information processing device CPU_CHIP to the memory module NVMSTR0. The information processing circuit MANAGER, not restrictively specified, may perform write to the nonvolatile memory devices (in NVM10 to NVM17) by associating one physical address with the size of 512 bytes of main data DArea and 16 bytes of redundant data RArea.

When the write request WTREQ01 including a logical address value LAD0, a data write instruction WRT, a sector count value SEC1 and 512 bytes of data WDATA0 to be written is input from the information processing device CPU_CHIP to the control circuit STRCT0, the interface circuit HOST_IF takes out clock information inserted in the write request WTREQ01, converts the write request WTREQ01 provided in the form of serial data into parallel data and transfers this data to the buffer BUF0 and the information processing circuit MANAGER (Step 1).

Next, the information processing circuit MANAGER deciphers the logical address value LAD0, the data write instruction WRT and the sector count SEC1 and searches the address conversion table LPTBL in the random access memory RAM to read out the current physical address value CPAD0 stored at the address LAD No. 0 and the validity flag CVF value associated with the physical address value CPAD0. Further, the information processing circuit MANAGER searches the address conversion table LPTBL from the physical address table PADTBL in the random access memory RAM to read out the erase count value PERC500 and the validity flag PVLD value corresponding to the readout physical value CPAD0 (Step 2).

Next, the information processing circuit MANAGER determines, by using the address range map ADMAP stored in the random access memory RAM, whether the logical address value LAD0 input from the information processing device CPU_CHIP to the control circuit STRCT0 is a logical address value in the logical address region LRNG1 or a logical address value in the logical address region LRNG2.

The information processing circuit MANAGER reads out the write physical addresses corresponding to the number designated with the sector count value SEC1 in descending order of write priorities, one write physical address NXPAD100 in this case, and the validity flag NXPVLD value and the erase count value NXPERC associated with this next write physical address NXPAD100 from the write physical address table NXPADTBL1 shown in FIG. 11 if the logical address value LAD0 is a logical address value in the logical address region LRNG1 or from the write physical address table NXPADTBL2 if the logical address value LAD0 is a logical address value in the logical address region LRNG2 (Step 3).

The information processing circuit MANAGER executes Step 5 if the current physical address value CPAD0 and the next write physical address NXPAD100 are equal to each other, or executes Step 8 if the current physical address value CPAD0 and the next write physical address NXPAD100 are different from each other.

In Step 5, the information processing circuit MANAGER writes at the address NXPAD No. 100 in the nonvolatile memory device (in NVM10 to NVM17) the data WDATA0 and the logical address value LAD0 and the validity flag CVF value 1 associated with the physical address NXPAD100.

In Step 6, the information processing circuit MANAGER writes at the address LAD0 in the address conversion table LPTBL the physical address value NXPAD100 and the validity flag CVF value 1 associated with the physical address value LAD0.

In Step 8, the information processing circuit MANAGER determines whether or not the validity flag CPVLD value read out from the physical address table PADTBL and associated with the physical address value CPAD0 is 0.

When the validity flag CPVLD value is 0, it indicates that the physical address CPAD0 in the nonvolatile memory device (in NVM10 to NVM17) corresponding to the logical address LAD0 is invalid. This means that only new physical address NXPAD100 exists as a physical address corresponding to the logical address LAD0. The information processing circuit MANAGER executes Step 5 after Step 8.

When the validity flag CPVLD value is 1, it indicates that the physical address CPAD0 corresponding to the logical address LAD0 is still valid. In this case, the information processing circuit MANAGER executes Step 9.

In Step 9, the information processing circuit MANAGER changes to 0 the validity flag CVF value associated with the physical address CPAD0 in the address conversion table LPTBL in order to write the data WDATA0 at the new physical address NXPAD100 corresponding to the logical address LAD0, and sets to 0 the physical address validity flag PVLD associated with the physical address CPAD0 in the physical address table PADTBL.

After invalidating the physical address CPAD0 corresponding to the logical address LAD0 in Step 9, the information processing circuit MANAGER executes Step 5.

In Step S7, the information processing circuit MANAGER generates a new erase count value NXPERC by incrementing by 1 the erase count value NXPERC associated with the physical address NXPAD100, rewrites into this new erase count value NXPERC the erase count PERC associated with the physical address NXPAD100 in the physical address table PADTBL stored in the random access memory RAM, and sets the physical address validity flag CPVLD to 1.

In Step 10, the information processing circuit MANAGER determines whether or not write at all the physical addresses NXPAD stored in the write physical address table NXPADTBL is completed. In particular, if write at all the physical addresses NXPAD stored in the write physical address table NXPADTBL is completed, the information processing circuit MANAGER executes Step 11. In the case of incompletion, the information processing circuit MAN- AGER waits for a request for write to the memory module NVMSTR0 from the information processing device CPU_CHIP.

In Step 11, when write at all the physical addresses NXPAD stored in the write physical address table NXPADTBL is completed, the information processing circuit MANAGER determines the total number TNIPA of invalid physical addresses in the physical segment addresses SGAD, the invalid physical addresses MXIPAD having the largest erase count MXERC in the invalid physical addresses in the segment addresses SGAD, the largest erase count MXERC, the invalid physical addresses MNVPAD having the smallest erase count MNERC in the invalid physical addresses in the segment addresses SGAD, and the smallest erase count MNERC by using the physical address validity flags CPVLD and the erase count PERC in the physical address table PADTBL, and updates the physical segment table PSEGTBL1. Further, the information processing circuit MANAGER determines the total number TNV-PAGE of valid physical addresses in the physical segment addresses SGAD, the valid physical addresses MXVPAD having the largest erase count MXERC in the valid physical addresses in the physical segment addresses SGAD, the largest erase count MXERC, the valid physical addresses MNVPAD having the smallest erase count MNERC in the valid physical addresses in the segment addresses SGAD, and the smallest erase count MNERC, and updates the physical segment table PSEGTBL2.

Further, the information processing circuit MANAGER updates the physical address table NXPADTBL. After the completion of the physical address table NXPADTBL, the information processing circuit MANAGER waits for a request for write to the memory module NVMSTR0 from the information processing device CPU_CHIP. The description has been made of the case where the control circuit STRCT0 is provided with one write physical address table NXPADTBL. In a case where the control circuit STRCT0 is provided with a plurality of write physical address tables NXPADTBL0 to NXPADTBL3 as shown in FIG. 4, the information processing circuit MANAGER can manage and update the write physical address tables independently of each other. In such a case, therefore, the rate of transfer of data to be written to the nonvolatile memory devices (NVM10 to NVM17) can be increased.

Figure 20:
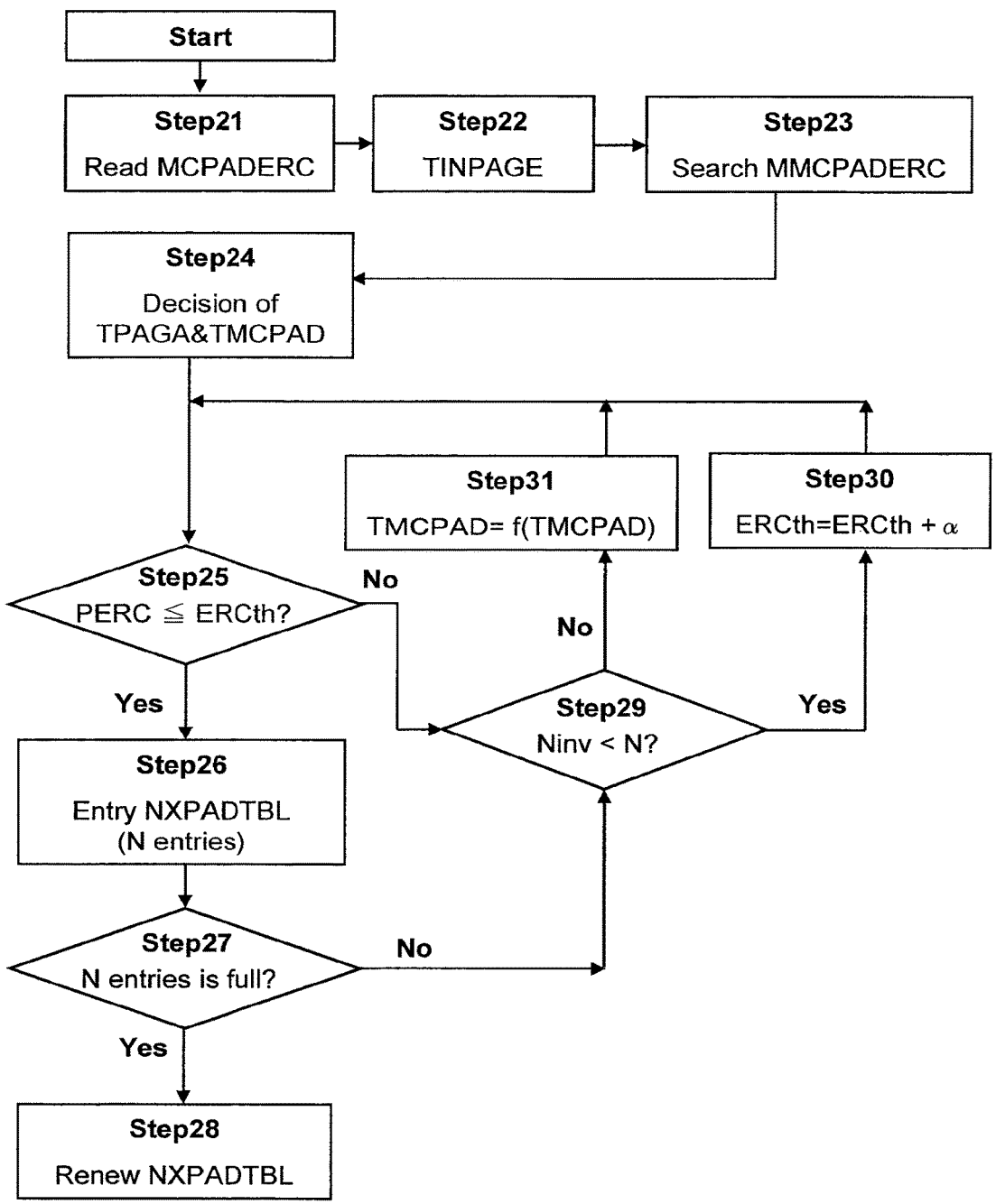
FIG. 20 is a diagram showing an example of a method of updating the write physical address table.

FIG. 20 shows a method of updating the write physical address table NXPADTBL necessary for writing data to the nonvolatile memory with the information processing circuit MANAGER.

As shown in FIG. 11, the information processing circuit MANAGER manages the N/2 addresses from the entry number 0 to the entry number (N/2−1) as the write physical address table NXPADTBL1 and the remaining N/2 addresses from the entry number (N/2) to the entry number N as the write physical address table NXPADTBL2 in the write physical address table NXPADTBL.

In the address range map ADMAP shown in FIG. 15, physical addresses PAD from "00000000" to "027FFFFF" are shown as the physical address region PRNG1, and physical addresses PAD from "02800000" to "07FFFFFF" are shown as the physical address region PRNG2. Accordingly, the range of physical segment addresses SGA in the physical address region PRNG1 is from "0000" to "027F" and the range of physical segment addresses SGA in the physical address region PRNG2 is from "0280" to "07FF".

The information processing circuit MANAGER uses the write physical address table NXPADTBL1 with respect to the physical addresses PAD in the physical address region PRNG1, updates this table, uses the write physical address table NXPADTBL2 with respect to the physical addresses PAD in the physical address region PRNG2, and updates this table.

To update the write physical address table NXPADTBL, physical segment addresses are first determined and physical addresses in the determined physical segment addresses are then determined.

As shown in FIG. 10, in the physical segment table PSEGTBL in the random access memory RAM, the total number TNIPA of physical addresses in the invalid state, the total number TNVPAGE of physical addresses in the valid state, the physical address MCPAD having the smallest value MCPADERC of the erase count in the physical addresses CPAD in the invalid state and the smallest erase count value MCPADERC associated with the physical address MCPAD are stored with respect to each physical segment address SGA.

The information processing circuit MANAGER first reads out, from the random access memory RAM, with respect to each physical segment address SGA, the total number TNIPA of physical addresses in the invalid state, these physical addresses MCPAD and the smallest erase count value MCPADERC (Step 21).

Next, the information processing circuit MANAGER selects, from the physical segment addresses SGA read out from the random access memory RAM, those having the total numbers TNIPAGE of physical addresses in the invalid state larger than the number N of registrations in the write physical address table NXPADTBL (Step 22). The information processing circuit MANAGER compares the smallest erase count values MCPADERC of the selected physical segment addresses SGA and determines the smallest value MMCPADERC in the smallest erase count values MCPADERC (Step 23).

Next, the information processing circuit MANAGER determines the physical segment address SGA and the physical address MCPAD having the smallest value MMCPADERC as a physical segment address TSGAD and a physical address TMCPAD for updating the physical address table NXPADTBL (Step 24).

For existence of the physical segment addresses SGA selected in Step 22, the size of the physical address space may be set larger than the size of the logical address space at least by an amount of addresses with which the write physical address table NXPADTBL can be registered.

Next, the information processing circuit MANAGER reads out from the random access memory RAM the erase count PERC value associated with the physical address TMCPAD in the physical segment address TSGA and compares the erase count PERC value with an erase count threshold ERCth (Step 25). If the erase count PERC value is equal to or smaller than the erase count threshold ERCth, the information processing circuit MANAGER permits write to the current physical address TMCPAD and executes Step 26.

If the erase count PERC value is larger than the erase count threshold ERCth, the information processing circuit MANAGER prohibits write to the current physical address TMCPAD and executes Step 29.

In Step 29, the information processing circuit MANAGER determines whether or not the number Ninv of physical addresses in the invalid state having erase counts equal to or smaller than the erase count threshold ERCth in the current physical segment address is smaller than the number N of addresses with which the write physical address table NXPADTBL can be registered (Ninv<N). If Ninv is smaller than N, the information processing circuit MANAGER executes Step 30. If Ninv is larger than N, the information processing circuit MANAGER executes Step 31.

In Step 31, the information processing circuit MANAGER performs computation on the current physical address TMCPAD, generates a new physical address TMCPAD and again executes Step 25. FIG. 21 shows an example of a method for computation in Step 31. Description will be made of FIG. 21 in a section below.

In Step 30, the information processing circuit MANAGER adds a certain value a to the erase count threshold ERCth to generate a new erase count threshold ERCth, and again executes Step 25.

In Step 26, the information processing circuit MANAGER registers in the write physical address table NXPADTBL the current physical address TMCPPAD and the validity flag PVLD value and the erase count PERC value associated with the physical address PPAD. In the write physical address table NXPADTBL, N sets can be registered. Registrations are made in increasing order of the entry number ENUM. This method, however, is not exclusively used. The number of registered sets in the write physical address table NXPADTBL can be arbitrarily set with the information processing circuit MANAGER. Preferably, the number of registered sets is set to such a number that the speed of writing to the nonvolatile memory devices (NVM10 to NVM17) is maximized.

In Step 27, the information processing circuit MANAGER checks whether or not registration of all the N sets in the write physical address table NXPADTBL is completed. If registration of the N sets is not completed, the information processing circuit MANAGER executes Step 29. If registration of the N sets is completed, the information processing circuit MANAGER finishes updating the write physical address table NXPADTBL (Step 28).

FIG. 22 shows examples of a method of updating the address conversion table LPTBL and a method of updating data in the nonvolatile memory devices when the control circuit STRCT0 writes data to one of the nonvolatile memory devices (NVM10 to NVM17).

The address conversion table LPTBL is a table for converting logical addresses LAD input from the information processing device CPU_CHIP to the control circuit STRCT0 into physical addresses PAD in the nonvolatile memory devices. The address conversion table LPTBL is constituted by the physical addresses CPAD corresponding to the logical addresses LAD and physical address validity flags CVF. The address conversion table LPTBL is stored in the random access memory RAM.

In the nonvolatile memory devices, data DATA associated with the physical addresses PAD, the logical addresses LAD and data validity flags DVF are stored.

FIG. 22 shows in (a) addresses, data and validity flags stored in the address conversion table LPTBL and the nonvolatile memory devices in the time period T1, after write requests WTREQ0, WTREQ1, WTREQ2, and WTREQ3 to the logical address region LRNG1 are input from the information processing device CPU_CHIP to the control circuit STRCT0 at a time subsequent to the time period T0, and after data in these write requests are written to the physical address region PRNG1 in the nonvolatile memory devices.

The write request WTREQ0 includes a logical address LAD value 0, a data write instruction WRT, a sector count SEC value 1 and data DATA0 to be written.

The write request WTREQ1 includes a logical address LAD value 1, a data write instruction WRT, a sector count SEC value 1 and data DATA1 to be written.

The write request WTREQ2 includes a logical address LAD value 2, a data write instruction WRT, a sector count SEC value 1 and data DATA2 to be written.

The write request WTREQ3 includes a logical address LAD value 3, a data write instruction WRT, a sector count SEC value 1 and data DATA3 to be written.

When the write requests WTREQ0, WTREQ1, WTREQ2, and WTREQ3 are input to the control circuit STRCT0, the interface circuit HOST_IF transfers these write requests to the buffer device BUF0.

Next, the information processing circuit MANAGER sequentially reads out the write requests WTREQ0, WTREQ1, WTREQ2, and WTREQ3 stored in the buffer BUF0.

Since the logical address LAD values in the write requests WTREQ0, WTREQ1, WTREQ2, and WTREQ3 are 0, 1, 2, and 3, respectively, the information processing circuit MANAGER reads out the physical address CPAD values and the validity flag CVF values from the logical address LAD Nos. 0, 1, 2, and 3 in the address conversion table LPTBL stored in the random access memory RAM through the memory controller RAMC.

From the initial state in which all the validity flag CVF values read out are 0 as shown in FIG. 12, it can be understood that no physical addresses CPAD are assigned to the logical address LAD Nos. 0, 1, 2, and 3.

Next, the information processing circuit MANAGER generates ECC codes ECC0, ECC1, ECC2, and ECC3 with respect to the data items to be written DATA0, DATA1, DATA2, and DATA3 provided in the write requests WTREQ0, WTREQ1, WTREQ2, and WTREQ3, sets the data items to be written DATA0, DATA1, DATA2, and DATA3 as main data items DArea0, DArea1, DArea2, and DArea3 in accordance with the data format shown in FIG. 14, and generates redundant data items RArea0, RArea1, RArea2, and RArea3 associated with the main data items DArea0, DArea1, DArea2, and DArea3.

The data item WDATA0 to be written to the nonvolatile memory device is constituted by the main data item DArea0 and the redundant data item RArea0. The data item WDATA1 to be written is constituted by the main data item DArea1 and the redundant data item RArea1. The data item WDATA2 to be written is constituted by the main data item DArea2 and the redundant data item RArea2. The data item WDATA3 to be written is constituted by the main data item DArea3 and the redundant data item RArea3.

The information processing circuit MANAGER writes each of the data items to be written WDATA0, WDATA1, WDATA2, and WDATA3 to one physical address in the nonvolatile memory device.

Each of the redundant data items RArea0, RArea1, RArea2, and RArea3 includes the corresponding one of the ECC codes ECC0, ECC1, ECC2, and ECC3 and includes as common values a data inversion flag INVFLG value 0, a write flag WRITFLG value 0, an ECC flag ECCFLG value 0, a state information STATE value 1, a reliability level information RELIABLE value 1, a bad block information BADBLK value 0, a monitor cell information MONITOR value 0, and a reserve region RSV value 0.

Next, the information processing circuit MANAGER reads out the physical address NXPAD values 0, 2, 4, and 6 stored at the entry numbers ENUM 0 to 3 in the write physical address table NXPADTBL1 and assigns the read values to the logical address LAD Nos. 0, 1, 2, and 3.

Further, the information processing circuit MANAGER writes, according to the physical address NXPAD1 values 0, 2, 4, and 6, through the settlement circuit ARB and the memory controllers (NVCT10 to NVCT17), the data to be written WDATA0 including the data DATA0 in the write request WTREQ0, the logical address LAD value 0 and the data validity flag DVF value 1 to the physical address PAD No. 0 in the nonvolatile memory device, the data to be written WDATA1 including the data DATA1 in the write request WTREQ1, the logical address LAD value 1 and the data validity flag DVF value 1 to the physical address PAD No. 2, the data to be written WDATA2 including the data DATA2 in the write request WTREQ2, the logical address LAD value 2 and the data validity flag DVF value 1 to the physical address PAD No. 4, and the data to be written WDATA3 including the data DATA3 in the write request WTREQ3, the logical address LAD value 3 and the data validity flag DVF value 1 to the physical address PAD No. 6.

Finally, the information processing circuit MANAGER writes, through the memory controller RAMC, the physical address NXPAD value 0 and the validity flag CVF value 1 to the logical address LAD No. 0 in the address conversion table LPTBL stored in the random access memory RAM, the physical address NXPAD value 2 and the validity flag CVF value 1 to the logical address LAD No. 1, the physical address NXPAD value 4 and the validity flag CVF value 1 to the logical address LAD No. 2, the physical address NXPAD value 6 and the validity flag CVF value 1 to the logical address LAD No. 3.

FIG. 22 shows in (b) addresses, data and validity flags stored in the address conversion table LPTBL and the nonvolatile memory devices in the time period T2, after write requests WTREQ4, WTREQ5, WTREQ6, WTREQ7, WTREQ8, and WTREQ9 are input from the information processing device CPU_CHIP to the control circuit STRCT0 at a time subsequent to the time period T1, and after data in these write requests are written to the physical address region PRNG1 in the nonvolatile memory devices.

The write request WTREQ4 includes a logical address LAD value 0, a data write instruction WRT, a sector count SEC value 1 and data DATA4 to be written.

The write request WTREQ5 includes a logical address LAD value 1, a data write instruction WRT, a sector count SEC value 1 and data DATA5 to be written.

The write request WTREQ6 includes a logical address LAD value 4, a data write instruction WRT, a sector count SEC value 1 and data DATA6 to be written.

The write request WTREQ7 includes a logical address LAD value 5, a data write instruction WRT, a sector count SEC value 1 and data DATA7 to be written.

The write request WTREQ8 includes a logical address LAD value 2, a data write instruction WRT, a sector count SEC value 1 and data DATA8 to be written.

The write request WTREQ9 includes a logical address LAD value 3, a data write instruction WRT, a sector count SEC value 1 and data DATA9 to be written.

When the write requests WTREQ4, WTREQ5, WTREQ6, WTREQ7, WTREQ8, and WTREQ9 are input to the control circuit STRCT0, the interface circuit HOST_IF transfers these write requests to the buffer BUF0.

Next, the information processing circuit MANAGER sequentially reads out the write requests WTREQ4, WTREQ5, WTREQ6, WTREQ7, WTREQ8, and WTREQ9 stored in the buffer BUF0.

Next, the information processing circuit MANAGER generates ECC codes ECC4, ECC5, ECC6, and ECC7 with respect to the data items to be written DATA4, DATA5, DATA6, and DATA7 provided in the write requests WTREQ4, WTREQ5, WTREQ6, and WTREQ7, sets the data items to be written DATA4, DATA5, DATA6, and DATA7 as main data items DArea4, DArea5, DArea6, and DArea7 in accordance with the data format shown in FIG. 14, and generates redundant data items RArea4, RArea5, RArea6, and RArea7 associated with the main data items DArea4, DArea5, DArea6, and DArea7.

The data item WDATA4 to be written to the nonvolatile memory device is constituted by the main data item DArea4 and the redundant data item RArea4. The data item WDATA5 to be written is constituted by the main data item DArea5 and the redundant data item RArea5. The data item WDATA6 to be written is constituted by the main data item DArea6 and the redundant data item RArea6. The data item WDATA7 to be written is constituted by the main data item DArea7 and the redundant data item RArea7.

The information processing circuit MANAGER writes each of the data items to be written WDATA4, WDATA5, WDATA6, and WDATA7 to one physical address in the nonvolatile memory device.

Each of the redundant data items RArea4, RArea5, RArea6, and RArea7 includes the corresponding one of the ECC codes ECC4, ECC5, ECC6, and ECC7 and includes as common values a data inversion flag INVFLG value 0, a write flag method selection information WRITFLG value 0, an ECC flag ECCFLG value 0, a state information STATE value 1, a reliability level information RELIABLE value 1, a bad block information BADBLK value 0, a monitor cell information MONITOR value 0, and a reserve region RSV value 0.

Next, since the logical address LAD values in the write requests WTREQ4, WTREQ5, WTREQ6, WTREQ7, WTREQ8, and WTREQ9 are 0, 1, 4, 5, 2, and 3, respectively, the information processing circuit MANAGER reads out the physical address CPAD values and the validity flag CVF values from the logical address LAD Nos. 0, 1, 4, 5, 2, and 3 in the address conversion table LPTBL stored in the random access memory RAM through the memory controller RAMC.

The physical address CPAD value at the logical address LAD No. 0 in the address conversion table LPTBL is 0 and the effective flag CVF value is 1. To invalidate the data already written at the physical address PAD No. 0, the validity flag DVF value at the physical address PAD No. 0 is set to 0 (101→111).

The physical address CPAD value at the logical address LAD No. 1 in the address conversion table LPTBL is 2 and the effective flag CVF value is 1. To invalidate the data already written at the physical address PAD No. 1, the validity flag DVF value at the physical address PAD No. 1 is set to 0 (102→112).

The physical address CPAD value at the logical address LAD No. 4 in the address conversion table LPTBL is 0 and the effective flag CVF value is 0. It is understood that no physical address CPAD is assigned to the logical address LAD No. 4.

The physical address CPAD value at the logical address LAD No. 5 in the address conversion table LPTBL is 0 and the effective flag CVF value is 0. It is understood that no physical address CPAD is assigned to the logical address LAD No. 5.

The physical address CPAD value at the logical address LAD No. 2 in the address conversion table LPTBL is 4 and the effective flag CVF value is 1. To invalidate the data already written at the physical address PAD No. 4, the validity flag DVF value at the physical address PAD No. 4 is set to 0 (103→113).

The physical address CPAD value at the logical address LAD No. 3 in the address conversion table LPTBL is 6 and the effective flag CVF value is 1. To invalidate the data already written at the physical address PAD No. 6, the validity flag DVF value at the physical address PAD No. 6 is set to 0 (104→114).

Next, since the logical address LAD values in the write requests WTREQ4, WTREQ5, WTREQ6, WTREQ7, WTREQ8, and WTREQ9 are 0, 1, 4, 5, 2, and 3, respectively, the information processing circuit MANAGER reads out the physical address NXPAD values 8, 10, 12, 14, 16, and 18 stored at the entry numbers ENUM 4 to 9 in the write physical address table NXPADTBL1, and assigns the values to the logical address LAD Nos. 0, 1, 4, 5, 2, and 3.

Further, the information processing circuit MANAGER writes, according to the physical address NXPAD values 8, 10, 12, 14, 16, and 18 through the settlement circuit ARB and the memory controllers (NVCT10 to NVCT17), the data to be written WDATA4 including the data DATA4 in the write request WTREQ4, the logical address LAD value 0 and the data validity flag DVF value 1 to the physical address PAD No. 8 in the nonvolatile memory devices (NVM10-17), the data to be written WDATA5 including the data DATA5 in the write request WTREQ5, the logical address LAD value 1 and the data validity flag DVF value 1 to the physical address PAD No. 10, the data to be written WDATA6 including the data DATA6 in the write request WTREQ6, the logical address LAD value 4 and the data validity flag DVF value 1 to the physical address PAD No. 12, the data to be written WDATA7 including the data DATA7 in the write request WTREQ7, the logical address LAD value 5 and the data validity flag DVF value 1 to the physical address PAD No. 14, the data to be written WDATA8 including the data DATA8 in the write request WTREQ8, the logical address LAD value 2 and the data validity flag DVF value 1 to the physical address PAD No. 16, and the data to be written WDATA9 including the data DATA9 in the write request WTREQ9, the logical address LAD value 3 and the data validity flag DVF value 1 to the physical address PAD No. 18.

FIG. 23 shows examples of a method of updating the address conversion table LPTBL and a method of updating data in the nonvolatile memory devices (NVM10 to NVM17) when the control circuit STRCT0 writes data to the physical address region LRNG2 in one of the nonvolatile memory devices (NVM10 to NVM17).

The address conversion table LPTBL is a table for converting logical addresses LAD input from the information processing device CPU_CHIP to the control circuit STRCT0 into physical addresses PAD in the nonvolatile memory devices. The address conversion table LPTBL is constituted by the physical addresses PAD corresponding to the logical addresses LAD and physical address validity flags CVF. The address conversion table LPTBL is stored in the random access memory RAM.

In the nonvolatile memory devices, data DATA associated with the physical addresses PAD, the logical addresses LAD and data validity flags DVF are stored.

FIG. 23 shows in (a) addresses, data and validity flags stored in the address conversion table LPTBL and the nonvolatile memory devices in the time period T1, after write requests WTREQ0, WTREQ1, WTREQ2, and WTREQ3 to the logical address region LRNG2 are input from the information processing device CPU_CHIP to the control circuit STRCT0 at a time subsequent to the time period T0, and after data in these write requests are written to the physical address region PRNG2 in the nonvolatile memory devices.

The write request WTREQ0 includes a logical address LAD value "800000" in hexadecimal notation, a data write instruction WRT, a sector count SEC value 1 and data DATA0 to be written.

The write request WTREQ1 includes a logical address LAD value "800001" in hexadecimal notation, a data write instruction WRT, a sector count SEC value 1 and data DATA1 to be written.

The write request WTREQ2 includes a logical address LAD value "800002" in hexadecimal notation, a data write instruction WRT, a sector count SEC value 1 and data DATA2 to be written.

The write request WTREQ3 includes a logical address LAD value "800003" in hexadecimal notation, a data write instruction WRT, a sector count SEC value 1 and data DATA3 to be written.

When the write requests WTREQ0, WTREQ1, WTREQ2, and WTREQ3 are input to the control circuit STRCT0, the interface circuit HOST_IF transfers these write requests to the buffer BUF0.

Next, the information processing circuit MANAGER sequentially reads out the write requests WTREQ0, WTREQ1, WTREQ2, and WTREQ3 stored in the buffer BUF0.

Since the logical address LAD values in the write requests WTREQ0, WTREQ1, WTREQ2, and WTREQ3 are 0, 1, 2, and 3, respectively, the information processing circuit MANAGER reads out the physical address CPAD values and the validity flag CVF values from the logical address LAD Nos. "800000", "800001", "800002", and "800003" in the address conversion table LPTBL stored in the random access memory RAM through the memory controller device RAMC.

From the initial state in which all the validity flag CVF values read out are 0 as shown in FIG. 12, it can be understood that no physical addresses CPAD are assigned to the logical address LAD Nos. "800000", "800001", "800002", and "800003".

Next, the information processing circuit MANAGER generates ECC codes ECC0, ECC1, ECC2, and ECC3 with respect to the data items to be written DATA0, DATA1, DATA2, and DATA3 provided in the write requests WTREQ0, WTREQ1, WTREQ2, and WTREQ3, sets the data items to be written DATA0, DATA1, DATA2, and DATA3 as main data items DArea0, DArea1, DArea2, and DArea3 in accordance with the data format shown in FIG. 14, and generates redundant data items RArea0, RArea1, RArea2, and RArea3 associated with the main data items DArea0, DArea1, DArea2, and DArea3.

The data item WDATA0 to be written to the nonvolatile memory device is constituted by the main data item DArea0 and the redundant data item RArea0. The data item WDATA1 to be written is constituted by the main data item DArea0 and the redundant data item RArea1. The data item WDATA2 to be written is constituted by the main data item DArea2 and the redundant data item RArea2. The data item WDATA3 to be written is constituted by the main data item DArea3 and the redundant data item RArea3.

The information processing circuit MANAGER writes each of the data items to be written WDATA0, WDATA1, WDATA2, and WDATA3 to one physical address in the nonvolatile memory device.

Each of the redundant data items RArea0, RArea1, RArea2, and RArea3 includes the corresponding one of the ECC codes ECC0, ECC1, ECC2, and ECC3 and includes as common values a data inversion flag INVFLG value 0, a write flag WRITFLG value 0, an ECC flag ECCFLG value 0, a state information STATE value 1, a reliability level information RELIABLE value 0, a bad block information BADBLK value 0, a monitor cell information MONITOR value 0, and a reserve region RSV value 0.

Next, the information processing circuit MANAGER reads out the physical address NXPAD values 2800000, 2800001, 2800002, and 2800003 stored at the entry numbers ENUM 16 to 19 in the write physical address table NXPADTBL2 and assigns the read values to the logical address LAD Nos. "800000", "800001", "800002", and "800003".

Further, the information processing circuit MANAGER writes, according to the physical address NXPAD1 values 2800000, 2800001, 2800002, and 2800003, through the settlement circuit ARB and the memory controllers (NVCT10 to NVCT17), the data to be written WDATA0 including the data DATA0 in the write request WTREQ0, the logical address LAD value 800000 and the data validity flag DVF value 1 to the physical address PAD No. "2800000" in the nonvolatile memory device, the data to be written WDATA1 including the data DATA1 in the write request WTREQ1, the logical address LAD value 800001 and the data validity flag DVF value 1 to the physical address PAD No. "2800001", the data to be written WDATA2 including the data DATA2 in the write request WTREQ2, the logical address LAD value 800002 and the data validity flag DVF value 1 to the physical address PAD No. "2800002", and the data to be written WDATA3 including the data DATA3 in the write request WTREQ3, the logical address LAD value 800003 and the data validity flag DVF value 1 to the physical address PAD No. "2800003".

Finally, the information processing circuit MANAGER writes, through the memory controller RAMC, the physical address NXPAD value 2800000 and the validity flag CVF value 1 to the logical address LAD No. "800000" in the address conversion table LPTBL stored in the random access memory RAM, the physical address NXPAD value 2800001 and the validity flag CVF value 1 to the logical address LAD No. "800001", the physical address NXPAD value 2800002 and the validity flag CVF value 1 to the logical address LAD No. "800002", the physical address NXPAD value 2800003 and the validity flag CVF value 1 to the logical address LAD No. "800003".

FIG. 23 shows in (b) addresses, data and validity flags stored in the address conversion table LPTBL and the nonvolatile memory devices in the time period T2, after write requests WTREQ4, WTREQ5, WTREQ6, WTREQ7, WTREQ8, and WTREQ9 are input from the information processing device CPU_CHIP to the control circuit STRCT0 at a time subsequent to the time period T1, and after data in these write requests are written to the physical address region PRNG2 in the nonvolatile memory devices.

The write request WTREQ4 includes a logical address LAD value 800000, a data write instruction WRT, a sector count SEC value 1 and data DATA4 to be written. The write request WTREQ5 includes a logical address LAD value 800001, a data write instruction WRT, a sector count SEC value 1 and data DATA5 to be written. The write request WTREQ6 includes a logical address LAD value 800004, a data write instruction WRT, a sector count SEC value 1 and data DATA6 to be written. The write request WTREQ7 includes a logical address LAD value 800005, a data write instruction WRT, a sector count SEC value 1 and data DATA7 to be written. The write request WTREQ8 includes a logical address LAD value 800002, a data write instruction WRT, a sector count SEC value 1 and data DATA8 to be written. The write request WTREQ9 includes a logical address LAD value 800003, a data write instruction WRT, a sector count SEC value 1 and data DATA9 to be written.

When the write requests WTREQ4, WTREQ5, WTREQ6, WTREQ7, WTREQ8, and WTREQ9 are input to the control circuit STRCT0, the interface circuit HOST_IF transfers these write requests to the buffer BUF0.

Next, the information processing circuit MANAGER sequentially reads out the write requests WTREQ4, WTREQ5, WTREQ6, WTREQ7, WTREQ8, and WTREQ9 stored in the buffer BUF0.

Next, the information processing circuit MANAGER generates ECC codes ECC4, ECC5, ECC6, and ECC7 with respect to the data items to be written DATA4, DATA5, DATA6, and DATA7 provided in the write requests WTREQ4, WTREQ5, WTREQ6, and WTREQ7, sets the data items to be written DATA4, DATA5, DATA6, and DATA7 as main data items DArea4, DArea5, DArea6, and DArea7 in accordance with the data format shown in FIG. 14, and generates redundant data items RArea4, RArea5, RArea6, and RArea7 associated with the main data items DArea4, DArea5, DArea6, and DArea7.

The data item WDATA4 to be written to the nonvolatile memory device is constituted by the main data item DArea4 and the redundant data item RArea4. The data item WDATA5 to be written is constituted by the main data item DArea5 and the redundant data item RArea5. The data item WDATA6 to be written is constituted by the main data item DArea6 and the redundant data item RArea6. The data item WDATA7 to be written is constituted by the main data item DArea7 and the redundant data item RArea7.

The information processing circuit MANAGER writes each of the data items to be written WDATA4, WDATA5, WDATA6, and WDATA7 to one physical address in the nonvolatile memory device.

Each of the redundant data items RArea4, RArea5, RArea6, and RArea7 includes the corresponding one of the ECC codes ECC4, ECC5, ECC6, and ECC7 and includes as common values a data inversion flag INVFLG value 0, a write flag WRITFLG value 0, an ECC flag ECCFLG value 0, a state information STATE value 1, a reliability level information RELIABLE value 0, a bad block information BADBLK value 0, a monitor cell information MONITOR value 0, and a reserve region RSV value 0.

Next, since the logical address LAD values in the write requests WTREQ4, WTREQ5, WTREQ6, WTREQ7, WTREQ8, and WTREQ9 are 800000, 800001, 800004, 800005, 800002, and 800003, respectively, the information processing circuit MANAGER reads out the physical address CPAD values and the validity flag CVF values from the logical address LAD Nos. "800000", "800001", "800004", "800005", "800002", and "800003" in the address conversion table LPTBL stored in the random access memory RAM through the memory controller RAMC.

The physical address CPAD value at the logical address LAD No. "800000" in the address conversion table LPTBL is 2800000 and the effective flag CVF value is 1. To invalidate the data already written at the physical address PAD No. 0, the validity flag DVF value at the physical address PAD No. "800000" is set to 0 (201→211).

The physical address CPAD value at the logical address LAD No. "800001" in the address conversion table LPTBL is 2800001 and the effective flag CVF value is 1. To invalidate the data already written at the physical address PAD No. "800001", the validity flag DVF value at the physical address PAD No. "2800001" is set to 0 (202→212).

The physical address CPAD value at the logical address LAD No. "800004" in the address conversion table LPTBL is 0 and the effective flag CVF value is 0. It is understood that no physical address CPAD is assigned to the logical address LAD No. "800004".

The physical address CPAD value at the logical address LAD No. "800005" in the address conversion table LPTBL is 0 and the effective flag CVF value is 0. It is understood that no physical address CPAD is assigned to the logical address LAD No. "800005".

The physical address CPAD value at the logical address LAD No. "800002" in the address conversion table LPTBL is 2800002 and the effective flag CVF value is 1. To invalidate the data already written at the physical address PAD No. "2800002", the validity flag DVF value at the physical address PAD4 is set to 0 (203→213).

The physical address CPAD value at the logical address LAD No. "800003" in the address conversion table LPTBL is 2800003 and the effective flag CVF value is 1. To invalidate the data already written at the physical address PAD No. "2800003", the validity flag DVF value at the physical address PAD No. "2800003" is set to 0 (204→214).

Next, since the logical address LAD values in the write requests WTREQ4, WTREQ5, WTREQ6, WTREQ7, WTREQ8, and WTREQ9 are 800000, 800001, 800004, 800005, 800002, and 800003, respectively, the information processing circuit MANAGER reads out the physical address NXPAD values 2800004, 2800005, 2800006, 2800007, 2800008, and 2800009 stored at the entry numbers ENUM 20 to 25 in the write physical address table NXPADTBL2, and assigns the values to the logical address LAD Nos. "800000", "800001", "800004", "800005", "800002", and "800003".

Further, the information processing circuit MANAGER writes, according to the physical address NXPAD values 2800004, 2800005, 2800006, 2800007, 2800008, and 2800009 through the settlement circuit ARB and the memory controllers (NVCT10 to NVCT17), the data to be written WDATA4 including the data DATA4 in the write request WTREQ4, the logical address LAD value 800000 and the data validity flag DVF value 1 to the physical address PAD No. "2800004" in the nonvolatile memory device (NVM10-17), the data to be written WDATA5 including the data DATA5 in the write request WTREQ5, the logical address LAD value 800001 and the data validity flag DVF value 1 to the physical address PAD No. "2800005", the data to be written WDATA6 including the data DATA6 in the write request WTREQ6, the logical address LAD value 800004 and the data validity flag DVF value 1 to the physical address PAD No. "2800006", the data to be written WDATA7 including the data DATA7 in the write request WTREQ7, the logical address LAD value 800005 and the data validity flag DVF value 1 to the physical address PAD No. "2800007", the data to be written WDATA8 including the data DATA8 in the write request WTREQ8, the logical address LAD value 800002 and the data validity flag DVF value 1 to the physical address PAD No. "2800008", and the data to be written WDATA9 including the data DATA9 in the write request WTREQ9, the logical address LAD value 800003 and the data validity flag DVF value 1 to the physical address PAD No. "2800009".

Figure 24:
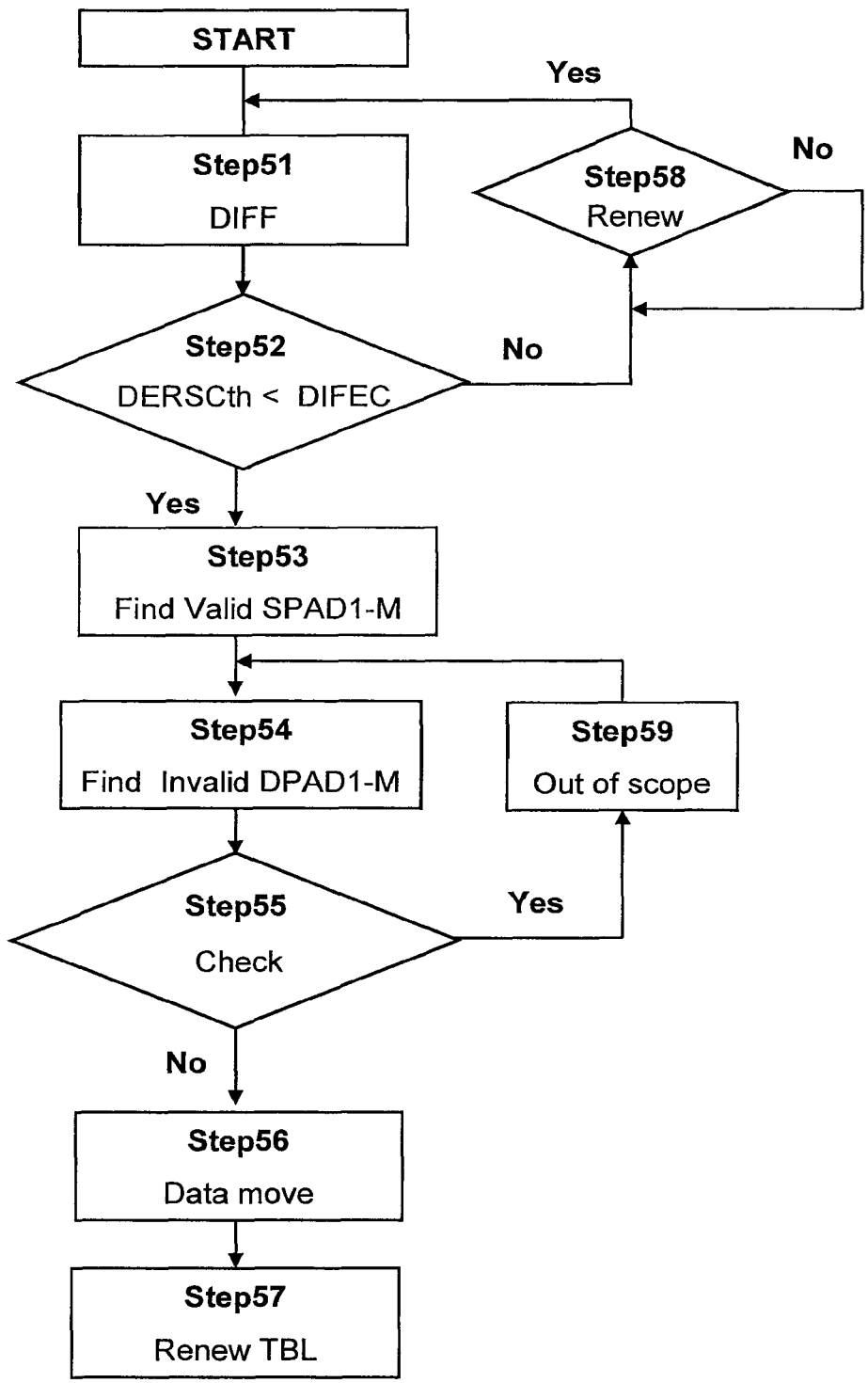
FIG. 24 is a diagram showing an example of an operation to move data between physical addresses according to the present invention.

FIG. 24 shows another method of reducing the unevenness of the data erase counts and leveling the data erase counts with respect to the physical addresses in the phase-change memory, carried out by the information processing circuit MANAGER.

As shown in FIG. 11, the information processing circuit MANAGER manages the N/2 addresses from the entry number 0 to the entry number (N/2−1) as the write physical address table NXPADTBL1 and the remaining N/2 addresses from the entry number (N/2) to the entry number N as the write physical address table NXPADTBL2 in the write physical address table NXPADTBL.

The method of leveling the erase counts with respect to physical addresses, described above with reference to FIGS. 19 and 20, is a method of dynamically leveling the erase counts with respect to physical addresses in the invalid state. In this method of dynamically leveling the erase counts, there is a possibility of the difference between the erase counts with respect to physical addresses in the invalid state and the erase counts with respect to physical addresses in the valid state being increased. Therefore, a method of statically leveling the erase counts so that the unevenness of the erase counts with respect to physical addresses in the invalid state and the erase counts with respect to physical addresses in the valid state is reduced will be described with reference to FIG. 24.

In the address range map ADMAP shown in FIG. 15, physical addresses PAD from "00000000" to "027FFFFF" are shown as the physical address region PRNG1, and physical addresses PAD from "02800000" to "07FFFFFF" are shown as the physical address region PRNG2. Accordingly, the range of physical segment addresses SGA in the physical address region PRNG1 is from "0000" to "027F" and the range of physical segment addresses SGA in the physical address region PRNG2 is from "0280" to "07FF".

The information processing circuit MANAGER carries out the method of statically leveling the erase counts shown in FIG. 24 in each of the physical address region PRNG1 and the physical address region PRNG2.

The information processing circuit MANAGER performs in Step 51 an operation described below. In Step 51, the information processing circuit MANAGER obtains the difference DIFEC (=MXIVERC−MNVLERC) between the largest value MXIVERC in the largest erase count MXERC with respect to the invalid physical addresses in the physical segment table PSEGTBL1 shown in FIG. 10 and the smallest value MNVLERC in the smallest erase count MNERC with respect to the valid physical addresses in the physical segment table PSEGTBL2.

In the next Step 52, the information processing circuit MANAGER sets a threshold DERCth of the difference between the erase counts with respect to the physical addresses in the invalid state and the erase counts with respect to the physical addresses in the valid state, and compares this threshold DERCth and the erase count difference DIFEC.

If the erase count difference DIFEC is larger than the threshold DERCth, the information processing circuit MANAGER executes Step 53 to perform leveling of the erase counts. If the erase count difference DIFEC is smaller than the threshold DERCth, the information processing circuit MANAGER performs Step 58.

In Step 58, the information processing circuit MANAGER determines whether or not the physical segment table PSEGTBL1 or PSEGTBL2 is updated. If at least one of the physical segment tables is updated, the information processing circuit MANAGER again obtained the erase count difference DIFEC in Step 51. If neither of the physical segment tables is updated, the information processing circuit MANAGER again performs Step 58.

In Step 53, the information processing circuit MANAGER selects M number of physical addresses SPAD1 to SPADM in increasing order of erase count from the smallest of the smallest erase count MNERC with respect to the valid physical addresses in the physical segment table PSEGTBL2.

In Step 54, the information processing circuit MANAGER selects M number of physical addresses DPAD1 to DPADM in increasing order of erase count from the smallest of the largest erase count MXERC with respect to the invalid physical addresses in the physical segment table PSEGTBL1.

In Step 55, the information processing circuit MANAGER checks whether or not the selected physical addresses DPAD1 to DPADM are registered in the write physical address table NXPADTBL. If the selected physical addresses DPAD1 to DPADM are registered in the write physical address table NXPADTBL, the information processing circuit MANAGER removes the presently selected physical addresses DPAD1 to DPADM from candidates for physical addresses having the smallest value MXNERC and again performs Step 54. If the selected physical addresses DPAD1 to DPADM are not registered in the write physical address table NXPADTBL, the information processing circuit MANAGER performs Step 56.

In Step 56, the information processing circuit MANAGER moves the data at the physical addresses SPAD1 to SPADM to the physical addresses DPAD1 to DPADM.

In Step 57, the information processing circuit MANAGER updates all the tables that need updating as a result of moving the data at the physical addresses SPAD1 to SPADM to the physical addresses DPAD1 to DPADM.

An example of moving data at M physical addresses has been described. However, the value of M is programmable by the information processing circuit MANAGER according to the target performance. Preferably, M is set so that 1≤M≤N where N is the number N of registrations in the write physical address table NXPADTBL.

<Pipeline Writing Operation>

Figure 25:
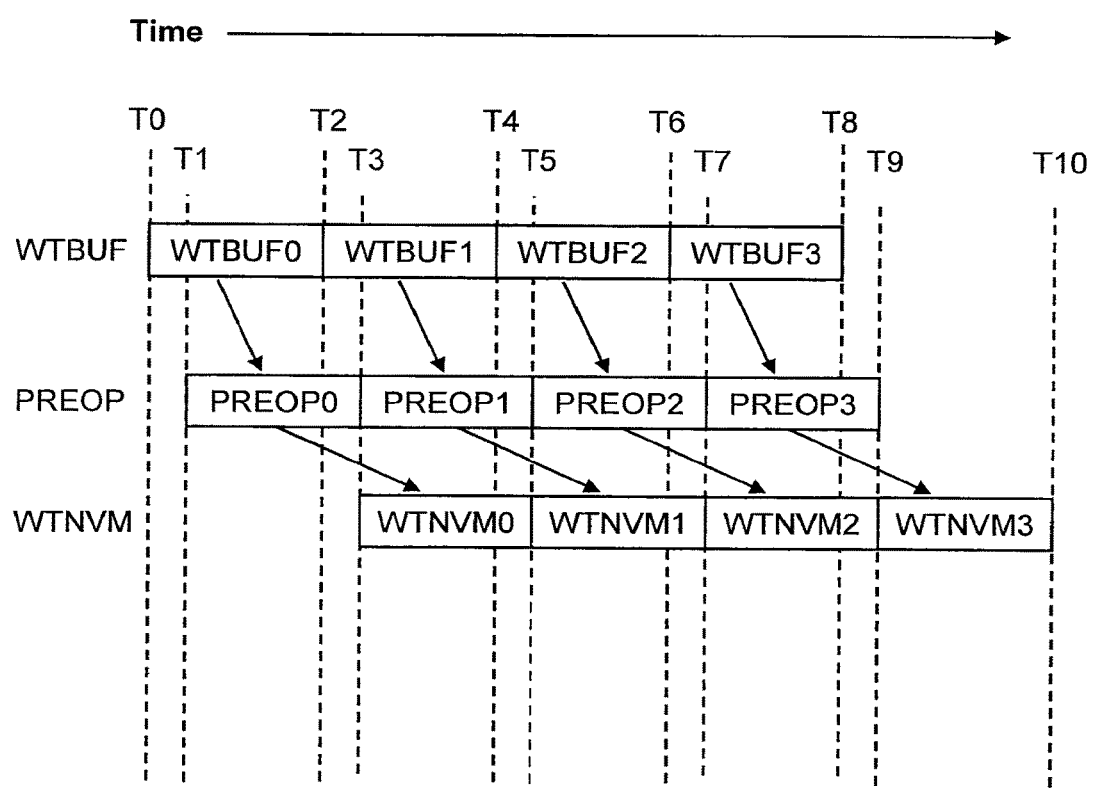
FIG. 25 is a diagram showing an example of a pipeline writing operation according to the present invention.

FIG. 25 shows an example of a data write operation executed in a pipeline manner in the memory module NVMSTR0 when write requests from the information processing device CPU_CHIP to the memory module NVMSTR0 occur successively. N×512 bytes of data can be stored in each of the buffers BUF0 to BUF3 in the control circuit STRCT0. However, storage of data in the buffers is not limited to this.

Buffer transfer operations WTBUF0, WTBUF1, WTBUF2, and WTBUF3 are operations for transferring write requests WTREQ to the buffers BUF0, BUF1, BUF2, and BUF3; preparatory operations PREOP0, PREOP1, PREOP2, and PREOP3 are preparatory operations for writing to the nonvolatile memory devices NVM data to be written transferred to the buffers BUF0, BUF1, BUF2, and BUF3; and data write operations WTNVM0, WTNVM1, WTNVM2, and WTNVM3 are operations for writing to the nonvolatile memory devices NVM the data to be written stored in the buffers BUF0, BUF1, BUF2, and BUF3.

Pipeline operations can be realized by the control circuit STRCT0 between the buffer transfer operations WTBUF0, WTBUF1, WTBUF2, and WTBUF3, the preparatory operations PREOP0, PREOP1, PREOP2, and PREOP3 and the data write operations WTNVM0, WTNVM1, WTNVM2, and WTNVM3 to increase the write speed.

N write requests WTREQ(1) to WTREQ(N) that occur in the time periods T0 to T2 are first transferred from the interface circuit HOST_IF to the buffer BUF0 (WTBUF0). After it become impossible to further store data to be written in the buffer BUF0, N write requests WTREQ(N+1) to WTREQ(2N) that occur in the time periods T2 to T4 are transferred to the buffer BUF1 (WTBUF1).

After it become impossible to further store data to be written in the buffer BUF1, N write requests WTREQ(2N+1) to WTREQ(3N) that occur in the time periods T4 to T6 are transferred to the buffer BUF2 (WTBUF2).

After it become impossible to further store data to be written in the buffer BUF2, N write requests WTREQ(3N+1) to WTREQ(4N) that occur in the time periods T6 to T8 are transferred to the buffer BUF3 (WTBUF3).

In the time periods T1 to T3, the information processing circuit MANAGER makes preparations (PREOP0) for writing the data to be written stored in the buffer BUF0 to the nonvolatile memory devices NVM. Details of the operation to make preparations (PREOP0), performed by the information processing circuit MANAGER, are as shown below.
(1) To read out physical addresses PAD from the address conversion table LPTBL by using logical address LAD values included in the write requests WTREQ(1) to WTREQ(N), and invalidate data by setting the validity flag DVLD values associated with the physical addresses PAD to 0 as required.
(2) To update the address conversion table LPTBL.
(3) To read out physical addresses PAD from the address conversion table LPTBL by using logical address LAD values included in the write requests WTREQ(1) to WTREQ(N), and invalidate data by setting the validity flag DVLD values associated with the physical addresses PAD to 0 as required.
(4) To update the address conversion table LPTBL.
(5) To read out physical addresses NXPAD stored in the write physical address table NXPADTBL, and assign the logical addresses LAD included in the rite requests WTREQ(1) to WTREQ(N) to the physical addresses NXPAD.
(6) To update the physical segment table PSEGTBL.
(7) To update the physical address table PADTBL
(8) To update the write physical address table NXPADTBL to prepare for the next write.

The other preparation operations PREOP1, PREOP2, and PREOP3 are also performed in the same way as the preparation operation PREOP0.

Next, in the time periods from T3 to T5, the information processing circuit MANAGER writes to the nonvolatile memory devices NVM the data to be written stored in the buffer BUF0 (WTNVM0). The physical addresses in the nonvolatile memory devices NVM to which the data has been written are equal to the physical address NAPAD values obtained by (4) described above.

The other data write operations WTNVM1, WTNVM2, and WTNVM3 are also performed in the same way as the data write operation WTNVM0.

[Readout Operation]

Figure 26:
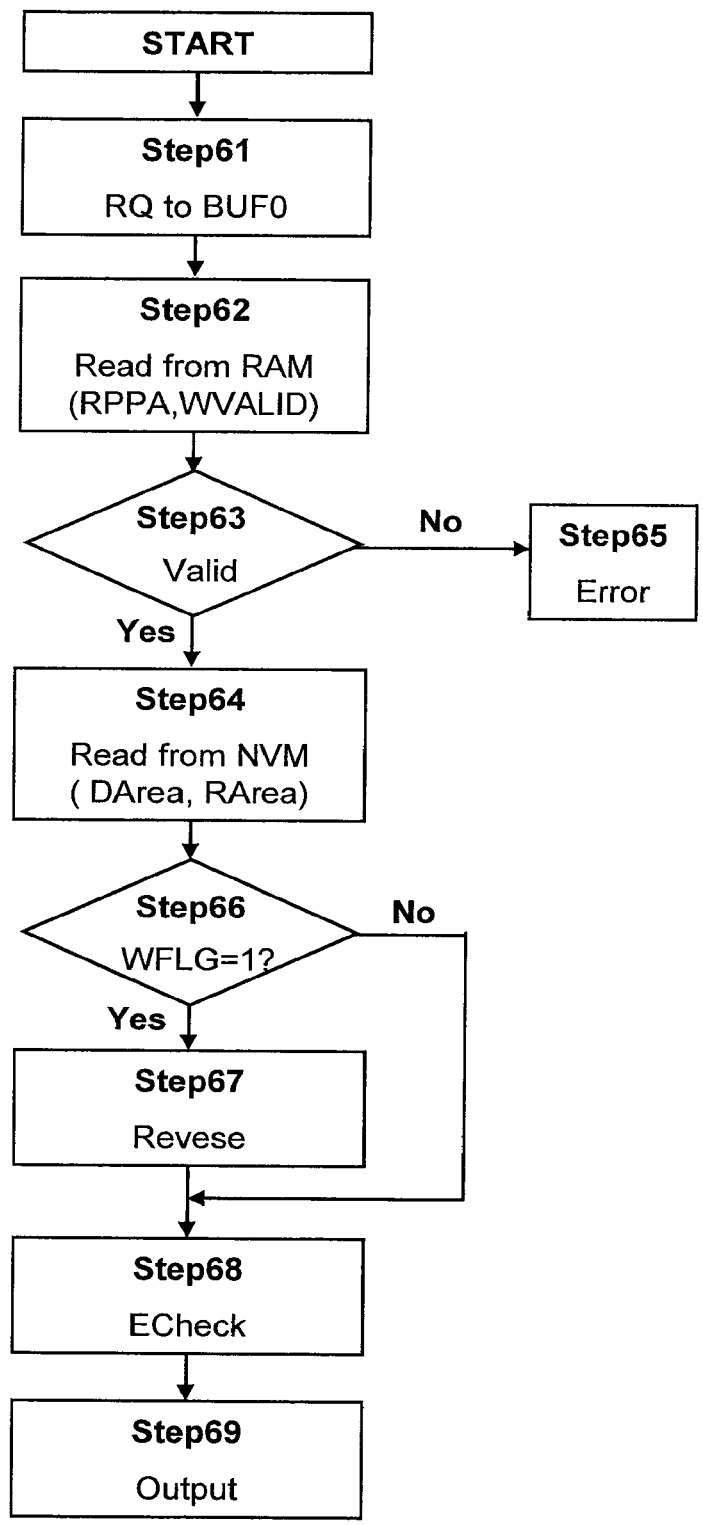
FIG. 26 is a diagram showing an example of a data readout operation in the memory module according to the present invention.

FIG. 26 shows an example of the data readout operation performed by the memory module NVMSTRR0 when a read request RDREQ01 is input from the information processing device CPU_CHIP to the memory module NVMSTRR0.

When the read request RDREQ01 including a logical address value LAD0, a data read instruction RD and a sector count value SEC1 is input from the information processing device CPU_CHIP to the control circuit STRCT0, the interface circuit HOST_IF takes out clock information inserted in the write request WTREQ01, converts the read request RDREQ01 provided in the form of serial data into parallel data and transfers this data to the buffer BUF0 and the information processing circuit MANAGER (Step 61).

Next, the information processing circuit MANAGER deciphers the logical address value LAD0, the data read instruction RD and the sector count SECT and reads out the physical address value CPAD0 stored at the address LAD No. 0 and the validity flag CVF value associated with the physical address value CPAD0 in the address conversion table LPTBL stored in the random access memory RAM (Step 62). The information processing circuit MANAGER then checks whether or not the validity flag CVF value read out is 1 (Step 63).

If the validity flag CVF value is 0, it indicates that no physical address CPAD is assigned to the logical address LAD0, and no data can be read out from the nonvolatile memory devices NVM. Therefore the information processing circuit MANAGER informs the information processing device CPU_CHIP through the interface circuit HOST_IF that an error has occurred (Step 65).

If the validity flag CVF value is 1, it indicates that the physical address CPAD0 is associated with the logical address LAD0. Therefore the information processing circuit MANAGER reads out data RDATA0 from the address CPAD0 in the nonvolatile memory devices (NVM10 to NVM17) through the settlement circuit ARB and the memory controllers (NVCT10 to NVCT17). The data RDATA0 includes main data DArea0 and redundant data RArea0, and the redundant data RArea0 includes write method selection information WRTFLG and an ECC code ECC0 (Step 64).

Next, the information processing circuit MANAGER reads out the logical address region LRNG in the SSD configuration information SDCFG stored in the nonvolatile memory NVM0 and the write method selection information WRTFLG associated with the logical address region LRNG, examines to which logical address region LRNG the logical address value LAD0 belongs, and obtains the write method selection information WRTFLG associated with the logical address region. Further, the information processing circuit MANAGER checks whether or not the write method selection information WRTFLG value is 1 (Step 66).

If the write method selection information WRTFLG value is 1, the information processing circuit MANAGER produces main data IDArea0 and the ECC code IECC0 by inverting the bits of the main data DArea0 and the ECC code ECC0 (Step 67).

Next, the information processing circuit MANAGER checks whether or not there is any error in the main data IDArea0 by using the ECC code IECC0. If there is an error, the information processing circuit MANAGER corrects the error (Step 68) and transfers the data to the information processing device CPU_CHIP through the interface circuit HOST_IF (Step 69).

If the write method selection information WRTFLG value is not 1, the information processing circuit MANAGER checks whether or not there is any error in the main data DArea0 by using the ECC code ECC0. If there is an error in the main data DArea0, the information processing circuit MANAGER corrects the error (Step 68) and transfers the data to the information processing device CPU_CHIP through the interface circuit HOST_IF (Step 69).

<Write Method>

A write method selected through the write method selection information WRTFLG in the SSD configuration information shown in (b) of FIG. 13 will be described with reference to FIG. 27.

Referring to (b) of FIG. 13, the write method selection information WRTFLG with respect to the logical address region LRNG1 is set to 0 while the write method selection information WRTFLG with respect to the logical address region LRNG2 is set to 1.

The memory cell in the set state represents bit data "0" while the memory cell in the reset state represents bit data "1". However, the relationship between 0/1 and the state of the memory cell is not particularly limited to this.

When a write request WTREQ01 including a logical address value LAD, a data write instruction WRT, a sector count value SEC 1 and 512 bytes of data DATA0 to be written is input from the information processing device CPU_CHIP to the information processing circuit MANAGER through the interface circuit HOST_IF (Step 71), the information processing circuit MANAGER determines, by using the address range map ADMAP stored in the random access memory RAM, whether the logical address value LAD is a logical address value in the logical address region LRNG1 or a logical address value in the logical address region LRNG2, and checks the write method selection information WRTFLG with respect to the logical address regions LRNG1 and LRNG2 (Step 72).

If the logical address LAD included in the write request ETREQ01 is a logical address LAD in the logical address region LRNG1, the data DATA0 to be written and the redundant data RArea0 associated with the data DATA0 to be written are written to the write-permitted cells indicated by ◎ in the physical address region PRNG1 shown in FIG. 16 since the write method selection information WRTFLG with respect to the logical address regions LRNG1 is set to 0 (Step 76).

If the logical address LAD included in the write request ETREQ01 is a logical address value in the logical address region LRNG2, Steps 73 to 76 are executed since the write method selection information WRTFLG with respect to the logical address regions LRNG2 is set to 1.

The information processing circuit MANAGER counts, in Step 73, bit data "0" and bit data "1" in the 512 bytes (512×8 bits) of data to be written (Step 73), and compares the number of bit data "0" items and the number of bit data "1" items (Step 74).

If the number of bit data "1" items is larger than the number of bit data "0" items, the information processing circuit MANAGER inverts each bit of the data DATA0 to be written (Step 75) and writes the data to the write-permitted cells indicated by ◎ in the physical address region PRNG2 shown in FIG. 16 (Step 76).

By inverting each bit of the data DATA0 to be written, the number of bit data "1" items is always made equal to or smaller than 2048 bits (=4096/2) in 512 bytes (512×8 bits).

To write 512 bytes (512×8 bits) of data to the memory cells, the memory cells for 512 bytes (512×8 bits) are temporarily set (erased with bit data "0") and the necessary cells are thereafter rewritten to the reset state (written with bit data "1").

By inverting each bit of the data to be written, the number of bit data "1" items in the data to be written is always set to ½ or less, thus enabling reducing the amount of data to be written to half.

As a result, bit data "1" can be written on alternate ones of the memory cells indicated by ◎ in the physical address region PRNG2 shown in FIG. 16, thereby reducing the influence of a thermal history of Joule heat on the memory cells at the time of data writing and providing a highly reliable long-life SSD.

Figure 27:
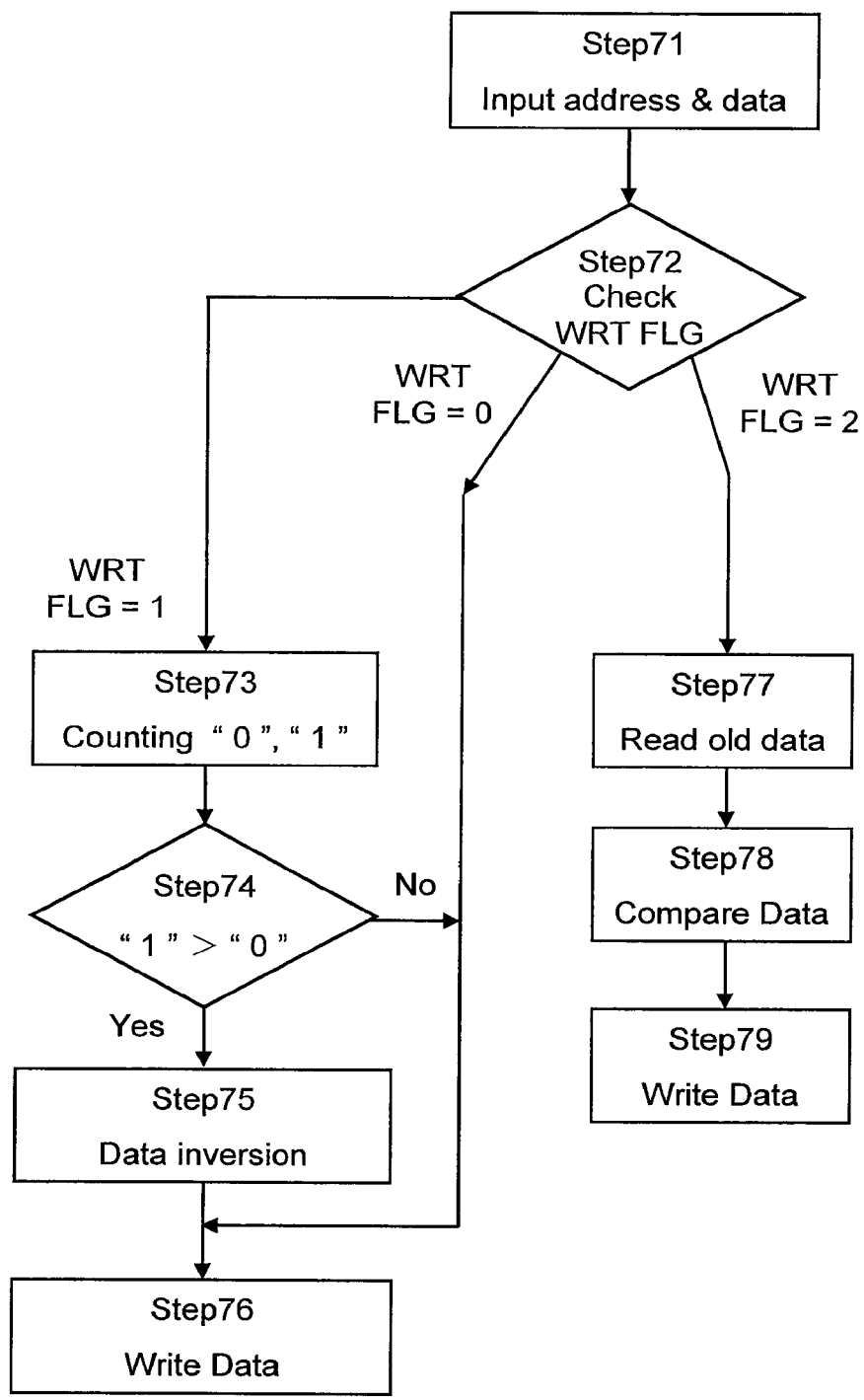
FIG. 27 is a diagram showing an example of a write method selected through write method selection information.
Figure 28:
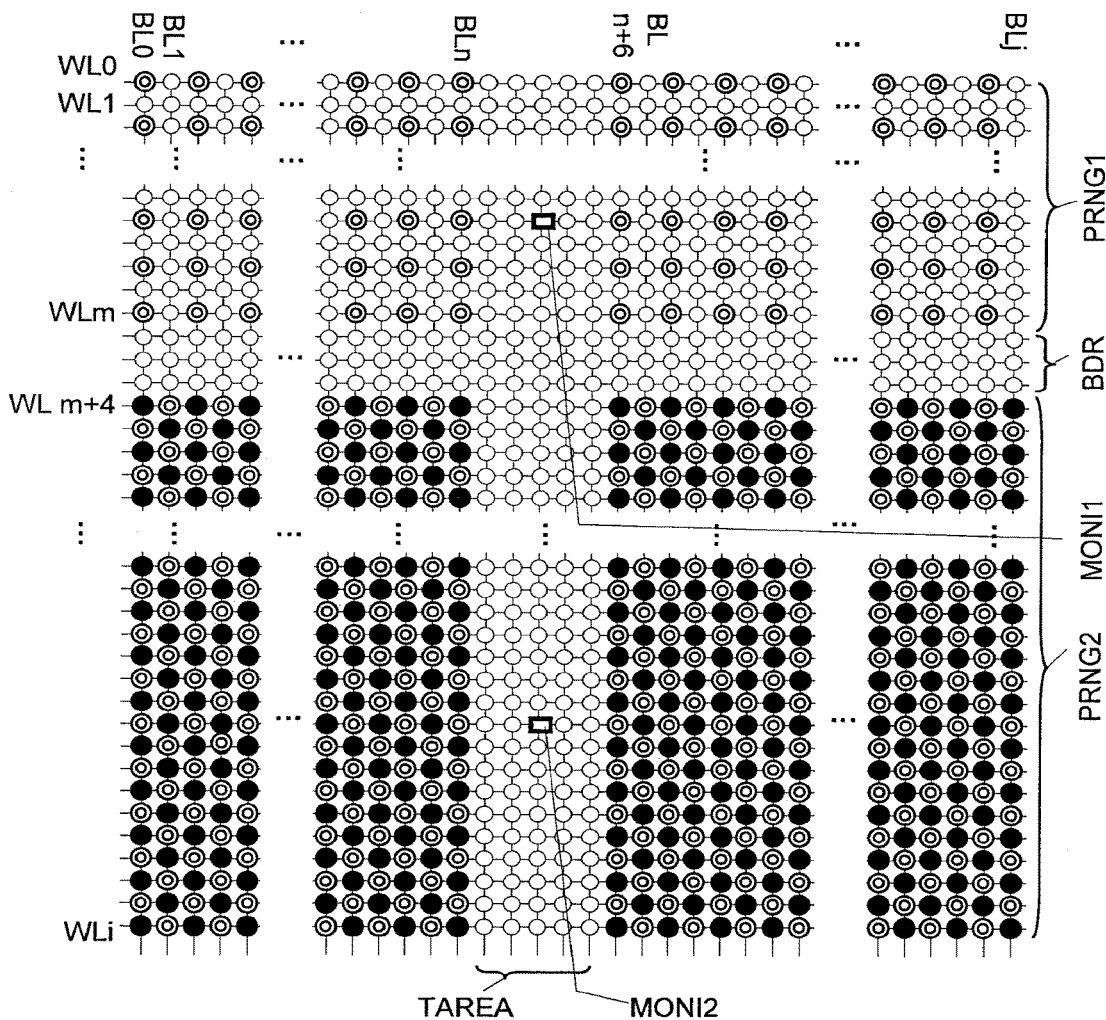
FIG. 28 is a diagram showing an example of writing of data to the memory cell array in the nonvolatile memory device.

FIG. 28 shows an example of use of one of the memory cell arrays ARY in the nonvolatile memory devices when data is written to the memory cells in the physical address region PRNG2 by the write method described above with reference to FIG. 27 with respect to a case where the write method selection information WRTFLG is 1.

The points of intersection of the word lines WL0 to WLi and the bit lines BL0 to BLj represent the memory cells. ◎ denotes first write-permitted ones of the memory cells to which data is written. TAREA denotes a continuous memory cell region for testing. □ denotes the memory cells MONI1 and MONI2 for monitoring.

● denotes bit data "1" written by the write method described above with reference to FIG. 27 with respect to a case where the write method selection information WRTFLG is 1.

As shown in FIG. 28, bit "1" data is written in a staggered fashion to the write-permitted memory cells indicated by ◎ in the physical address region PRNG2, thereby enabling reducing the influence of a thermal history of Joule heat on the memory cell and providing a highly reliable long-life information processor without changing the effective memory capacity.

Referring again to FIG. 27, if the write method selection information WRTFLG is 2, data is read out from the designated region (Step 77) and is thereafter compared with the data to be written on a bit-by-bit basis (Step 78), and rewriting is executed only on the data to be changed by rewriting, i.e., the data found to be different from the data to be written (Step 79).

Figure 29:
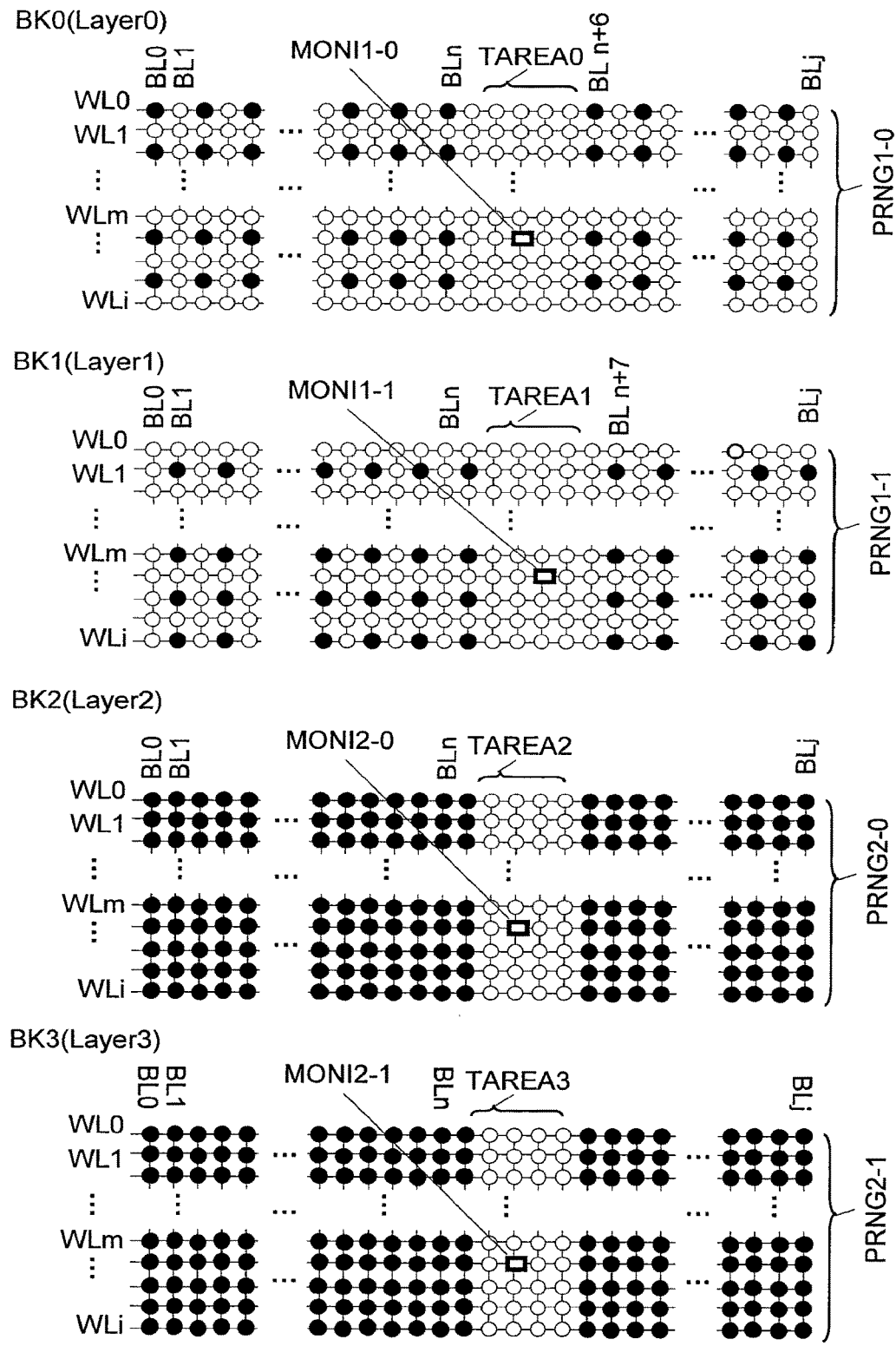
FIG. 29 is a diagram showing an example of writing of data to the memory cell array in the nonvolatile memory device.

FIG. 29 shows an example of one of the memory cell arrays ARY in the nonvolatile memory devices in a case where the memory banks BK0 to BK3 in the nonvolatile memory NVMEM shown in FIG. 5 are three-dimensionally superposed one on another in four layers.

The memory bank BK0 is formed in the 0th layer; the memory bank BK1 is formed in the first layer under the 0th layer; the memory bank BK2 is formed in the second layer under the first layer; and the memory bank BK3 is formed in the third layer under the second layer. However, the order of the banks is not particularly limited to this. The points of intersection of the word lines WL0 to WLi and the bit lines BL0 to BLj represent the memory cells. ● denotes the memory cells written with data.

The memory bank BK0 in the 0th layer and the memory bank BK1 in the first layer form a physical address region PRNG1, while the memory bank BK2 in the second layer and the memory bank BK3 in the third layer form a physical address region PRNG2.

TAREA0, TAREA1, TAREA2 and TAREA3 denote continuous memory cell regions for testing. □ denotes memory cells MONI1-0, MONI1-1, MONI2-0, and MONI2-1 for monitoring.

In the memory bank BK0 in the 0th layer, data is written to first write-permitted ones of the memory cells at the points of intersection of the even word lines WLn (n: even numbers) in the word lines WL0 to WLi and the even bit lines BLm (m: even numbers) in the bit lines BL0 to BLj. In the memory bank BK1 in the first layer, data is written to fourth write-permitted ones of the memory cells at the points of intersection of the odd word lines WLn (n: even numbers) in the word lines WL0 to WLi and the even bit lines BLm (m: even numbers) in the bit lines BL0 to BLj. In the memory bank BK2 in the second layer, data is written to first write-permitted ones of the memory cells at the points of intersection of the word lines WL0 to WLi and the bit lines BL0 to BLj. In the memory bank BK3 in the third layer, data is written to first write-permitted ones of the memory cells at the points of intersection of the word lines WL0 to WLi and the bit lines BL0 to BLj.

The memory banks BK0 to BK3 of the nonvolatile memory NVMEM are three-dimensionally superposed one on another in the above-described way, thereby enabling reducing the chip area of the nonvolatile memory NVMEM and realizing a low-cost large-capacity nonvolatile memory.

Also, the method of writing data to the first write-permitted memory cells in the memory bank BK0 in the 0th layer and writing data to the fourth write-permitted memory cells in the memory bank BK0 in the first layer enables writing data so that the memory cells written with the data are not superposed on each other between the layers. As a result, the influence of a history of Joule heat on the memory cells can be reduced and a highly reliable information processor can be provided.

FIG. 21 shows in (a) the associated relationship between the physical addresses CPAD, the chip addresses CHIPA[2: 0] in the nonvolatile memory NVM10 to NVM17, the memory addresses BK[1:0] in the nonvolatile memory chips (NVM10 to NVM17), the row addresses ROW and the column addresses COL. Associations therebetween are established by the information processing circuit MANAGER.

The values of the row addresses designate the numbers for the word lines WL to be activated, and the values of the column addresses designate the numbers for the bit lines BL to be activated. At a row address ROW value i, the ith word line WLi is activated. At a column address COL value j, the jth bit line BLj is activated.

An example of a method (Step 31 in FIG. 20) of generating a new physical address when the write physical address table NXPADTBL necessary for writing data to the nonvolatile memory with the information processing circuit MANAGER is updated, described above with reference to FIG. 20, will be described with reference to (b) of FIG. 21.

The value of INTVDCELL in the SSD configuration information SDCFG shown in FIG. 13 is assumed to be mi. A bit line BLimax is the imax-th bit line BLimax. The suffix imax denotes the maximum of the bit line number.

The information processing circuit MANAGEAR translates the current physical address CPAD into the chip address CHIPA, the bank address BK, the row address ROW, and the column address COL (Step 42).

Next, assuming that the word line number designated by the value ci of the translated row address ROW is WLci, and that the bit line number designated by the value cj of the column address COL is BLcj, determination is made as to whether the bit line number BLcj is equal to or larger than the difference between the maximum bit line number BLimax and the INTVLDCELL value mi (Step 43).

If the bit line number BLcj is equal to or larger than this difference, Step 44 is executed. If the bit line number BLcj is smaller than this difference, Step 46 is executed.

In Step 44, a word line number WLnx and a bit line number BLnx corresponding to a new physical address are computed by a method shown below.

Word line number WLnx=word line number WLci+INTVLDCELL value mi+1

If the bit line number at which the data was first written is 0, bit line number BLnx=0.

If the bit line number at which the data was first written is 1, bit line number BLnx=1.

In Step 46, the word line number WLnx and the bit line number BLnx corresponding to the new physical address are computed by a method shown below.

Word line number WLnx=word line number WLci
Bit line number BLnx=bit line number BLcj+INTVLDCELL value mi+1

In Step 45, the new physical address CPADnx is determined from the word line number WLnx and the bit line number BLnx. The word line number WLnx forms a new row address ROWnx value, and the bit line number BLnx forms a new column address COLnx value.

Next, the information processing circuit MANAGEAR obtains a new physical address CPADnx from the chip address CHIPA, the bank address BK, the row address ROWnx and the column address COLnx based on the address associations shown in (a) of FIG. 21.

A method of writing into the physical address region PRNG1 by using DTMPAREA provided from the TDCL information in the SSD configuration information shown in (c) of FIG. 13 and by using the address range map ADMAP shown in FIG. 15 will be described with reference to FIG. 30.

Description will first be made of (a) of FIG. 30. Since the TDCL value in the SSD configuration information shown in (c) of FIG. 13 is 4, DTMPAREA is a memory cell region partially contained in a memory cell region connected to the four word lines from WLi−3 to WLi and a memory cell region connected to the four bit lines from BLj−3 to BLj. The memory cell region surrounded by the dotted line corresponds to this DTMPAREA.

Also, since the INTVLDCELL information on the logical address region LRNG1 in the SSD configuration information shown in (c) of FIG. 13 is 1, write to alternate ones of the memory cells in the physical address region PRNG1 corresponding to the logical address region LRNG1 can be performed. The points of intersection of the word lines WL0 to WLi and the bit lines BL0 to BLj represent memory cells.

More specifically, the points of intersection of the even word lines WLn (n: even numbers) in the word lines WL0 to WLi and the even bit lines BLm (m: even numbers) in the bit lines BL0 to BLj in the physical address region PRNG1 represent first write-permitted ones of the memory cells to which data is written. The points of intersection of the even word lines WLn (n: even numbers) in the word lines WL0 to WLi and the odd bit lines BLm (m: odd numbers) in the bit lines BL0 to BLj represent second write-permitted ones of the memory cells to which data is written. The points of intersection of the odd word lines WLn (n: odd numbers) in the word lines WL0 to WLi and the even bit lines BLm (m: even numbers) in the bit lines BL0 to BLj represent third write-permitted ones of the memory cells to which data is written. The points of intersection of the odd word lines WLn (n: odd numbers) in the word lines WL0 to WLi and the odd bit lines BLm (m: odd numbers) in the bit lines BL0 to BLj represent fourth write-permitted ones of the memory cells to which data is written.

Thus, in a case where the physical address region PRNG1 is four times or more larger than the logical address region LRNG1, assignment of four physical addresses to one logical address is enabled by setting the first to fourth write-permitted memory cells.

Figure 30:
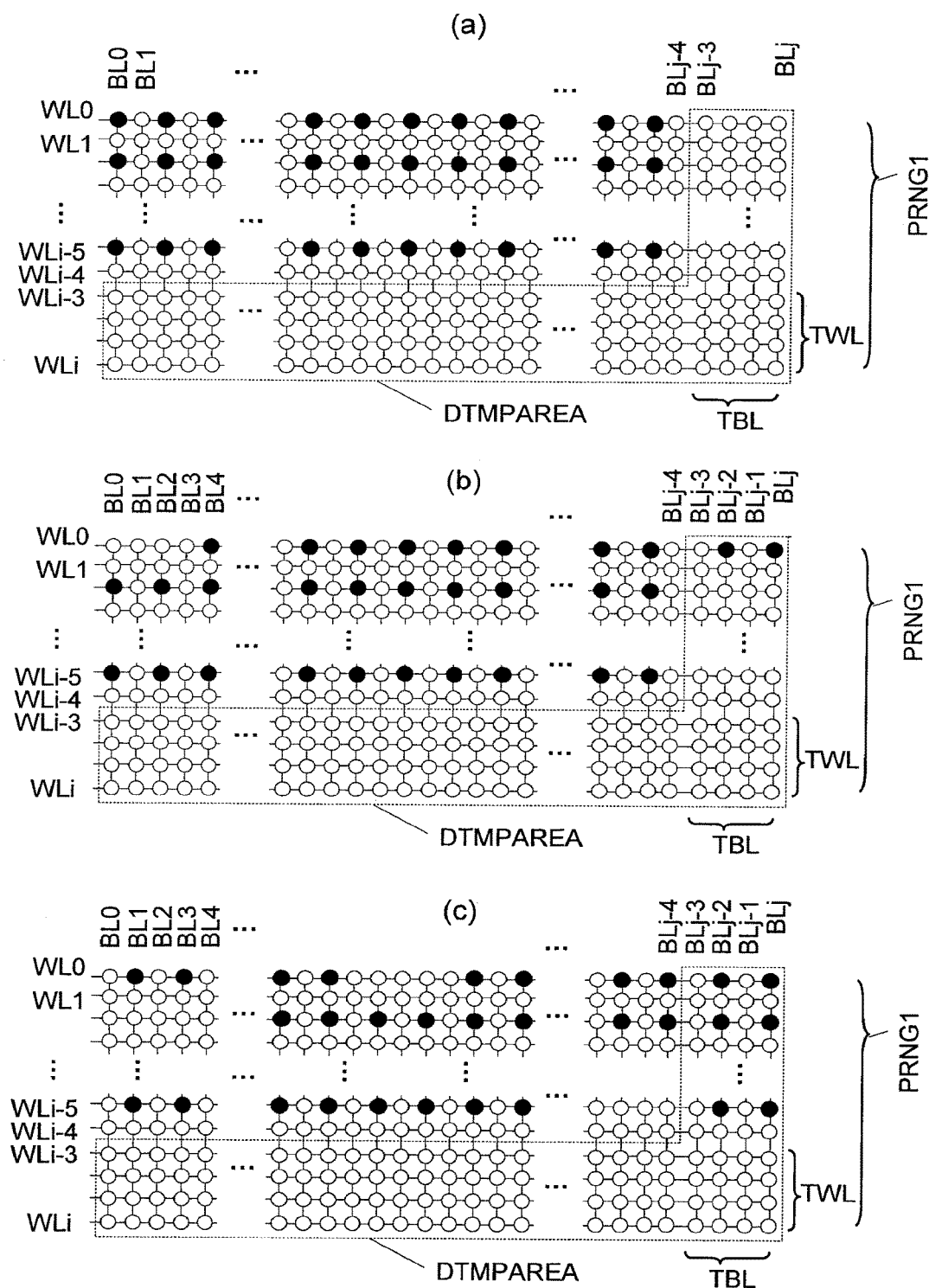
FIG. 30 is a diagram showing an example of writing of data to the memory cell array in the nonvolatile memory device.

FIG. 30 shows in (a) a state in which data is written to all of the first write-permitted memory cells other than those in the DTMPAREA region in the physical address region PRNG1. ● denotes the memory cells written with data and made valid.

A method of writing data while changing the memory cells assigned to one logical address from first write-permitted memory cells to second write-permitted memory cells will be described with reference to (b) and (c) of FIG. 30.

Description will first be made of (b) of FIG. 30. In a case where, from the state shown in (a) of FIG. 30, writes to a logical address LAD occur which respectively correspond to the first write-permitted memory cell W0BL0CEL selected by the word line WL0 and the bit line BL0 and the first write-permitted memory cell W0BL2CEL selected by the word line WL0 and the bit line BL2, data is written to the second write-permitted memory cell W0BLj−2CEL selected by the word line WL0 and the bit line BLj−2 in the DTMPAREA region instead of being written to the first write-permitted memory cell W0BL0CEL.

Similarly, data is written to the second write-permitted memory cell W0BLjCEL selected by the word line WL0 and the bit line BLj in the DTMPAREA region instead of being written to the first write-permitted memory cell W0BL2CEL.

FIG. 30 shows in (c) a state in which the memory cells written with data are changed from first write-permitted memory cells to second write-permitted memory cells as a result of repeating write according to the write method shown in (b) of FIG. 30.

A method of writing data while changing the memory cells assigned to one logical address from second write-permitted memory cells to third write-permitted memory cells will next be described with reference to (a) and (b) of FIG. 31.

Description will first be made of (a) of FIG. 31. In a case where, from the state shown in (c) of FIG. 30, writes to a logical address LAD occur which respectively correspond to the second write-permitted memory cell W0BL1CEL selected by the word line WL0 and the bit line BL1 and the second write-permitted memory cell W0BL3CEL selected by the word line WL0 and the bit line BL3, data is written to the third write-permitted memory cell Wi−1BL0CEL selected by the word line WLi−1 and the bit line BL0 in the DTMPAREA region instead of being written to the second write-permitted memory cell W0BL1CEL. Similarly, data is written to the third write-permitted memory cell Wi−1BL2CEL selected by the word line WLi−1 and the bit line BL2 in the DTMPAREA region instead of being written to the second write-permitted memory cell W0BL3CEL.

Figure 31:
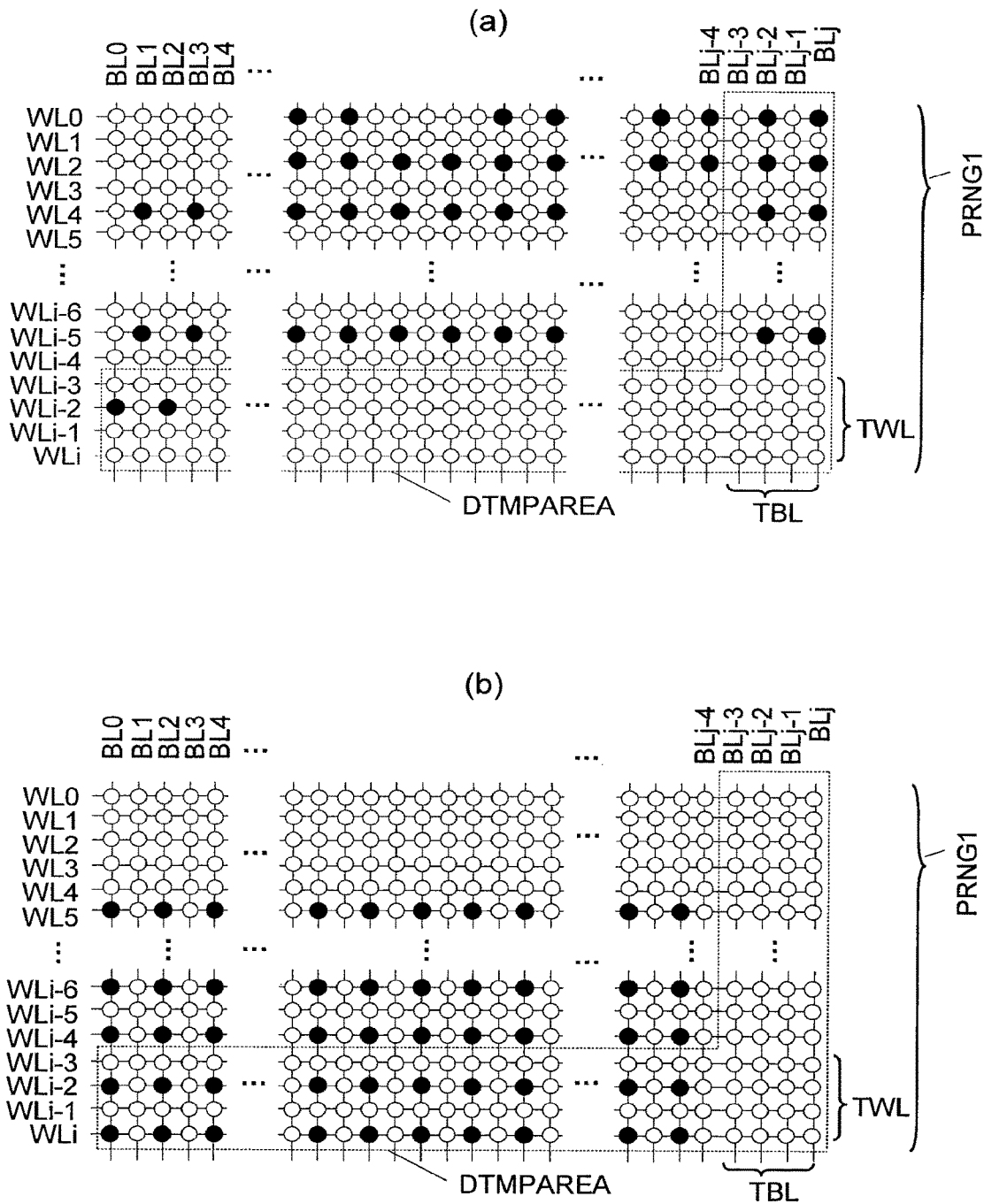
FIG. 31 is a diagram showing an example of writing of data to the memory cell array in the nonvolatile memory device.

FIG. 31 shows in (b) a state in which the memory cells written with data are changed from second write-permitted memory cells to third write-permitted memory cells as a result of repeating write according to the write method shown in (a) of FIG. 31.

A method of writing data while changing the memory cells assigned to one logical address from third write-permitted memory cells to fourth write-permitted memory cells will next be described with reference to (a) and (b) of FIG. 32.

Description will first be made of (a) of FIG. 32. In a case where, from the state shown in (b) of FIG. 31, writes to a logical address LAD occur which respectively correspond to the third write-permitted memory cell W1BL0CEL selected by the word line WL1 and the bit line BL0 and the third write-permitted memory cell W1BL2CEL selected by the word line WL1 and the bit line BL2, data is written to the fourth write-permitted memory cell WL1BLj−2CEL selected by the word line WL1 and the bit line BLj−2 in the DTMPAREA region instead of being written to the third write-permitted memory cell W1BL0CEL.

Similarly, data is written to the fourth write-permitted memory cell WL1BLjCEL selected by the word line WL1 and the bit line BLj in the DTMPAREA region instead of being written to the third write-permitted memory cell WL1BL2CEL.

Figure 32:
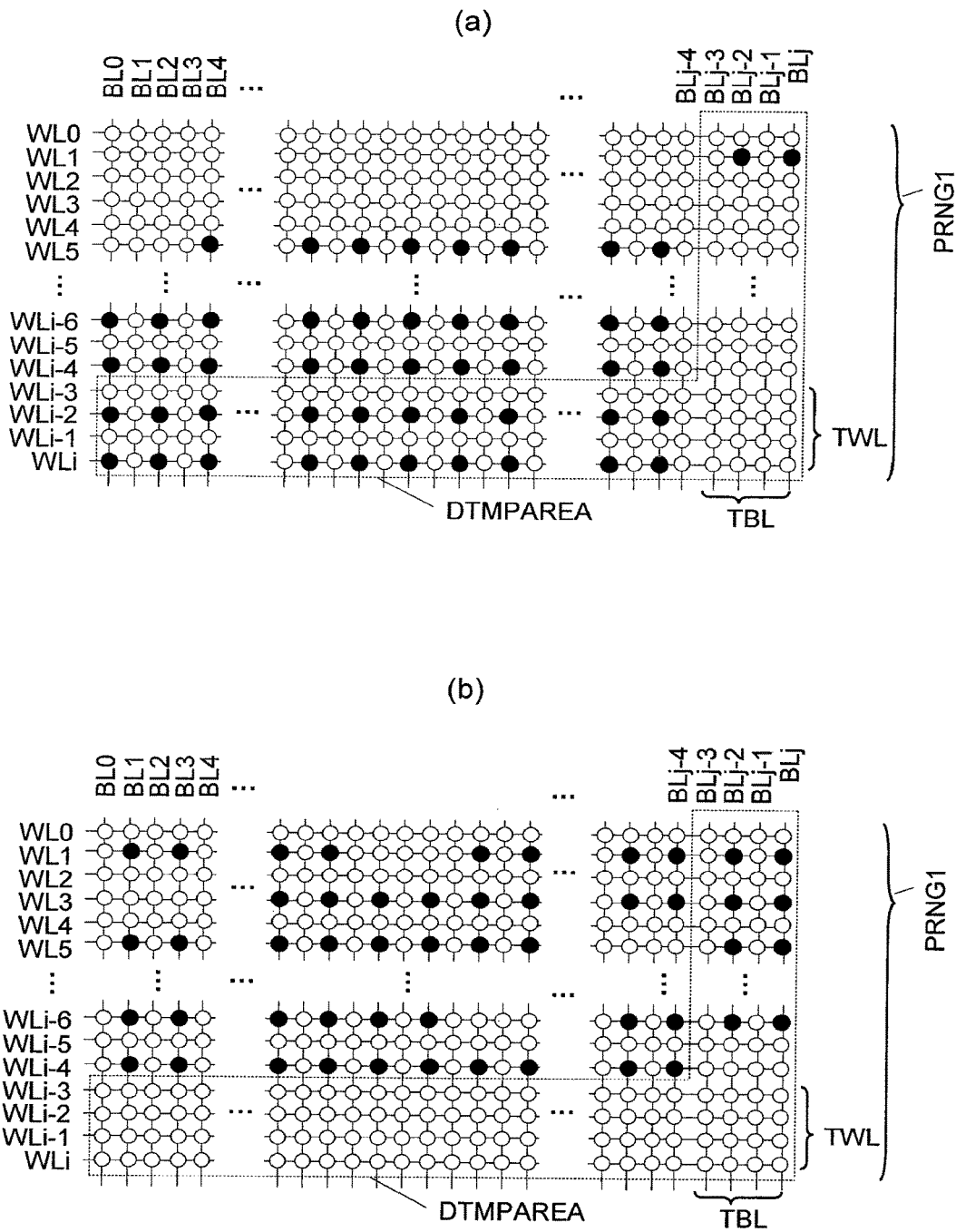
FIG. 32 is a diagram showing an example of writing of data to the memory cell array in the nonvolatile memory device.

FIG. 32 shows in (b) a state in which the memory cells written with data are changed from third write-permitted memory cells to fourth write-permitted memory cells as a result of repeating write according to the write method shown in (a) of FIG. 32. Needless to say, data can be written while changing the memory cells assigned to one logical address from fourth write-permitted memory cells to first write-permitted memory cells.

As described above, since the number of memory cells corresponding to the logical address region LRNG1 is four times or more larger than the logical address region LRNG1, a plurality of physical addresses can be applied to one logical address, and the data write target memory cell in the case of writing data to a memory cell at least one-cell-position away can be successively changed from a first write-permitted memory cell to a second write-permitted memory cell, from the second write-permitted memory cell to a third write-permitted memory cell, from the third write-permitted memory cell to a fourth write-permitted memory cell, from the fourth write-permitted memory cell to the first write-permitted memory cell. A highly reliable information processor that, by writing data in this way, can reduce the influence of a thermal history of Joule heat on the memory cells at the time of data writing can be provided. Further, a long-life information processor in which a plurality of physical addresses CPAD are successively assigned to one logical address LAD so that the rewrite count limit with respect to one logical address is increased can be provided.

FIG. 33 shows another example of memory cells written with data in the nonvolatile memory device in the case where the memory banks BK0 to BK3 in the nonvolatile memory NVMEM shown in FIG. 5 are three-dimensionally superposed one on another in four layers.

The memory bank BK0 is formed in the 0th layer; the memory bank BK1 is formed in the first layer under the 0th layer; the memory bank BK2 is formed in the second layer under the first layer; and the memory bank BK3 is formed in the third layer under the second layer. However, the order of the banks is not particularly limited to this. The points of intersection of the word lines WL0 to WLi and the bit lines BL0 to BLj represent the memory cells. ● denotes the memory cells written with data. In the memory device shown in FIG. 33, writes to the memory cells are physically made in a staggered fashion by the writing method in the case where the write method selection information WRT-FLG in the SSD configuration is 1.

The memory banks BK0 to BK3 in the 0th to third layers form a physical address region PRNG2.

In the memory bank BK0 in the 0th layer and the memory bank BK2 in the second layer, data is written to memory cells WLevenBLeven at the points of intersection of the even word lines WLn (n: even numbers) in the word lines WL0 to WLi and the even bit lines BLm (m: even numbers) in the bit lines BL0 to BLj. In the memory bank BK1 in the first layer and the memory bank BK3 in the third layer, data is written to memory cells WLoddBLodd at the points of intersection of the odd word lines WLn (n: odd numbers) in the word lines WL0 to WLi and the odd bit lines BLm (m: odd numbers) in the bit lines BL0 to BLj.

The memory banks BK0 to BK3 of the nonvolatile memory NVMEM are three-dimensionally superposed one on another in the above-described way, thereby enabling reducing the chip area of the nonvolatile memory NVMEM and realizing a low-cost large-capacity nonvolatile memory.

Also, data can be written so that the memory cells written with the data are not superposed on each other between the 0th to third layers. As a result, the influence of a thermal history of Joule heat on the memory cells can be reduced and a highly reliable long-life information processor can be provided.

Figure 34:
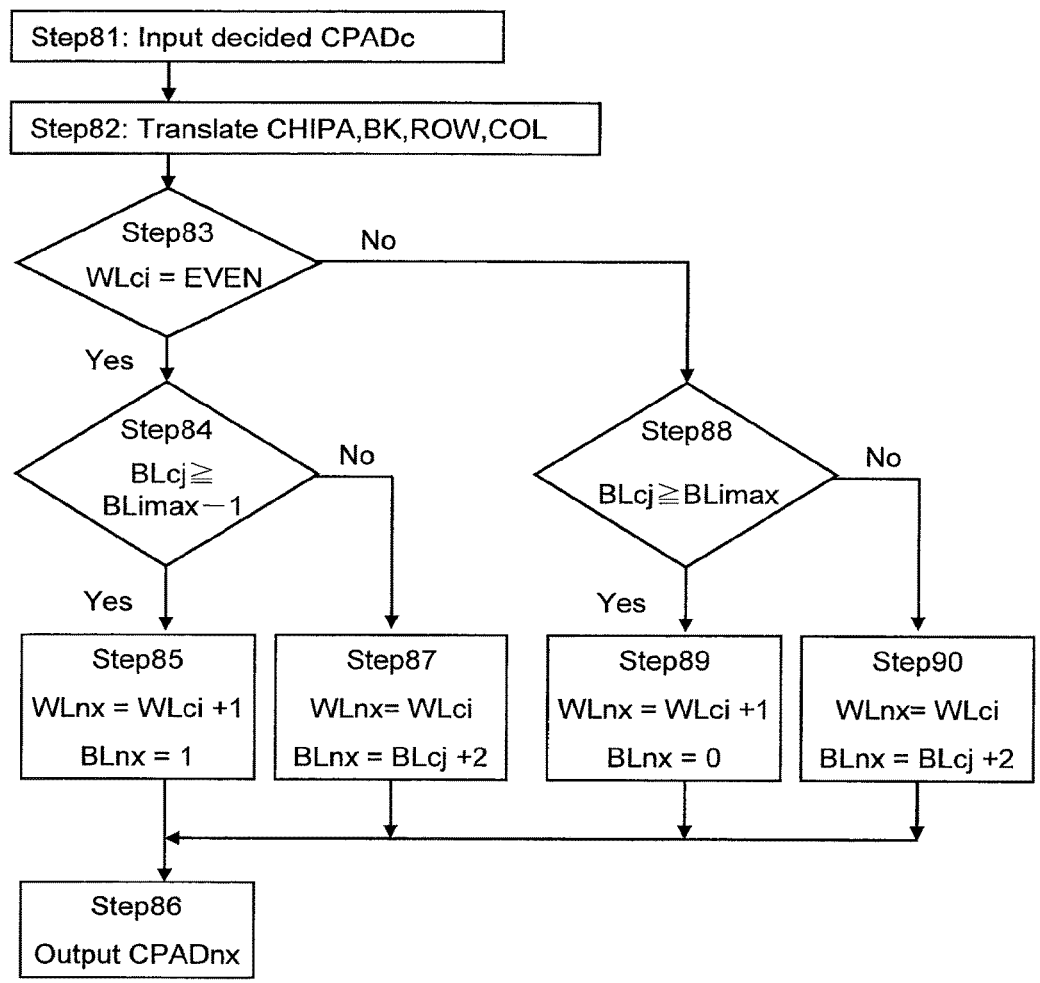
FIG. 34 is a diagram showing an example of a method of computation for determining physical addresses.

An example of a method (Step 31 in FIG. 20) of generating a new physical address when the write physical address table NXPADTBL necessary for writing data to the nonvolatile memory with the information processing circuit MANAGER is updated, described above with reference to FIG. 20, will be described with reference to FIG. 34.

The information processing circuit MANAGER establishes associations between the physical addresses CPAD, the addresses (chip addresses CHIPA, memory bank addresses BK, row addresses ROW and column addresses COL) of the nonvolatile memory devices shown in (a) of FIG. 21.

Further, data is written to the memory cells in a staggered fashion by the writing method in the case where the write method selection information WRTFLG in the SSD configuration information shown in (3) of FIG. 13 is 1. A bit line BLimax is the imax-th bit line BLimax. The suffix imax denotes the maximum of the bit line number.

The information processing circuit MANAGEAR translates the current physical address CPAD (Step 81) into the chip address CHIPA, the bank address BKc, the row address ROW, and the column address COL (Step 82).

Next, determination is made as to whether the word line number WLci designated by the value ci of the translated row address ROW is an even number (Step 83). If the word line number WLci is an even number, Step 84 is executed. If the word line number WLci is an odd number, Step 88 is executed.

In Step 84, assuming that the bit line number designated by the value cj of the column address COL is BLcj, determination is made as to whether the bit line number BLcj is equal to or larger than the difference between the maximum bit line number BLimax and 1.

If the bit line number BLcj is equal to or larger than this difference, Step 85 is executed. If the bit line number BLcj is smaller than this difference, Step 87 is executed.

In Steps 85 and 87, a word line number WLnx and a bit line number BLnx corresponding to a new physical address are computed by a method shown below.

In Step 85, word line number WLnx=word line number WLci+1, and bit line number BLnx=1. In Step 87, word line number WLnx=word line number WLci, and bit line number BLnx=BLcj+2.

In Step 88, assuming that the bit line number designated by the value cj of the column address COL is BLcj, determination is made as to whether the bit line number BLcj is equal to or larger than the maximum bit line number BLimax.

If the bit line number BLcj is equal to or larger than the maximum bit line number BLimax, Step 89 is executed. If the bit line number BLcj is smaller than the maximum bit line number BLimax, Step 90 is executed.

In Steps 89 and 90, the word line number WLnx and the bit line number BLnx corresponding to the new physical address are computed by a method shown below.

In Step 89, word line number WLnx=word line number WLci+1, and bit line number BLnx=0. In Step 90, word line number WLnx=word line number WLci, and bit line number BLnx=BLcj+2

In Step 86, the new physical address CPADnx is determined by the information processing circuit MANAGER from the word line number WLnx and the bit line number BLnx. The word line number WLnx forms a new row address ROWnx value, and the bit line number BLnx forms a new column address COLnx value. Next, the information processing circuit MANAGEAR obtains a new physical address CPADnx from the chip address CHIPA, the bank address BK, the row address ROWnx and the column address COLnx based on the address associations shown in (a) of FIG. 21.

A method of writing into the physical address region PRNG2 by using DTMPAREA provided from the write method selection information WRTFLG and the TDCL information in the SSD configuration information shown in (c) of FIG. 13 and by using the address range map ADMAP shown in FIG. 15 will be described with reference to FIG. 35.

Description will first be made of (a) of FIG. 35. Since the TDCL value in the SSD configuration information shown in (c) of FIG. 13 is 4, DTMPAREA is a memory cell region partially contained in a memory cell region connected to the four word lines from WLi−3 to WLi and a memory cell region connected to the four bit lines from BLj−3 to BLj. The region surrounded by the dotted line corresponds to this DTMPAREA.

Also, since the write method selection information WRTFLG in the SSD configuration shown in (c) of FIG. 13 is 1, data is written to the memory cells in a staggered fashion by the write method shown in FIG. 27.

More specifically, data is written to memory cells WLevenBLevenCEL at the points of intersection of the even word lines WLn (n: even numbers) in the word lines WL0 to WLi and the even bit lines BLm (m: even numbers) in the bit lines BL0 to BLj in the physical address region PRNG2, and data is written to memory cells WLoddBLoddCEL at the points of intersection of the odd word lines WLn (n: odd numbers) in the word lines WL0 to WLi and the even bit lines BLm (m: even numbers) in the bit lines BL0 to BLj in the physical address region PRNG2. ● denotes the memory cells written with data and made valid.

Also, no data is written to memory cells WLevenBLoddCEL at the points of intersection of the even word lines WLn (n: even numbers) in the word lines WL0 to WLi and the odd bit lines BLm (m: odd numbers) in the bit lines BL0 to BLj in the physical address region PRNG2, and no data is written to memory cells WLoddBLevenCEL at the points of intersection of the odd word lines WLn (n: odd numbers) in the word lines WL0 to WLi and the even bit lines BLm (m: even numbers) in the bit lines BL0 to BLj in the physical address region PRNG2.

Thus, the number of memory cells to which data is substantially written by performing write one time is a half of the total number, and two physical addresses can be assigned to one logical address.

Therefore, a method of writing data while changing the memory cells assigned to one logical address from memory cells WLevenWLevenCEL to memory cells WLoddWLevenCEL and from memory cells WLoddWLoddCEL to memory cells WLevenWLoddCEL will be described with reference to (b) and (c) of FIG. 35.

Description will first be made of (b) of FIG. 35. In a case where, from the state shown in (a) of FIG. 35, writes to a logical address LAD occur which respectively correspond to the memory cell WL0BL0CEL selected by the word line WL0 and the bit line BL0 and the memory cell WL1BL1CEL selected by the word line WL1 and the bit line BL1, data is written to the memory cell WLi−2BL0CEL selected by the word line WLi−2 and the bit line BL0 in the DTMPAREA region instead of being written to the memory cell WL0BL0CEL.

Also, data is written to the memory cell WLi−1BL1CEL selected by the word line WLi−1 and the bit line BL1 in the DTMPAREA region instead of being written to the memory cell WL1BL1CEL. Data write target memory cells can be changed from a memory cell WLevenBLevenCEL to a memory cell WLoddBLevenCEL and from a memory cell WLoddBLoddCEL to a memory cell WLevenBLoddCEL in this way.

Figure 35:
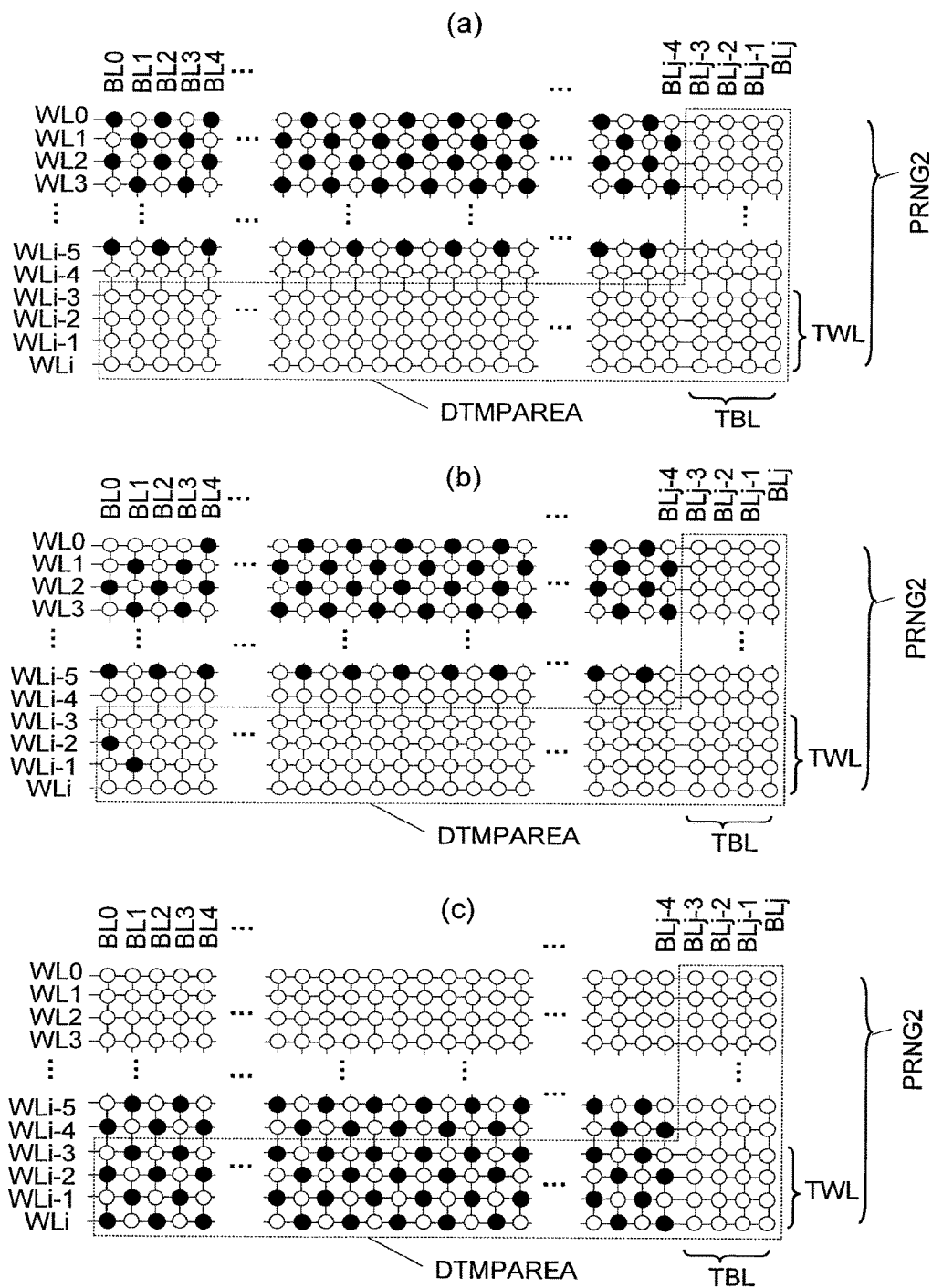
FIG. 35 is a diagram showing an example of writing of data to the memory cell array in the nonvolatile memory device.

FIG. 35 shows in (b) a state in which the memory cells written with data are changed from memory cells WLevenBLevenCEL to memory cells WLoddBLevenCEL and from memory cells WLoddBLoddCEL to memory cells WLevenBLoddCEL as a result of repeating write according to the write method shown in (a) of FIG. 35.

As described above, when the write method selected through the write method selection information WRTFLG value 1 in the SSD configuration information shown in (c) of FIG. 13 is used, the number of memory cells to which data is substantially written by performing write one time is a half of the total number. Therefore, two physical addresses can be assigned to one logical address LAD, and data write target memory cell in the case of writing remove memory cells in a staggered fashion can be changed from memory cells WLevenBLevenCEL to memory cells WLoddBLevenCEL and from memory cells WLoddBLoddCEL to memory cells WLevenBLoddCEL. A highly reliable information processor that, by writing data in this way, can reduce the influence of a thermal history of Joule heat on the memory cells at the time of data writing can be provided. Further, a long-life information processor in which a plurality of physical addresses CPAD are successively assigned to one logical address LAD so that the rewrite count limit with respect to one logical address is increased can be provided.

CONCLUSION

Main effects achieved by the above-described embodiment are as described below.

First, a highly reliable long-life information processor can be provided in which write to one of the first to (N+1)th of every (N+1) memory cells of a phase-change memory can be performed with a controller to reduce the influence of a thermal history of Joule heat on the memory cells at the time of data writing.

Second, a highly reliable long-life information processor can be provided in which a controller can write a plurality of write permissions to one of the first to (N+1)th of every (N+1) memory cells of a phase-change memory to reduce the influence of a thermal history of Joule heat on the memory cells at the time of data writing.

Third, a highly reliable long-life information processor can be provided in which a controller can dispose write-prohibited memory cells in a physically continuous region as part of memory cells of a phase-change memory to reduce the influence of a thermal history of Joule heat on the memory cells at the time of data writing.

Fourth, a highly reliable long-life information processor can be provided which can program SSD configuration information SDCFG and can therefore be adapted to an information processing system with flexibility.

Fifth, a highly reliable long-life information processor can be provided which includes a phase-change memory capable of reducing the influence of a thermal history of Joule heat on the memory cells at the time of data writing by compressing data with a controller and writing the compressed data to the memory cells without changing the effective memory capacity.

Sixth, a highly reliable long-life information processor can be provided in which a controller sequentially assigns physical addresses to logical addresses from a host such that the unevenness of data erase counts on an address-by-address basis in a phase-change memory can be reduced.

Seventh, a controller performs in a pipeline manner processing for storing write requests in buffers, making preparations for write operations and performing operations for write to a phase-change memory and, therefore, can contribute to the provision of a high-performance information processor.

INDUSTRIAL APPLICABILITY

The semiconductor device according to the present invention is capable of physically writing to one of the first to (N+1)th of every (N+1) nonvolatile memory cells so that the influence of a thermal history of Joule heat on the memory cells at the time of data writing can be reduced. The semiconductor device according to the present invention can therefore be applied to an information processor required to have high reliability and a long life. SSD configuration information that determines the configuration of the memory module is programmable. Therefore the configuration of storage regions of the semiconductor device can be modified with flexibility according to use of the information processor, for example. Also, the unevenness of data erase counts on an address-by-address basis in the phase-change memory can be reduced by sequentially assigning physical addresses to logical addresses. Therefore the semiconductor device can be applied to an information processor required to have high reliability. Further, the semiconductor device according to the present invention performs in a pipeline manner processing for storing write requests in buffers, making preparations for write and performing operations for write to a phase-change memory and can, therefore, be applied to a high-performance information processor.

DESCRIPTION OF SYMBOLS

CPU_CHIP . . . Information processing device
NVMSTR0 . . . Memory module
NVM10 to NVM17, RAM, NVM17, NVM0 . . . Memory device
STRCT0, STRCT01 . . . Control circuit
HOST_IF . . . Interface circuit
RSTSIG . . . Reset signal
REFCLK . . . Reference clock
BUF0 to BUF3 . . . Buffer
ARB . . . Settlement circuit
MANAGER . . . Information processing circuit
RAMC NVCT0 to NVCT7 . . . Memory controller
NXPTBL, NXPTBL0, NXPTBL1, NXPTBL2, NXPTBL3 . . . Write physical address table
PSEGTBL1,PSEGTBL2 . . . Physical segment table
PADTBL . . . Physical table
LPTBL . . . Address conversion table
SYMD . . . Clock generation circuit
STREG . . . Status register
ADCOMDIF . . . Address and command interface circuit
IOBUF . . . IO buffer
CONTLOGIC . . . Control circuit
THMO . . . Temperature sensor DATACTL . . . Data control circuit
BK0 to BK7 . . . Memory bank
ARY0 to ARYm . . . Memory array
RADLT . . . Row address latch
CADLT . . . Column address latch
ROWDEC . . . Row decoder
COLDEC . . . Column decoder
DSW1 . . . Data selecting circuit
DBUF0, DBUF1 . . . Data buffer
cel . . . Memory cell
BSW0 to BSWm . . . Bit line selection circuit
SA0 to SAm . . . Sense amplifier
WDR0 to WDRm . . . Write driver
CLE . . . Command latch enable signal
CEB . . . Chip enable signal
ALE . . . Address latch enable signal
WEB . . . Write enable signal
REB . . . Read enable signal
IO[7:0] . . . Input/output signal

What is claimed is:

1. A semiconductor device comprising:
a nonvolatile memory device including a plurality of memory cells; and
a control circuit device that controls access to the nonvolatile memory device, wherein
the control circuit device provides a first region including the plurality of memory cells of the nonvolatile memory device and a second region including memory cells physically adjacent to the first region, the first region being a writable region, the second region being a write-prohibited region, and a third region being a testing region,
the semiconductor device comprises a storage region that stores configuration information including:
logical address region information corresponding to the first region,
capacity information of logical data in a range determined by the logical address region information,
information including an address map that identifies a location of the write-prohibited region,
information including the address map that identifies a location of the testing region,
information on a number of memory cells for monitoring,
information pertaining to an error correcting code flag, and
write method selection information.

2. The semiconductor device according to claim 1, wherein the configuration information is programmable.

3. The semiconductor device according to claim 2, wherein the control circuit device decides the size of the first region, the second region, and the third region using a part of the configuration information.

4. The semiconductor device according to claim 3, wherein the control circuit device decides the size of the first region, the second region, and the third region by reading out the configuration information directly after a time of power-on.

5. The semiconductor device according to claim 4, wherein the control circuit device decides the writable region in the first region by reading out the configuration information directly after the time of power-on.

6. The semiconductor device according to claim 3, wherein the control circuit device decides the writable region in the first region using a part of the configuration information.

7. The semiconductor device according to claim 1, wherein the memory cell is a low-resistance storage element.

8. The semiconductor device according to claim 1, wherein the control circuit device provides a memory cell for monitoring in the third region.

9. The semiconductor device according to claim 8, wherein the control circuit device reads out and checks whether the data read out is equal to the first data after writing the first data in the memory cell for monitoring.

10. The semiconductor device according to claim 9, wherein the control circuit device outputs warning information indicating the possibility of a reduction in reliability, in case that a value of the data read out from the memory cell for monitoring is different from the first data.

11. The semiconductor device according to claim 8, wherein the control circuit device decides the number of memory cells for monitoring by using the information of the number of memory cells for monitoring.

12. The semiconductor device according to claim 8, wherein the memory cell is a low-resistance storage element.

13. The semiconductor device according to claim 1, wherein the control circuit device decides the size of the write data for producing an error correcting code using the error correcting code flag.

14. The semiconductor device according to claim 1, wherein the control circuit device decides the write method of data to the first region using the write method selection information.

* * * * *